(12) United States Patent
Tomishima

(10) Patent No.: US 6,977,849 B2
(45) Date of Patent: Dec. 20, 2005

(54) SEMICONDUCTOR DEVICE SUITABLE FOR SYSTEM IN PACKAGE

(75) Inventor: Shigeki Tomishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/961,146

(22) Filed: Oct. 12, 2004

(65) Prior Publication Data

US 2005/0041482 A1   Feb. 24, 2005

Related U.S. Application Data

(62) Division of application No. 10/281,110, filed on Oct. 28, 2002, now Pat. No. 6,807,109.

(30) Foreign Application Priority Data

Dec. 5, 2001 (JP) .............................. 2001-371237
Jun. 25, 2002 (JP) .............................. 2002-184638

(51) Int. Cl.$^7$ .............................................. G11C 7/00
(52) U.S. Cl. ........................... 365/189.09; 365/189.05; 365/201
(58) Field of Search ..................... 365/189.09, 189.05, 365/201

(56) References Cited

U.S. PATENT DOCUMENTS

| | | |
|---|---|---|
| 6,304,503 B1 | 10/2001 | Akamatsu et al. |
| 6,442,716 B1 | 8/2002 | Kim |
| 6,538,412 B1 | 3/2003 | Klose et al. |
| 6,580,092 B2 | 6/2003 | Tomoshima |

FOREIGN PATENT DOCUMENTS

JP   07-273632   10/1995

*Primary Examiner*—Hoai Ho
(74) *Attorney, Agent, or Firm*—McDermott Will & Emery LLP

(57) ABSTRACT

In each of output buffer circuits arranged corresponding to respective output pads, a first output buffer having small current driving capability for a normal operation mode and a second output buffer having large current driving capability for a test operation mode are arranged in parallel with each other. One of the first and second output buffers is enabled and the other is set to an output high impedance state alternatively in accordance with a mode designating signal. Thus, an output buffer circuit capable of driving an output pad with optimal driving capabilities in a normal operation mode and in a test operation mode in a semiconductor device for use in a system in package is implemented.

5 Claims, 31 Drawing Sheets

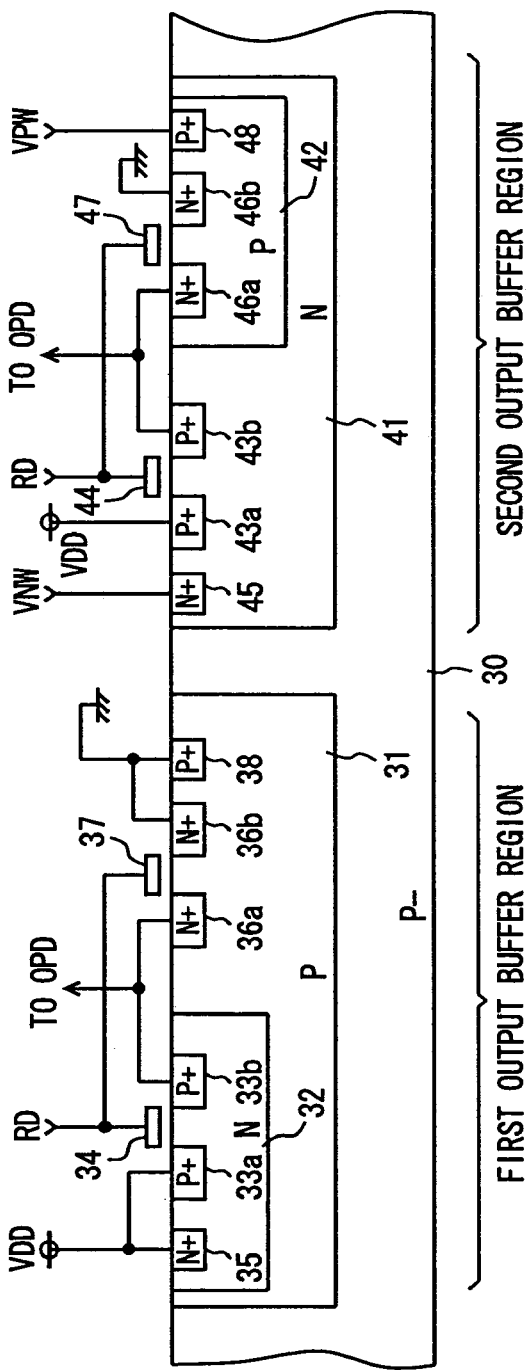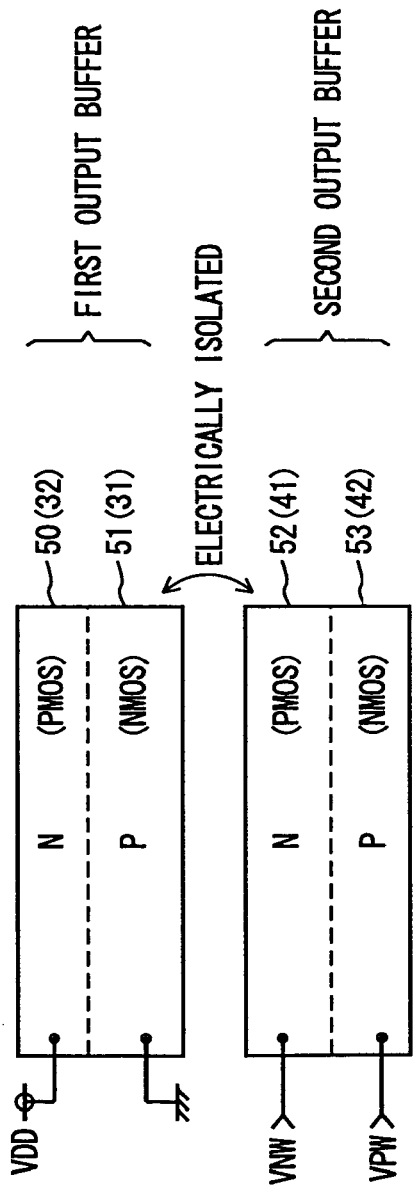
FIG. 7A
FIG. 7B

US 6,977,849 B2

SEMICONDUCTOR DEVICE SUITABLE FOR SYSTEM IN PACKAGE

This application is a DIV of Ser. No. 10/281,110 Oct. 28, 2002 U.S. Pat No. 6,807,109

BACKGROUND OF THE INVENTION

1. Field of the Invention

The present invention relates to semiconductor devices, and particularly to a system in package (SIP) having a plurality of semiconductor chips stacked one on another arranged within a package. More particularly, the present invention relates to a configuration of a signal output portion formed on a semiconductor chip within the SIP.

2. Description of the Background Art

A system LSI having a logic performing prescribed processing and a memory storing data necessary for the logic integrated in a semiconductor chip has been employed for the purposes of downsizing, speeding up and reducing power consumption of a data/signal processing system. In the system LSI, the logic and the memory are interconnected by means of on-chip interconnection lines. Due to small load on a signal line, high-speed signal transfer is allowed. As there is no pin terminal between the logic and the memory, they can be interconnected under a pitch condition of an internal interconnection, without restriction by the pitch of pin terminal. This allows an increase in number of data bits, so that high-speed data transfer is achieved.

In this system LSI, a logic, a memory, an analog circuit and others are formed on the common semiconductor chip. Therefore, they should be fabricated in the same manufacturing steps to the greatest possible extent. In the logic, a MOS transistor (insulated gate type field effect transistor) as its component can be miniaturized according to a scaling rule, and the power supply voltage can be decreased.

In a dynamic random access memory (DRAM), a capacitor of a memory cell is used for storage of data. Usually, a capacitor having a stacked structure with a storage node and a cell plate electrode formed on a surface of a semiconductor substrate is employed for the memory cell capacitor. Since this memory cell capacitor is formed on the surface of the semiconductor substrate, a step occurs between the logic and the DRAM. Some measures are taken to reduce such a step; for example, the capacitor having the stacked structure is reduced in height, and a capacitance value of the memory cell capacitor is decreased.

Compared to the logic, the DRAM cell requires a relatively high voltage to store a sufficient amount of charges in the memory cell capacitor. Thus, a gate insulating film of an accessing transistor of the DRAM cell is made thicker than the gate insulating film of the MOS transistor of the logic. In order to prevent various thermal processing steps in manufacture of the DRAM cell from adversely affecting the MOS transistor of the logic, a so-called "thermal budget" in the thermal processing steps is made small, and the time for the heat treatment is shortened compared to the case of manufacturing a DRAM alone.

Thus, in such a system LSI, when a logic and a DRAM are integrated on the same semiconductor chip, performance of the DRAM is sacrificed to some extent.

Similarly, in an analog circuit, a non-volatile semiconductor memory device and others, their power supply voltages should be made higher than that of the logic, for the purposes of accurate processing and transmission of analog signals, data programming/erasing and others.

In a semiconductor chip, miniaturization of the analog circuit and the memory such as a DRAM cannot be advanced to the same degree as miniaturization of the logic circuit, impeding reduction in chip size of the system LSI. In the system LSI, the presence of a circuit portion in which elements cannot be miniaturized according to a scaling rule hinders reduction of the chip size, and downsizing of the system.

Further, in a high-frequency circuit and an ultra high speed interface circuit for high-speed operation, elements difficult to mount on a semiconductor chip such as an inductance, a capacitance, and a filter are indispensable. Thus, in such an ultra high speed operating environment, it is extremely difficult to mount all the functions necessary for a system on the same semiconductor chip.

In view of the foregoing problems of the system LSI, a system in package (SIP) has been utilized, in which respective functions constituting a system are formed in separate semiconductor chips, and the chips are mounted and packaged. In this SIP, each function is formed in an individual semiconductor chip. Thus, a circuit block implementing a function can be optimally designed for each function. A hybrid-oriented process is unnecessary, and therefore, the manufacturing steps can also be optimized.

Since each function is formed individually, it is possible to select semiconductor chips of optimal functions for a given purpose, for assembling the chips to form a system. A system meeting an intended use can be manufactured in a short period of time. In addition, formation of the respective functions separately from each other makes it possible to optimize each function in a system.

FIG. 56 schematically shows a cross sectional structure of a three dimensional SIP. Referring to FIG. 56, semiconductor chips CH1 and CH2 are stacked one on another and assembled in a package PK. Semiconductor circuits implementing prescribed functions are formed in respective semiconductor chips CH1 and CH2. Pads PD1 and PD2 are formed on the peripheries of semiconductor chips CH1 and CH2, respectively. FIG. 56 shows, by way of example, a state where pad PD2 of semiconductor chip CH2 is connected to pad PD1 of semiconductor chip CH1, and the pad PD1 is also connected to an external terminal through bonding wire. Such utilization of pad PD1 as an intermediate pad lowers the height of wiring. The wire connected to pad PD1 is connected to a lead (not shown).

A bump ball BP connected to a lead is formed on the backside of package PK. Bump ball BP is used as an externally connecting terminal when mounted on a board.

FIG. 57 schematically shows planar arrangement of the semiconductor chips in the SIP shown in FIG. 56. Referring to FIG. 57, pads PD1 are arranged on the periphery of semiconductor chip CH1. A prescribed one of these pads PD1 is connected to the connecting terminal (or the bump ball) via bonding wire WIR1. Semiconductor chip CH2 has pads PD2 arranged on both longer sides thereof. A prescribed one of the pads PD2 is connected via bonding wire WIR2 to a pad of semiconductor chip CH1, and another prescribed one of pads PD2 is connected via bonding wire WIR3 to an external terminal.

In the configuration of the SIP shown in FIGS. 56 and 57 signals/data can be transmitted between semiconductor chips CH1 and CH2 via the bonding wire. Semiconductor chips CH1 and CH2 also can communicate signals/data with an external device.

Semiconductor chips CH1 and CH2 are interconnected by wire WIR2 within the package, and signals/data are transferred between the chips. The interconnection length between the chips can be shortened, and signals/data can be transferred at high speed.

FIG. 58 schematically shows a cross sectional structure of another SIP. In the SIP shown in FIG. 58, a semiconductor chip CH4 is mounted facing down on a semiconductor chip CH3. Semiconductor chip CH4 is connected to semiconductor chip CH3 via a micro bump MBP formed in a pad region.

Semiconductor chip CH3 has a pad PD3 arranged in its peripheral region. Bonding wire WIR4 is formed to pad PD3, through which semiconductor chip CH3 is electrically connected to an external terminal (or a bump ball) via a lead.

In this package PKA, a bump ball BP is formed on the backside of package PKA for connection to an external device.

In the SIP shown in FIG. 58, semiconductor chip CH4 is connected to an internal node of semiconductor chip CH3 via micro bump MBP. Micro bump MBP has pad capacitance substantially the same as that of an on-chip interconnection line, and high-speed signal/data transfer between semiconductor chips CH3 and CH4 can be achieved. In particular, since semiconductor chip CH4 is mounted facing down on semiconductor chip CH3 and the chips are interconnected by micro bumps MBP, interconnection distance between chips CH3 and CH4 can be shortened, and interconnection lengths therebetween can be equalized. High-speed signal/data transfer is thus achieved.

In the case where semiconductor chips CH3 and CH4 are directly interconnected using micro bumps MBP, rearrangement of pad regions of semiconductor chips CH3 and CH4 is carried out generally at the designing stage. When existing semiconductor chips are utilized, an intermediate layer called an interposer is placed between semiconductor chips CH3 and CH4, and re-wiring for changing interconnection paths is performed in the interposer.

FIG. 59 schematically shows planar chip layout of the SIP shown in FIG. 58. Referring to FIG. 59, semiconductor chip CH4 is mounted facing down on semiconductor chip CH3. A pad PD4 formed on semiconductor chip CH4 is directly connected to a pad region formed in semiconductor chip CH3 via micro bump MBP shown in FIG. 58. A pad PD3 formed on the periphery of semiconductor chip CH3 is electrically connected to an external terminal (or a bump ball) via bonding wire WIR4 and a lead (not shown).

Semiconductor chips CH3 and CH4 are interconnected via the micro bumps. Thus, interconnection for the chips CH3 and CH4 can be made uniform in height and minimal in length, allowing high-speed signal/data transfer. Since the chips are interconnected using the micro bumps, wiring for inter-chip connection is unnecessary. The wires are formed solely for external connection.

As shown in FIG. 59, semiconductor chip CH4 is electrically connected to semiconductor chip CH3 via pad PD4. Pad PD3 arranged on the periphery of semiconductor chip CH3 is used for transferring signals/data to and from an external device. This semiconductor chip CH4 does not perform direct signal/data transfer with the external device.

FIG. 60 schematically shows a configuration of a system implemented by the system in package shown in FIGS. 58 and 59. The system shown in FIG. 60 includes a system logic LSI LG1 and a memory LSI ML. System logic LSI LG1 and memory LSI ML are interconnected via an internal interconnection line IL, through which control signals and data are transferred.

System logic LSI LG1 transfers control signals and data to/from an external device via an external interconnection line OL. Memory LSI ML is only permitted to transfer the control signals and the data to/from system logic LSI LG1 via internal interconnection line IL. The system LSI SYS1 shown in FIG. 60 is a memory and logic merged system, which conventionally has wide applications as a representative of the system LSI.

In the system SYS1 shown in FIG. 60, data are transferred between system logic LSI LG1 and memory LSI ML in separate I/O data buses. Alternatively, a common I/O data bus may be used for bidirectional data transfer between the system logic LSI and the memory LSI.

FIG. 61 functionally shows another configuration of the SIP shown in FIGS. 58 and 59. In the system SYS2 shown in FIG. 61, a system logic LSI LG2 and an analog LSI AL are interconnected via an internal interconnection line INL. System logic LSI LG2 communicates control signals and data with an external device via an external interconnection line OUL.

Analog LSI AL includes a digital/analog converter and an analog/digital converter, and processes analog signals. In this analog LSI AL, processing operations of the analog signals are carried out. For example, it performs an operation of a sigmoid function on a signal indicating a firing condition of neurons in a neural network.

This analog LSI AL may have the SIP configuration as shown in FIGS. 56 and 57, in which case, analog LSI AL and an external device send/receive signals in between. For example, analog LSI AL converts an externally supplied analog image signal to a digital signal and transfers the digital signal to system logic LSI LG2. In this case as well, signal/data transfer between the system logic LSI and the analog LSI is carried out via internal interconnection line INL.

In such an SIP, a circuit implementing a predetermined function is formed on an individual semiconductor chip. Thus, an interface circuit (signal/data input/output circuit) is optimally set for each semiconductor chip.

FIG. 62 shows a signal output portion of a semiconductor chip CHA. Referring to FIG. 62, a pad PDa arranged on semiconductor chip CHA is driven by an output buffer OBF. Upon packaging, pad PDa is connected to another semiconductor chip via an internal interconnection ILa which may be a wire or a micro bump. Internal interconnection ILa has a parasitic capacitance Ca comprised of interconnection capacitance and pad capacitance.

Output buffer OBF has its driving capability and output impedance optimally set to quickly drive the output load including this parasitic capacitance Ca. As described above, internal interconnection ILa is formed of, e.g., a micro bump, whose parasitic capacitance Ca and parasitic resistance are sufficiently small. Thus, the output driving capability of output buffer OBF is also made small. Output buffer OBF with large output driving capability would cause ringing. Impedance mismatching between output buffer OBF and internal interconnection ILa would cause a reflected wave.

For the SIP, semiconductor chips can be tested at a wafer level to detect known good dies (KGD), and only good chips (KGD) can be utilized. Thus, the yield is improved compared to the case of a merged device in which a plurality of functional blocks are formed on the same semiconductor chip at the same time.

When testing a semiconductor chip at a wafer level, as shown in FIG. 63, a test probe TPR is brought into contact with pad PDa of semiconductor chip CHA. An external tester sends and receives various signals/data via test probe TPR, to determine pass/fail of a semiconductor circuit device formed in the semiconductor chip CHA.

In the case when test probe TPR is brought into contact with pad PDa as shown in FIG. 63, load Cp of test probe TPR is extremely large compared to parasitic capacitance Ca of internal interconnection ILa shown in FIG. 62. This is for the following reasons: test probe TPR has an interconnection width of an external interconnection as test probe TPR is connected to the external tester; an interconnection length of a signal line connected between test probe TPR and the external tester is also large; and input capacitance of an input circuit of the external tester is substantially the same as that of an input circuit of an external device after assembly into system.

It is now assumed that output buffer OBF optimally designed to drive the load (parasitic capacitance Ca) connected to internal interconnection ILa is used to send a signal to the external tester via test probe TPR having such large load. In this case, output buffer OBF having the small driving capability cannot drive test probe TPR at high speed, so that an accurate signal waveform cannot be transmitted to the tester. In addition, output buffer OBF cannot transfer signals via test probe TPR at high speed. Accordingly, there arises a problem that semiconductor chip CHA for use in an SIP cannot be tested at a wafer level accurately.

SUMMARY OF THE INVENTION

An object of the present invention is to provide a semiconductor device suitable for an SIP allowing accurate testing at a wafer level.

Another object of the present invention is to provide a semiconductor device suitable for an SIP allowing accurate testing at a wafer level without adversely affecting its operation when mounted in the SIP.

The semiconductor device according to a first aspect of the present invention includes a first output buffer coupled to an output pad and driving the output pad with first driving capability in accordance with an internal signal when enabled, and a second output buffer coupled to the output pad and driving the output pad with second driving capability greater than the first driving capability in accordance with the internal signal when enabled. The first output buffer is enabled in a normal operation mode, and set to an output high impedance state in a test operation mode. The second output buffer is enabled in the test operation mode, and set to an output high impedance state in the normal operation mode.

The semiconductor device according to a second aspect of the present invention includes a first output buffer coupled to an output pad and enabled in a normal operation mode and set to an output high impedance state in a test operation mode, and driving the output pad with first driving capability in accordance with an internal signal when enabled, and a second output buffer coupled to the output pad and enabled in the test operation mode and set to an output high impedance state in the normal operation mode, and driving the output pad with second driving capability greater than the first driving capability in accordance with the internal signal when enabled. The second output buffer includes first and second insulated gate type field effect transistors coupled to the output pad and complementarily rendered conductive in accordance with the internal signal and driving the output pad when conductive.

The semiconductor device according to the second aspect of the present invention further includes a back gate voltage generating circuit which is selectively activated in accordance with an operation mode designating signal and generates, when activated, a bias voltage to be applied to a back gate of at least one of the first and second insulated gate type field effect transistors. The back gate voltage generating circuit includes a clock generating circuit for generating a pumping clock signal when activated, a pumping circuit for generating a bias voltage through a charge pumping operation of a capacitor in accordance with the pumping clock signal, and a detecting circuit for detecting an output voltage level of the pumping circuit and selectively activating a pumping clock generating operation of the clock generating circuit in accordance with the detection result.

The semiconductor device according to a third aspect of the present invention includes an output buffer having an output transistor coupled to an output pad and driving the output pad in accordance with an internal signal, and a back gate voltage setting circuit for changing a back gate voltage of the output transistor in accordance with an operation mode. The back gate voltage setting circuit sets the voltage level of the back gate voltage such that driving capability of the output transistor in a test mode of operation becomes greater than in a normal operation mode.

According to the first and second aspects of the present invention, the first output buffer operating in the normal operation mode and the second output buffer with large driving capability operating in the test operation mode are provided for the output pad. Even if a test probe having large load is brought into contact with the output pad in the test operation mode, the second output buffer with the large driving capability can generate a signal of accurate signal waveform in accordance with the internal signal and drive the test probe at high speed. This ensures accurate testing of the semiconductor device.

In the normal operation mode, the output pad is coupled to an input node of another semiconductor chip. In this normal operation mode, the first output buffer having the driving capability corresponding to the load of the output pad in the normal operation is enabled to drive the output pad in accordance with the internal signal. Therefore, in the normal operation mode, the output pad can be driven in accordance with the internal signal with the optimal driving capability corresponding to the load of the output pad, and signals/data can be transferred between chips at high speed. In the normal operation mode, the second output buffer is set to the output high impedance state, so that it does not adversely affect the inter-chip signal transfer in the normal operation.

The transistor of the output buffer for use in testing can be downsized by adjusting the back gate voltage thereof, and the driving capability of this testing output transistor can readily be increased upon testing. In a normal operation mode, the load on the output pad is decreased with such a testing output transistor of a small size, and the output pad is driven at high speed in accordance with the internal signal in the normal operation.

The back gate voltage of a desired voltage level can be internally generated with accuracy by generating the back gate bias voltage using a charge pumping circuit and by detecting the level of the back gate bias voltage and controlling the pumping operation in accordance with the result of detection. Accordingly, the testing output buffer having necessary operating characteristics can readily be achieved.

According to the third aspect of the present invention, the output buffer is commonly provided for the test mode of operation and the normal operation, and its back gate voltage is adjusted in accordance with the operation mode. Thus, it is possible to decrease output load and output load driving capability in the normal operation mode. In the test operation mode, test results can be transferred to a tester with an increased driving capability.

In addition, it is unnecessary to provide an output buffer dedicated to testing. This reduces the area occupied by the output circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A schematically shows cross sectional structures of the output buffer for the normal operation mode and the output buffer for the test operation mode according to the second embodiment, and FIG. 7B schematically shows substrate regions of the output buffers.

DESCRIPTION OF THE PREFERRED EMBODIMENTS

First Embodiment

Figure 1:
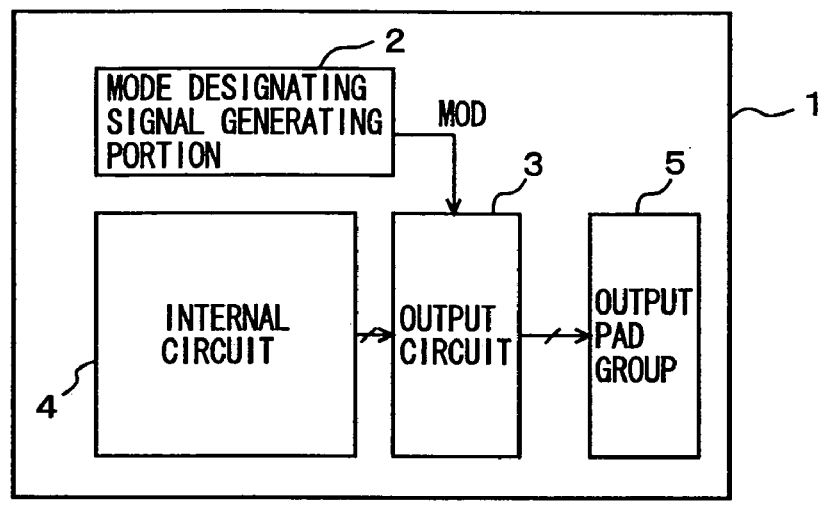
FIG. 1 schematically shows an entire configuration of a semiconductor device according to the present invention.

Referring to FIG. 1, the semiconductor device according to the first embodiment of the present invention is formed on a semiconductor chip 1. The semiconductor device includes an output circuit 3 having output driving capability changed in accordance with a mode designating signal MOD supplied from a mode designating signal generating portion 2. Output circuit 3 buffers an internal signal from an internal circuit 4 according to the set output driving capability, and transmits the buffered signal to an output pad group 5.

Mode designating signal MOD sets an operation mode of the semiconductor device to either a test operation mode or a normal operation mode where semiconductor chip 1 assembled (packaged) in an SIP performs inter-chip signal transfer.

When mode designating signal MOD designates the test operation mode, the output driving capability of output circuit 3 is made large. When mode designating signal MOD designates the normal operation mode, the driving capability of output circuit 3 is set small but sufficient to drive the loads of internal interconnections connected to pads in pad group 5.

The output driving capability of output circuit 3 is changed according to mode designating signal MOD. Thus, inter-chip signal/data transfer can be carried out accurately even when semiconductor chip 1 is packaged into the SIP. In addition, since the driving capability of output circuit 3 is set large upon testing of semiconductor chip 1 at a wafer level, a test probe connected to output pad group 5 is driven with the large output driving capability and a signal of accurate waveform is transmitted to a tester. This ensures accurate testing.

Figure 2:
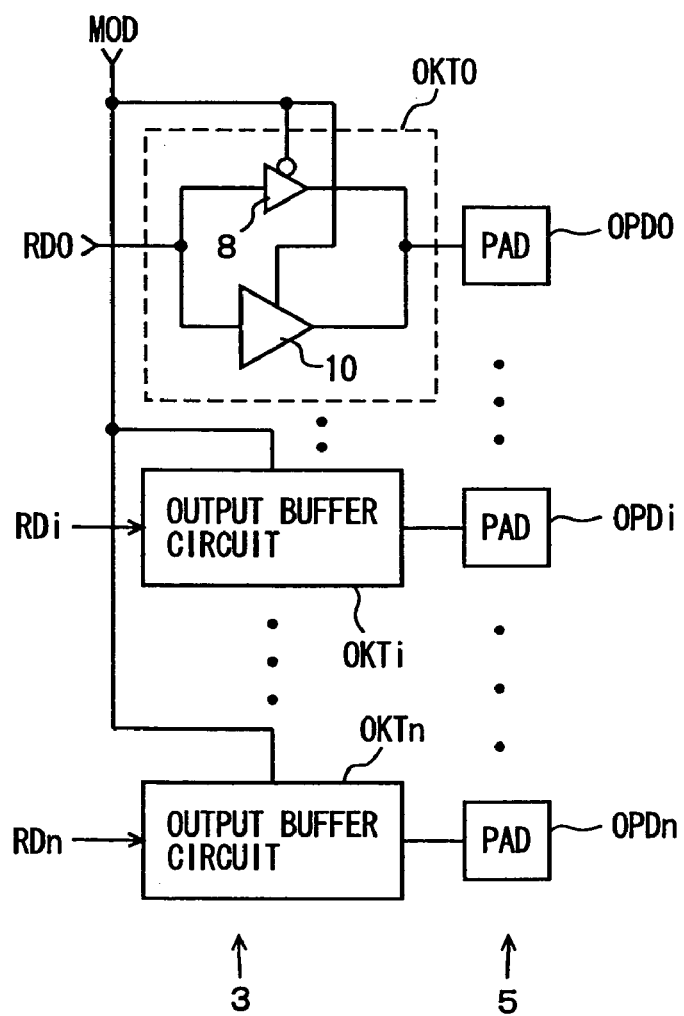
FIG. 2 schematically shows configurations of the output circuit and output pad group shown in FIG. 1.

FIG. 2 schematically shows configurations of output circuit 3 and output pad group 5 shown in FIG. 1. In FIG. 1, output pad group 5 includes output pads OPD0–OPDn.

Output circuit 3 includes output buffer circuits OKT0–OKTn arranged corresponding to output pads OPD0-OPDn. Output buffer circuits OKT0–OKTn, each having driving capability set in accordance with mode designating signal MOD, buffer respective internal signals RD0–RDn from internal circuit 4 shown in FIG. 1, and drive the corresponding output pads OPD0–OPDn.

Since output buffer circuits OKT0–OKTn all have identical configurations, the configuration of output buffer circuit OKT0 is shown representatively in FIG. 2. Output buffer circuit OKT0 includes: a first output buffer 8 which is enabled when mode designating signal MOD designates a normal operation mode and buffers and transmits internal signal RD0 to output pad OPD0 when enabled; and a second output buffer 10 which is enabled when mode designating signal MOD designates a test operation mode and drives output pad OPD0 in accordance with internal signal RD0 when enabled. Output buffers 8 and 10 are each set to an output high impedance state when disabled.

The output driving capability of first output buffer 8 is set smaller than that of second output buffer 10. More specifically; the output driving capability of first output buffer 8 is optimally set for the load of the internal interconnection connected to output pad OPD0. Second output buffer 10 has its output driving capability set considerably greater than that of first output buffer 8 and, when a test probe is connected to output pad OPD0, drives the load associated with the test probe at high speed. The output driving capability of second output buffer 10 may be optimally designed for the load associated with the test probe.

By arranging a pair of buffers, first output buffer 8 for a normal operation mode and second output buffer 10 for a test operation mode, for each of output pads OPD0–OPDn as shown in FIG. 2, it becomes possible to drive corresponding output pad OPD0–OPDn in accordance with internal signal RD0–RDn with optimal driving capability in each operation mode. This allows accurate testing at a wafer level while preventing adverse effects on an operation in the normal operation mode.

Figure 3:
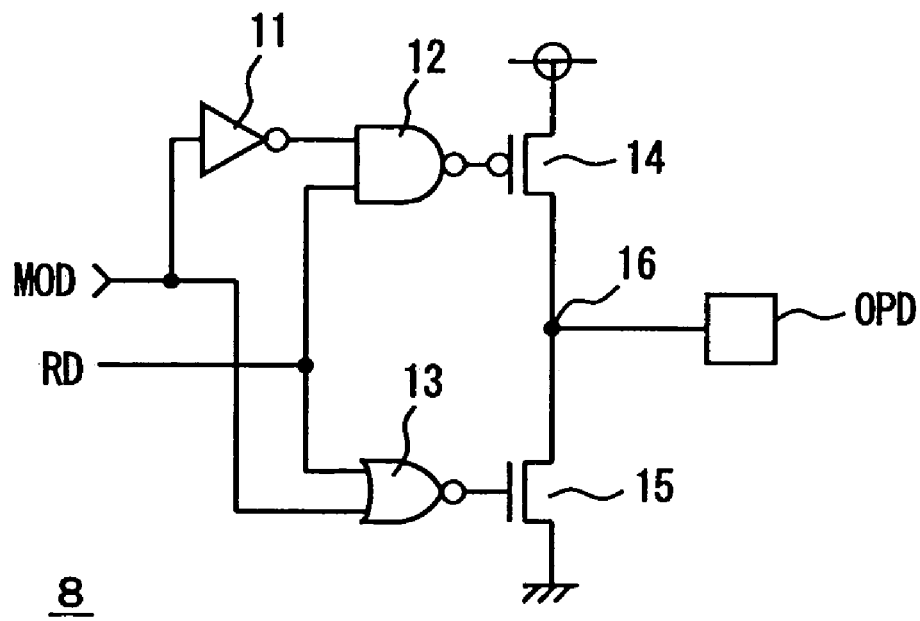
FIG. 3 shows by way of example a configuration of the output buffer for use in a normal operation mode shown in FIG. 2.

FIG. 3 shows by way of example a configuration of first output buffer 8 shown in FIG. 2. Since first output buffer 8 is provided in each of output buffer circuits OKT0–OKTn, an output pad OPD and an internal read signal RD are shown in generic.

Referring to FIG. 3, first output buffer 8 includes: an inverter 11 which receives mode designating signal MOD; a NAND circuit 12 which receives an output signal of inverter 11 and internal signal RD; a NOR circuit 13 which receives mode designating signal MOD and internal signal RD; a P channel MOS transistor (insulated gate type field effect transistor) 14 which drives an output node 16 to a power supply voltage level in accordance with an output signal of NAND circuit 12; and an N channel MOS transistor 15 which drives output node 16 to a ground voltage level in accordance with an output signal of NOR circuit 13. Output node 16 is connected to output pad OPD.

MOS transistors 14 and 15 each have its size (ratio of channel width to channel length) optimally set with respect to the load associated with output pad OPD in a normal operation mode.

In the first output buffer 8 shown in FIG. 3, when mode designating signal MOD is at an H level designating a test operation mode, the output signal of inverter 11 attains an L level, the output signal of NAND circuit 12 attains an H level, and the output signal of NOR circuit 13 attains an L level. Thus, in the test operation mode, MOS transistors 14 and 15 are both kept non-conductive, so that first output buffer 8 is set to an output high impedance state.

In a normal operation mode, mode designating signal MOD is set to an L level, and the output signal of inverter 11 attains an H level. In this state, NAND circuit 12 and NOR circuit 13 each operate as an inverter, and MOS transistors 14 and 15 are selectively set to a conductive state in accordance with internal signal RD.

Thus, in the test operation mode, first output buffer 8 is set to an output high impedance state, so that it does not exert any adverse effects on the driving operation of output pad OPD by second output buffer 10. In the normal operation mode, second output buffer 10 is set to an output high impedance state, as will be described later in detail, allowing first output buffer 8 to drive output pad OPD with optimal driving capability in accordance with internal signal RD. Accordingly, output pad OPD can be driven with optimal output driving capability in a normal operation mode after packaging. There is no need to make first output buffer 8 have unnecessarily large driving capability, and thus, current consumption is reduced.

Further, since output pad OPD is driven with optimal driving capability, overdrive is suppressed and ringing is prevented from occurring. Thus, fast and accurate signal/data transfer is ensured.

Figure 4:
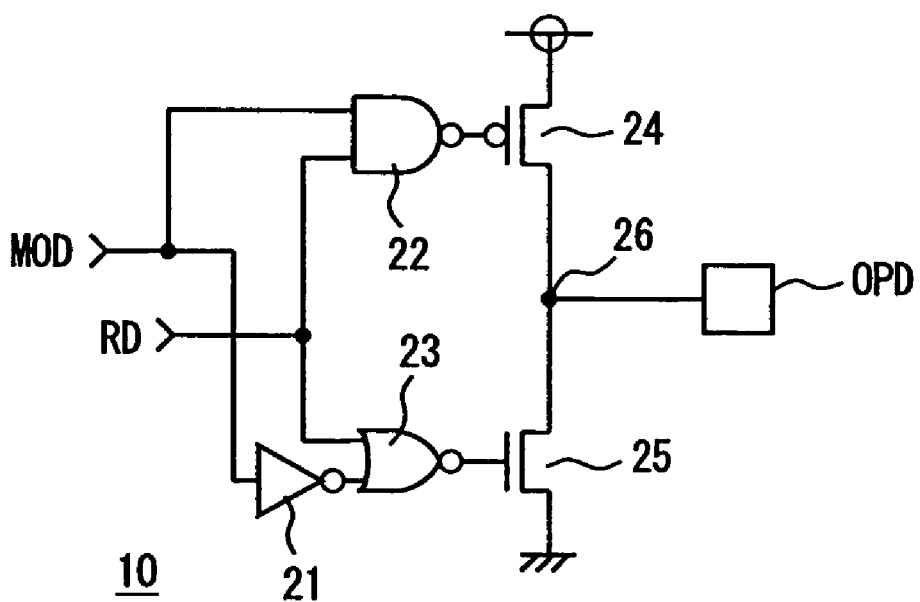
FIG. 4 shows by way of example a configuration of the output buffer for a test operation mode shown in FIG. 2.

FIG. 4 shows by way of example a configuration of second output buffer 10 shown in FIG. 2. Since second output buffer 10 is provided in each of output buffer circuits OKT0–OKTn, output pad OPD and internal read signal RD are shown in generic in FIG. 4.

Referring to FIG. 4, second output buffer 10 includes: an inverter 21 which receives mode designating signal MOD; a NAND circuit 22 which receives mode designating signal MOD and internal signal RD; a NOR circuit 23 which receives an output signal of inverter 21 and internal signal RD; a P channel MOS transistor 24 which is selectively rendered conductive in accordance with an output signal of NAND circuit 22 and drives an output node 26 to a power supply voltage level when conductive; and an N channel MOS transistor 25 which is selectively rendered conductive in accordance with an output signal of NOR circuit 23 and drives output node 26 to a ground voltage level when conductive.

The size (ratio between channel width to channel length) of each MOS transistors 24 and 25 is made sufficiently large to rapidly drive large load produced when a test probe is in contact with output pad OPD.

In second output buffer 10 shown in FIG. 4, when mode designating signal MOD is at an H level designating a test operation mode, the output signal of inverter 21 is at an L level and in response, NAND circuit 22 and NOR circuit 23 each operate as an inverter. Thus, MOS transistors 24 and 25 are selectively rendered conductive in accordance with internal signal RD. For example, when internal signal RD is at an H level, the output signal of NAND circuit 22 is driven to an L level and the output signal of NOR circuit 23 is driven to an L level. MOS transistor 24 is rendered conductive, and drives output node 26 to a power supply voltage level.

When mode designating signal MOD is at an L level designating a normal operation mode, the output signal of NAND circuit 22 is at an H level, and the output signal of NOR circuit 23 is at an L level. MOS transistors 24 and 25 are both kept non-conductive, and second output buffer 10 is set to an output high impedance state. Thus, in the normal operation mode, second output buffer 10 does not exert adverse effects on an output signal of first output buffer 8 shown in FIG. 3.

Drain junction capacitance of MOS transistors 24 and 25 of second output buffer 10 is simply added to the internal interconnection load as the output load of first output buffer 8. Thus, by adjusting the current driving capability of first output buffer 8 taking into consideration such parasitic capacitance (drain junction capacitance between substrate/impurity region) of second output buffer 10, it is possible to suppress an effect caused by second output buffer 10 in the normal operation mode.

Since a common output pad can be used for signal/data transfer in the normal operation mode and in the test operation mode, it is unnecessary to separately provide a pad for inter-chip connection and a pad dedicated to a test operation mode. This reduces the pad layout area. Although the second output buffer circuit is additionally provided, it occupies an area considerably smaller than an area required for a pad dedicated to testing (because the pitch of a pad cannot be made small due to the pitch of a test probe, and thus, total occupying area of pads becomes greater than that of transistors.)

As described above, according to the first embodiment of the present invention, a common pad is used for signal transfer in normal and test operation modes, which allows reduction of chip size. Further, output buffers having different driving capabilities are arranged in parallel to the common output pad, and are enabled alternatively in accordance with an operation mode. The output pad can be driven with optimal driving capability according to the operation mode, and therefore, accurate signal transfer is ensured in the respective operation modes.

In addition, in the normal operation mode after packaging, only an output buffer with small driving capability is operated. Thus, by optimizing the driving capability of the relevant output buffer corresponding to the output load in the normal operation mode, current consumption in signal output can be reduced.

Second Embodiment

Figure 5:
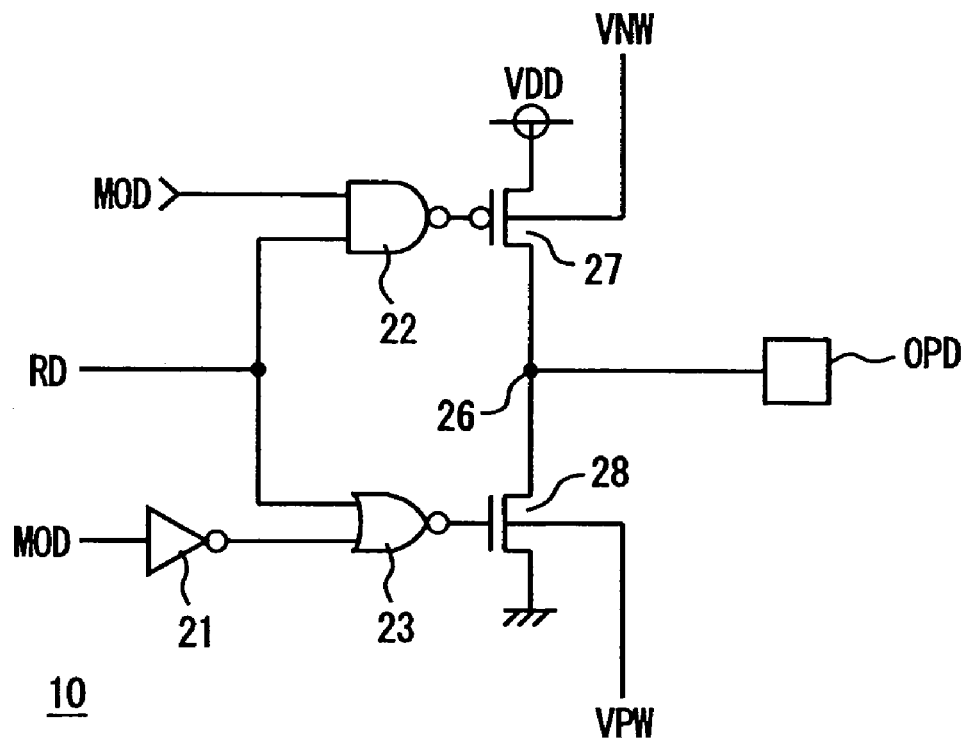
FIG. 5 schematically shows a configuration of the testing: output buffer according to a second embodiment of the present invention.

FIG. 5 schematically shows a configuration of the second output buffer according to the second embodiment. Referring to FIG. 5, second output buffer 10 includes: a P channel MOS transistor 27 which drives output node 26 to a power supply voltage level in response to the output signal of NAND circuit 22; and an N channel MOS transistor 28 which drives output node 26 to a ground voltage level in response to the output signal of NOR circuit 23.

MOS transistors 27 and 28 each have a back gate region isolated from a substrate region (well region) of another circuit. The back gate of MOS transistor 27 is supplied with a bias voltage VNW, and the back gate of MOS transistor 28 is supplied with a bias voltage VPW. The other configuration of the second output buffer 10 shown in FIG. 5 is the same as that of the output buffer shown in FIG. 4, and therefore, the corresponding portions are denoted by same reference characters, and detailed description thereof is not repeated.

Here, P channel MOS transistor (insulated gate type field effect transistor) 27 has its back gate formed of an N well region, and N channel MOS transistor 28 has its back gate formed of a P well region. Bias voltages VNW and VPW are applied to the N well region and the P well region, respectively.

Figure 6:
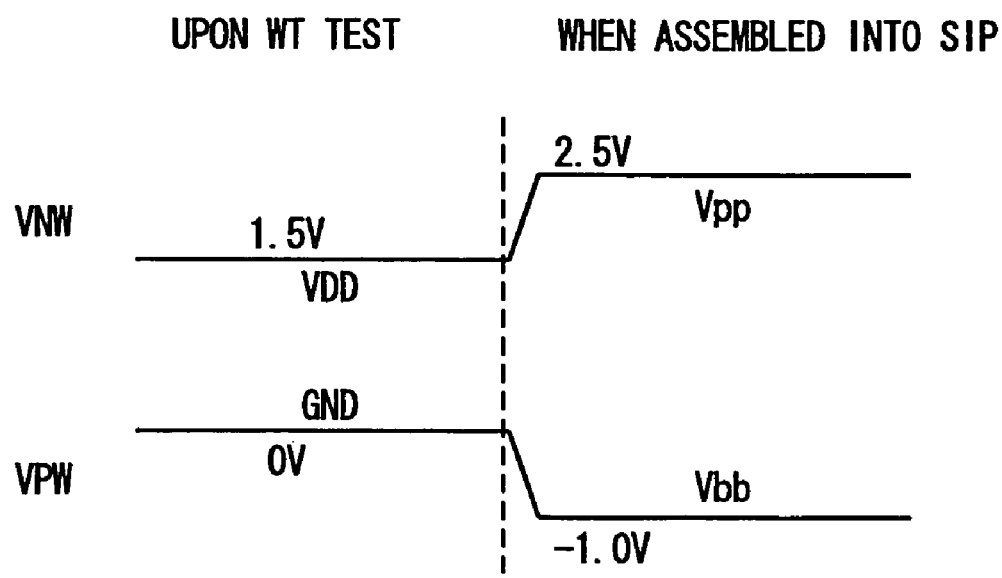
FIG. 6 shows voltage levels of the back gate bias voltages shown in FIG. 5 in respective operation modes.

FIG. 6 shows voltage levels of bias voltages VNW and VPW shown in FIG. 5 in the respective operation modes.

In a test operation mode in which a wafer level test (WT test) is performed, bias voltages VNW and VPW are set to a power supply voltage VDD level and a ground voltage GND level, respectively, in accordance with the mode designating signal. Thus, in the test operation mode, the back gate and the source of each of MOS transistors 27 and 28 are set to the same voltage level, so that the substrate bias effect is eliminated and the threshold voltage is decreased. Here, power supply voltage VDD is, e.g., 1.5 V and ground voltage GND is, e.g., 0 V.

In the test operation mode, MOS transistors 27 and 28 each have a threshold voltage of a small absolute value, and drive a test probe in contact with output pad OPD at high speed in accordance with internal signal RD.

After packaging (SIP assembly), bias voltage VNW is set to a high voltage Vpp level that is higher than power supply voltage VDD, and bias voltage VPW is set to a negative voltage Vbb level that is lower than ground voltage GND, in accordance with mode designating signal MOD. In the case where power supply voltage VDD is 1.5 V, high voltage Vpp is 2.5 V and negative voltage Vbb is −1.0 V.

When high voltage Vpp and negative voltage Vbb are supplied as bias voltages VNW and VPW, respectively, back gate biases of MOS transistors 27 and 28 become deep, and the absolute values of their threshold voltages become large. As the substrate bias is made deeper, junction capacitance is reduced, and parasitic capacitance of output node 26 is decreased. Thus, when the first output buffer (output buffer 8 shown in FIG. 3) is put into operation in the normal operation mode for inter-chip signal transfer after assembly into SIP, the output load of the first output buffer can be reduced. Since the output driving load of first output buffer 8, is reduced in the normal operation mode, high-speed operation is achieved. The output current of first output buffer 8 is also reduced.

Further, by setting the absolute values of bias voltages VNW and VPW greater in the normal operation mode after the SIP assembly than in the test operation mode, the absolute values of the threshold voltages of MOS transistors 27 and 28 are made greater in the normal operation mode than in the test operation mode. Accordingly, sub-threshold currents of MOS transistors 27 and 28 can be decreased, and thus, the current consumption can further be reduced.

FIG. 7A schematically shows cross sectional structures of the first and second output buffers. First output buffer 8 is formed in a P type substrate region 31 that is formed on a P type semiconductor substrate 30. Second output buffer 10 is formed in an N type well 41 that is formed in the surface of P type semiconductor substrate 30.

First output buffer 8 includes: a P channel MOS transistor which is formed in an N type well region 32 formed on P type substrate region (well region) 31; and an N channel MOS transistor which is formed in a surface of P type semiconductor substrate region (well region) 31. The P channel MOS transistor includes P type impurity regions 33a and 33b formed in the surface of N type well region 32 spaced apart from each other, and a gate electrode 34 formed on a surface of the substrate region between these impurity regions 33a and 33b with a gate insulating film (not shown) interposed in between.

N type well region 32 is biased to a power supply voltage VDD level by an N type impurity region 35. Impurity region 33a is coupled to a power supply node supplying a power supply voltage VDD, to equalize the voltages of the back gate and source of the P channel MOS transistor with each other The N channel MOS transistor of first output buffer 8 includes N type impurity regions 36a and 36b formed in the surface of P type semiconductor substrate region (well region) 31 spaced apart from each other, and a gate electrode 37 formed on a surface of the substrate region between these impurity regions 36a and 36b with a gate insulating film (not shown) interposed in between.

P type substrate region 31 is biased to a ground voltage level by a P type impurity region 38. Impurity region 36b is connected to a ground node, to equalize the voltages of the source and back gate of the N channel MOS transistor with each other.

Impurity regions 33b and 36a are connected with each other, and gate electrodes 34 and 37 are connected with each other. Impurity regions 33b and 36a are coupled to a corresponding output pad OPD, and a corresponding internal signal RD is applied to gate electrodes 34 and 37.

Second output buffer 10 includes: a P channel MOS transistor formed in a surface of N type well region 41; and an N channel MOS transistor formed in a P type well region 42 that is formed in N type well 41. The P channel MOS transistor of second output buffer 10 includes P type impurity regions 43a and 43b formed in a surface of N type well region 41 spaced apart from each other, and a gate electrode 44 formed on a surface of the well region between these impurity regions 43a and 43b with a gate insulating film (not shown) interposed therebetween.

N type well region 41 is biased to a well bias voltage by an N type impurity region 45. Impurity, region 43a is coupled to a power supply node.

The N channel MOS transistor of second output buffer 10 includes N type impurity regions 46a and 46b formed in a surface of N type well region 42 spaced apart from each other, and a gate electrode 47 formed on a surface of the well region between these impurity regions 46a and 46b with a gate insulating film (not shown) interposed in between.

Well bias voltage VPW is applied via P type impurity region 48 to P type well region 42. Impurity region 46b is connected to a ground node.

Impurity regions 43b and 46a are connected with each other, and coupled to a corresponding output pad OPD. Gate electrodes 44 and 47 are connected with each other, and receive a corresponding internal signal RD.

As shown in FIG. 7A, first output buffer 8 and second output buffer 10 are formed in separate substrate regions (well regions). Well region 32 constitutes the back gate of the P channel MOS transistor of first output buffer 8. Semiconductor substrate region 31 constitutes the back gate of the N channel MOS transistor of first output buffer 8.

Well region 41 constitutes the back gate of the P channel MOS transistor of second output buffer 10, and well region 42 constitutes the back gate of the N channel MOS transistor of second output buffer 10. Substrate region 31 and N well region 41 are electrically isolated from each other. Thus, by electrically isolating P type semiconductor substrate region 31 and N type well region 41 from each other, it is possible to apply bias voltages of different voltage levels to the back gates of the MOS transistors of second output buffer 10 and to the back gates of the MOS transistors of first output buffer 8.

P type semiconductor substrate region 31 has its impurity concentration made different from that of semiconductor substrate 30, for the purpose of forming the N channel MOS transistor of first output buffer 8 therein. Thus, P type semiconductor substrate region 31 may be an epitaxial layer, instead of the well region.

Further, in general, semiconductor substrate 30 is forcibly set to a ground voltage level from the backside of the chip.

FIG. 7B schematically shows a planar layout of substrate regions (back gate regions) of the first and second output buffers. The first output buffer has the P channel MOS transistor (PMOS) formed in an N type region 50 and the N channel MOS transistor (NMOS) formed in a P type region 51. N type region 50 corresponds to well region 32 shown in FIG. 7A, and P type region 51 corresponds to P type semiconductor substrate region 31 shown in FIG. 7A.

A power supply voltage VDD is applied to N type region 50, and a ground voltage is applied to P type region 51. N type region 50 serves as the back gate region of the P channel MOS transistor, and P type region 51 serves as the back gate region of the N channel MOS transistor. Thus, in the first output buffer, the P channel MOS transistor and the N channel MOS transistor each have its source and back gate voltages made equal to each other.

The second output buffer has the P channel MOS transistor formed in an N type region 52 and the N channel MOS transistor formed in a P type region 53. N type region 52 corresponds to N type well region 41 shown in FIG. 7A, and P type region 53 corresponds to P type well region 42 shown in FIG. 7A. Bias voltage VNW is applied to N type region 52, and bias voltage VPW is applied to P type region 53.

In these semiconductor regions 50-53, MOS transistors of the output buffers provided corresponding to respective output pads of the output pad group are commonly formed. N type region 50 and P type region 51 are employed as the common back gate regions of the first output buffers operating in a normal operation mode. N type region 52 and P type region 53 are each employed as the common substrate region for the second output buffers operating in a test operation mode.

Thus, in FIG. 7A, P type substrate region 31 and N type well region 41 are each commonly provided for a plurality of MOS transistors, and N type well region 32 and P type well region 42 are each commonly provided for a plurality of MOS transistors. The MOS transistors of different output buffers are isolated from each other by, e.g., a field insulating film.

First Configuration of Bias Voltage Generating Portion

Figure 8:
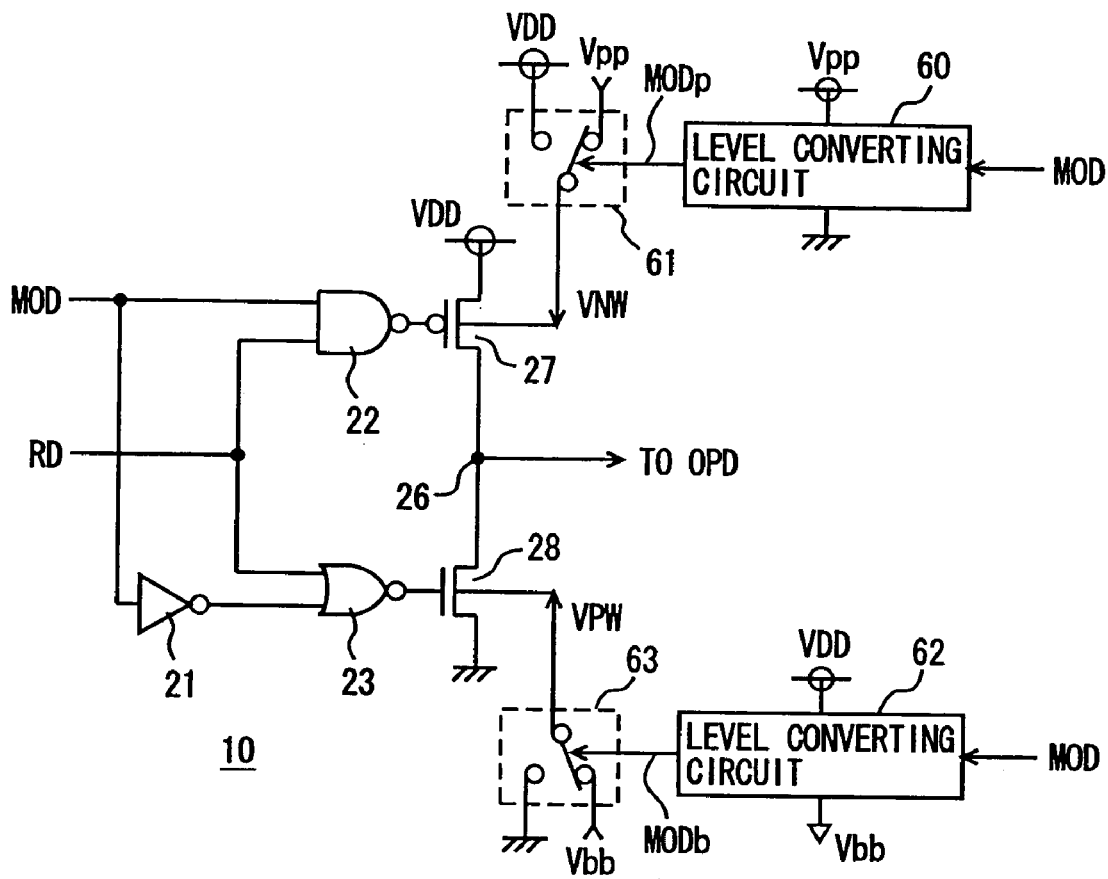
FIG. 8 schematically shows a configuration of a back gate bias generating portion according to the present invention.

FIG. 8 schematically shows a configuration of a portion of second output buffer 10 for applying a well (back gate) bias. Referring to FIG. 8, the well bias voltage applying portion includes: a level converting circuit 60 which converts mode designating signal MOD to a signal changing between a high voltage Vpp and a ground voltage; a select circuit 61 which selects one of the high voltage Vpp and power supply voltage VDD in accordance with the output signal of level converting circuit 60 and generates bias voltage VNW for the back gate of MOS transistor 27; a level converting circuit 62 which converts mode designating signal MOD to a signal altering between a power supply voltage VDD and a negative voltage Vbb; and a select circuit 63 which selects one of the ground voltage and negative voltage Vbb in accordance with the output signal of level converting circuit 62 and generates bias voltage VPW for MOS transistor 28.

Mode designating signal MOD, whose generation manner will be described later in detail, is a signal altering between the power supply voltage VDD level and the ground voltage level. In the case where the power supply voltage VDD is an output power supply voltage used exclusively for the output circuit, mode designating signal MOD may be a signal altering between an internal power supply voltage VCC level and the ground voltage level. Internal power supply voltage VCC is utilized as an operating power supply voltage of the internal circuit. If the semiconductor device is a DRAM, for example, internal power supply voltage VCC is used as the power supply voltage of peripheral circuitry performing memory cell selection. This internal power supply voltage VCC may be externally supplied, in addition to output power supply voltage VDD.

Level converting circuit 60 converts the mode designating signal MOD with the amplitude of VDD or VCC to a signal MODp changing between high voltage Vpp and the ground voltage. With one of the power supply voltage VDD and the high voltage Vpp being selected, bias voltage VNW is generated reliably.

This select circuit 61 is formed of, e.g., CMOS transmission gates provided corresponding to power supply voltage VDD and high voltage Vpp, respectively. One of the CMOS transmission gates is set to a conductive state and the other to a non-conductive state alternatively in accordance with the output signal of level converting circuit 60.

Level converting circuit 62 converts mode designating signal MOD with the amplitude of VDD to a signal MODb changing between power supply voltage VDD and negative voltage Vbb. Like select circuit 61, select circuit 63 is formed of, e.g., CMOS transmission gates. One of the CMOS transmission gate provided for the ground voltage and the CMOS transmission gate provided for the negative voltage Vbb is rendered conductive and the other is rendered non-conductive alternatively in accordance with the output signal MODb of level converting circuit 62.

In a test operation mode, select circuit 61 selects power supply voltage VDD to generate bias voltage VNW, and select circuit 63 selects ground voltage GND to generate bias voltage VPW.

In a normal operation mode, i.e., after SIP assembly, select circuit 61 selects high voltage Vpp and select circuit 63 selects negative voltage Vbb. Thus, by providing an additional circuit for generating a well bias voltage of second output buffer 10 in a test operation mode, and by switching the well bias voltages by select circuits 61 and 63, as shown in FIG. 8, it is readily possible to change the back gate bias voltage of second output buffer 10 according to an operation mode with a simple circuit configuration.

Figure 9:
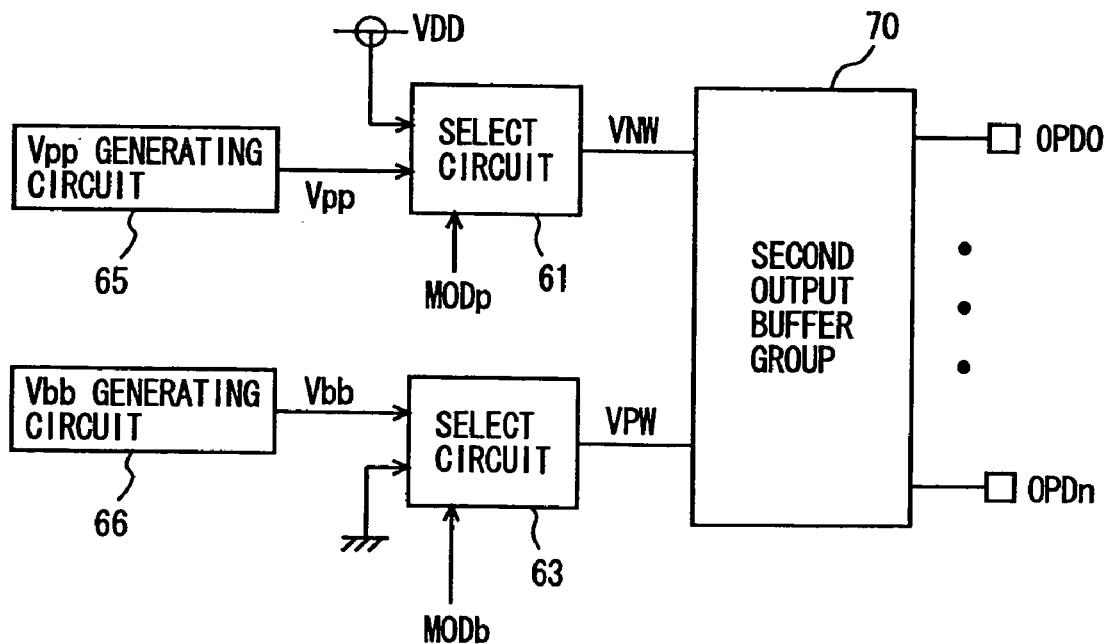
FIG. 9 schematically shows an overall configuration of the back gate bias generating portion according to the present invention.

FIG. 9 schematically shows a configuration of the bias voltage generating portion for a second output buffer circuit group. Referring to FIG. 9, select circuit 61 selects one of power supply voltage VDD and high voltage Vpp from a Vpp generating circuit 65 in accordance with the level-converted mode designating signal MODp, for generating well bias voltage VNW. Select circuit 63 selects one of the ground voltage and negative voltage Vbb from a Vbb generating circuit 66 in accordance with the level-converted mode designating signal MODp, to generate well bias voltage VPW. Select circuits 61 and 63 are commonly provided for the second output buffers in the second output buffer group.

The second output buffer group 70 includes second output buffers (10) arranged corresponding to respective output pads OPB0–OPBn. Bias voltage VNW is commonly supplied to back gates of the P channel MOS transistors (27) of the second output buffers included in second output buffer group 70. Bias voltage VPW is commonly supplied to the back gates of the N channel MOS transistors (28) included in second output buffer group 70.

Vpp generating circuit 65 and Vbb generating circuit 66 may be provided exclusively for well bias switching of the second output buffers. Alternatively, in the case where internal circuitry includes circuits for generating high voltage Vpp and negative voltage Vbb, respectively, output voltages Vpp and Vbb of the Vpp and Vbb generating circuits arranged in the internal circuitry may be used for the well bias switching of the second output buffers.

In particular, in the case where the semiconductor device is a DRAM, high voltage Vpp is generally used for driving a selected word line, and negative voltage Vbb is used for biasing a substrate region of a memory cell array region. Thus, in this case, the Vpp generating circuit for driving the word line and the Vbb generating circuit for biasing the substrate can be utilized as the back gate voltage generating circuits for second output buffer 10. Such use of the internally provided circuits eliminates the need to provide a circuit dedicated to back gate biasing of the output buffers, thereby reducing the circuit occupying area.

Vpp generating circuit 65 and Vbb generating circuit 66 can readily be implemented using pumping circuits utilizing charge pumping operations of capacitors.

Even if Vpp generating circuit 65 and Vbb generating circuit 66 are provided exclusively for second output buffer group 70, they only serve to keep constant the voltage level of the back gates of the second output buffers set in a non-operative state in the normal operation mode. Thus, their power consumption is sufficiently small, and an increase of power consumption in the normal operation mode is suppressed.

Second Configuration of Bias Voltage Generating Portion

Figure 10:
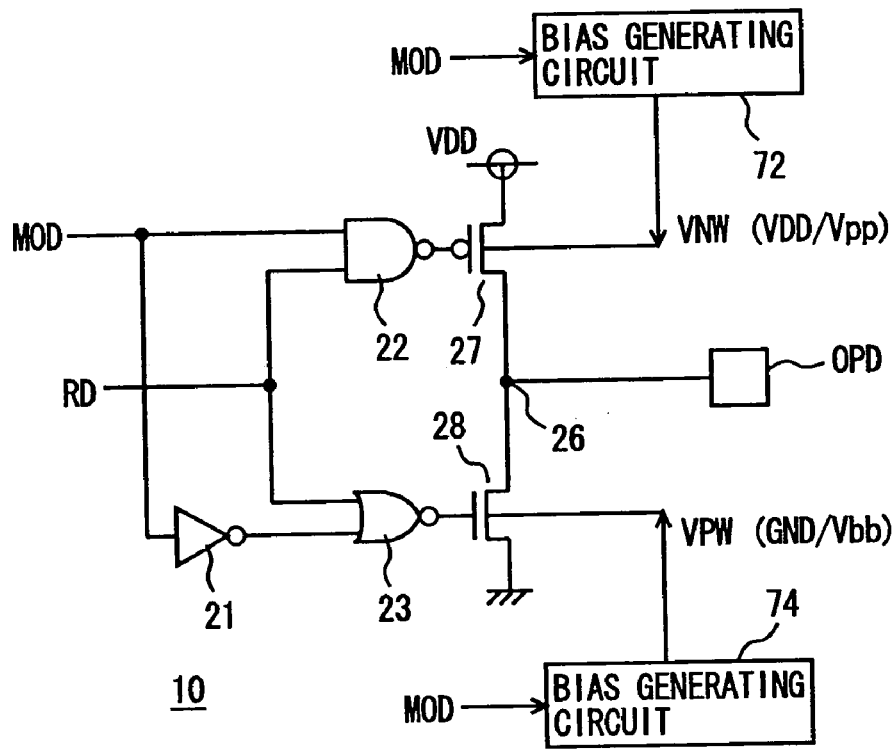
FIG. 10 schematically shows another configuration of the back gate bias generating portion according to the present invention.

FIG. 10 schematically shows another configuration of the bias voltage generating portion according to the second embodiment. Referring to FIG. 10, the output buffer 10 has the same configuration as the above-described second output buffer 10 shown in FIG. 8. The back gate of pull-up P channel MOS transistor 27 is supplied with bias voltage VNW from a bias generating circuit 72 having its generating voltage level changed in accordance with mode designating signal MOD. The back gate of pull-down N channel MOS transistor 28 is supplied with bias voltage VPW from a bias generating circuit 74 having its generating voltage level changed between a ground voltage level and a negative voltage level in accordance with mode designating signal MOD.

According to the configuration of the well bias voltage generating portion shown in FIG. 10, when mode designating signal MOD designates a normal operation mode, bias generating circuits 72 and 74 generate high voltage Vpp and negative voltage Vbb, respectively, and output them as bias voltages VNW and VPW. When mode designating signal MOD designates a test operation mode, bias generating circuit 72 generates a voltage of power supply voltage VDD level as bias voltage VNW, and bias generating circuit 74 generates a voltage of ground voltage GND level as bias voltage VPW.

In such configurations of bias generating circuits 72 and 74, the voltages to be generated as the back gate bias voltages in the test operation mode need not be at the same voltage levels as power supply voltage VDD and ground voltage GND. In other words, the back gate bias voltages having voltage levels different from the voltages VDD and GND may be generated in the test operation mode. Specifically, in the test operation mode, MOS transistors 27 and 28 each may receive, at back gate and source, the voltages of different voltage levels.

Bias generating circuits 72 and 74 are commonly provided for second output buffers 10 in second output buffer group 70.

Bias generating circuits 72 and 74 shown in FIG. 10 have their generating voltage levels changed in accordance with mode designating signal MOD. Accordingly, a switch circuit (select circuit) for switching the bias voltages becomes unnecessary, and also, interconnections for supplying the second output buffer group with high voltage Vpp and power supply voltage VDD, and ground voltage GND and negative voltage Vbb, respectively, become unnecessary. The layout area is thus reduced.

First Specific Configuration of Bias Voltage Generating Circuit

Figure 11:
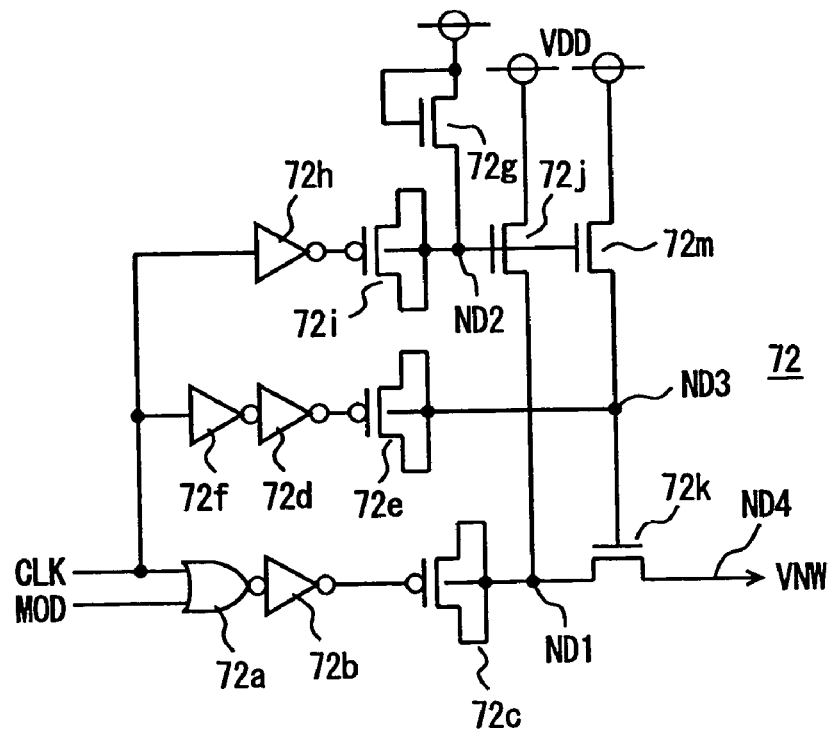
FIG. 11 shows by way of example a configuration of the bias generating circuit generating a bias voltage to an N well shown in FIG. 10.

FIG. 11 shows by way of example a specific configuration of bias generating circuit 72 shown in FIG. 10. Referring to FIG. 11, bias generating circuit 72 includes: a NOR gate 72a which receives a clock signal CLK and mode designating signal MOD; an inverter 72b which receives an output signal of NOR gate 72a; a capacitive element 72c which supplies charges to a node ND1 in accordance with an output signal of inverter 72b; an inverter 72h which receives clock signal CLK; a capacitive element 72i which supplies charges to a node ND2 in accordance with an output signal of inverter 72h; cascaded two-stage inverters 72f and 72d which receive clock signal CLK; a capacitive element 72e which supplies charges to a node ND3 in accordance with an output signal of inverter 72d; a diode-connected N channel MOS transistor 72g which clamps a lower-limit voltage level of node ND2 to a voltage level of VDD−Vth; an N channel MOS transistor 72j which is selectively rendered conductive in accordance with the voltage level of node ND2, and transmits voltage VDD of the power supply node to node ND1 when conductive; an N channel MOS transistor 72m which is selectively rendered conductive in accordance with the voltage level of node ND2 and transmits power supply voltage VDD to node ND3 when conductive; and an N channel MOS transistor 72k which is selectively rendered conductive in accordance with the voltage level of node ND3 and electrically connects node ND1 to an output node ND4 to generate bias voltage VNW at output node ND4 when conductive. Here, the voltage Vth represents the threshold voltage of MOS transistor 72g.

Capacitive elements 72c, 72e and 72i are each formed of a P channel MOS transistor with its back gate and source interconnected, and have its capacitive value made as large as possible, and have a capacitance reliably formed even if the gate voltage level is at an H level. Now, the operation of bias generating circuit 72 shown in FIG. 11 will be described with reference to signal waveform diagrams shown in FIGS. 12 and 13.

Figure 12:
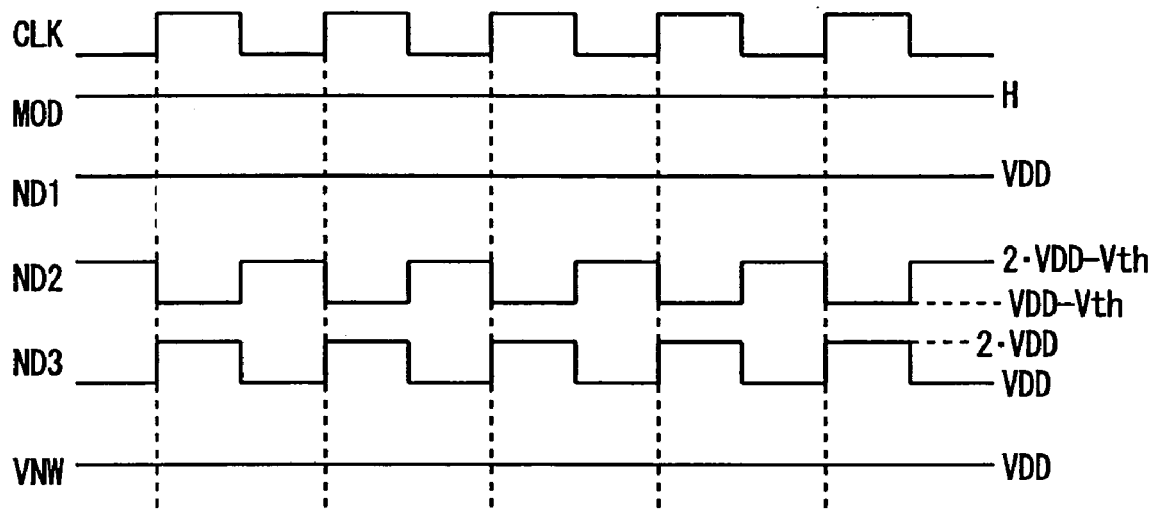
FIG. 12 shows signal waveforms illustrating an operation of the bias generating circuit shown in FIG. 11 in a test operation mode.

Referring first to FIG. 12, the operation in a wafer level test when mode designating signal MOD is set to an H level is described. When mode designating signal MOD is at an H level, the output signal of inverter 72b is fixed to an H level. Clock signal CLK is supplied via inverters 72f and 72d to capacitive element 72e. Thus, capacitive element 72e, through its charge pumping operation, supplies charges to node ND3 when clock signal CLK rises, and draws charges from node ND3 when clock signal CLK falls.

Capacitive element 72i performs the charge pumping operation in accordance with an inverted clock signal from inverter 72h. Clamping MOS transistor 72g is connected to node ND2. Thus, the voltage of node ND2 increases to a voltage level of 2VDD−Vth in response to rising of clock signal CLK, and decreases to a voltage level of VDD−Vth in response to falling of dock signal CLK. Here, the operating power supply voltage for each component of bias generating circuit 72 is assumed to be power supply voltage VDD.

Thus, when node ND2 is at a voltage level of VDD−Vth, MOS transistor 72j is in an off state. At this time, capacitive element 72c maintains the charges in node ND1. With the output signal of inverter 72b being at an H level, capacitive element 72c functions as a capacitance for stabilizing the voltage of node ND1.

When clock signal CLK falls to an L level, MOS transistor 72j is rendered conductive, and power supply voltage VDD is transmitted to node ND1. Thus, node ND1 is maintained at the voltage level of VDD by MOS transistor 72j.

MOS transistor 72m operating in phase with MOS transistor 72j is rendered conductive in response to falling of clock signal CLK and transmits power supply voltage VDD to node ND3.

Capacitive element 72e supplies charges to node ND3 in response to rising of clock signal CLK, and draws charges from node ND3 in response to falling of clock signal CLK. Since the charge supplying operation of capacitive element 72e and the voltage transmitting operation of MOS transistor 72m are carried out in opposite phase, the voltage level of node ND3 changes between voltage VDD and voltage 2VDD.

With node ND1 being at a voltage level of power supply voltage VDD, MOS transistor 72k is rendered conductive when the voltage level of node ND3 becomes 2VDD in response to rising of clock signal CLK, and it supplies charges from node ND1 to node ND4.

When the voltage level of node ND3 decreases to a power supply voltage VDD level in response to falling of clock signal CLK, MOS transistor 72k is rendered non-conductive if voltage VNW of node ND4 is not lower than VDD−Vth. Here, the threshold voltage of MOS transistor 72k is assumed to be equal to the threshold voltage of MOS transistor 72e.

Node ND3 attains a voltage level of 2VDD in response to rising of clock signal CLK, and MOS transistor 72k is rendered conductive. Nodes ND1 and ND4 are electrically connected to each other. Accordingly, the voltage VNW of node ND4 is maintained at the power supply voltage VDD level in a steady state.

In other words, bias voltage generating circuit 72 generates a voltage of power supply voltage VDD level as bias voltage VNW in a test operation mode.

In this case, the voltages of the back gate and the source region of MOS transistor 27 attain the same voltage level in the test operation mode. Thus, the threshold voltage can be made small in absolute value without causing a back gate bias effect (substrate effect), to allow high-speed signal/data transmission to an external tester.

In this semiconductor device, in the case where power supply voltage VDD dedicated to output circuit operation and power supply voltage VCC for internal circuit operation are provided separately as the power supply voltages, if the voltage level of power supply voltage VCC for internal circuit is higher than the voltage level of power supply voltage VDD for output circuit, the power supply voltage VCC for internal circuit may be utilized as the operating power supply voltage of bias generating circuit 72. By setting the bias voltage VNW to a voltage level higher than that of power supply voltage VDD, the threshold voltage of the testing output MOS transistor can be made even smaller. In this case, however, the PN junction between the substrate region and impurity region of the testing output MOS transistor should be maintained in an off state.

Figure 13:
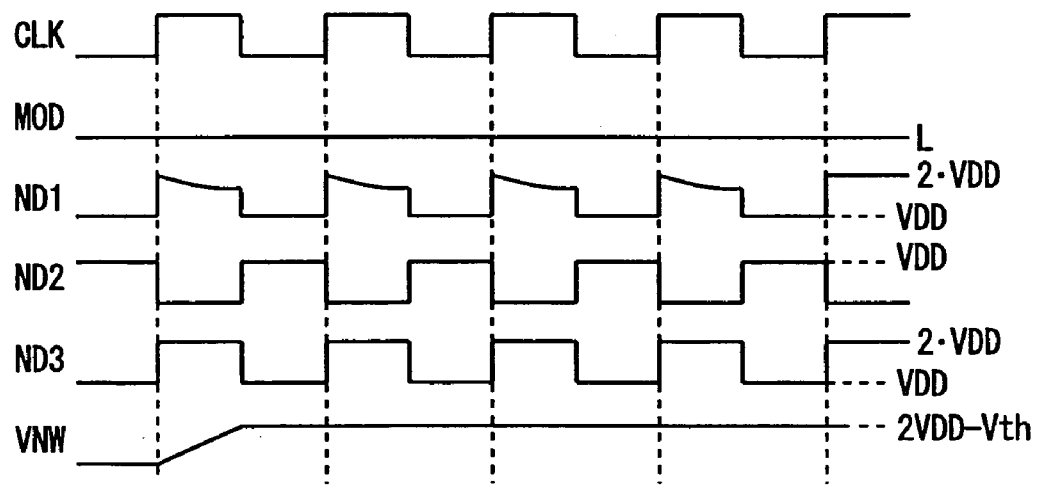
FIG. 13 shows signal waveforms illustrating an operation of the bias generating circuit shown in FIG. 11 in a normal operation mode.

Referring next to FIG. 13, the operation of bias generating circuit 72 after packaging is described. After packaging, the normal operation mode is set, and mode designating signal MOD is set to an L level. In this state, NOR circuit 72a operates as an inverter, and the output signal of inverter 72b changes in phase with clock signal CLK. At rising of clock signal CLK, charges are supplied to node ND1 in accordance with the charge pumping operation of capacitive element 72c, and its voltage level increases.

When clock signal CLK is at an L level, the output signal of inverter 72h is at an H level. The voltage level of node ND2 is increased by capacitive element 72i. In the time period when clock signal CLK is at an L level, node ND1 is precharged to a power supply voltage VDD level by MOS transistor 72j. Thus, node ND1 has a voltage level increased to a voltage level of 2VDD when clock signal CLK rises to an H level, and when clock signal CLK falls to an L level, node ND1 is precharged to a power supply voltage VDD level by MOS transistor 72j.

Capacitive element 72e performs the charge pumping operation in phase with capacitive element 72c. The voltage level of node ND3 changes between voltage VDD and voltage 2VDD by a precharging operation of the precharging MOS transistor 72m. Thus, when clock signal CLK is at an H level, the voltage level of node ND3 attains 2VDD, which is the same voltage level as node ND1. When the voltage level of node ND4 is lower than the voltage level of node ND1, charges are transmitted from node ND1 to node ND4. Accordingly, in a stable state, due to the presence of the threshold voltage of MOS transistor 72k, high voltage Vpp of 2VDD−Vth at maximum can be generated as bias voltage VNW. With the maximum voltage level of 2VDD−Vth, a high voltage level of bias voltage VNW in a normal operation mode is set to an optimal value by level detector and control circuit not shown.

Clock signal CLK may be generated by an oscillator formed of, e.g., a ring oscillator. If the semiconductor device is a synchronous semiconductor device operating in synchronization with a clock signal, the clock signal externally supplied for the synchronous operation may be utilized as the clock signal CLK for charge pumping. In this case, a circuit for generating an additional clock signal CLK for the charge pumping operation becomes unnecessary, so that the circuit occupying area is reduced.

Figure 14:
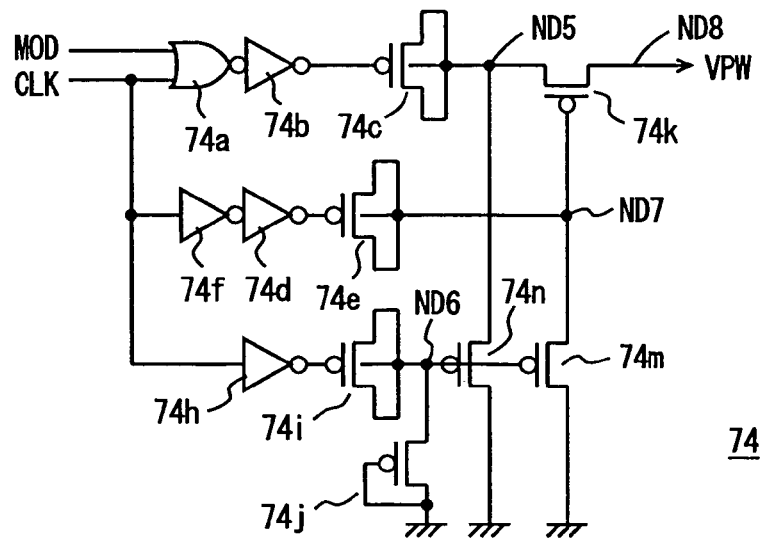
FIG. 14 shows by way of example a configuration of the bias generating circuit generating a back gate bias voltage to a P well shown in FIG. 10.

FIG. 14 shows an example of a specific configuration of bias generating circuit 74 shown in FIG. 10. Referring to FIG. 14, bias generating circuit 74 includes: a NOR gate 74a which receives mode designating signal MOD and dock signal CLK; an inverter 74b which receives an output signal of NOR gate 74a; a capacitive element 74c which draws charges from a node ND5 in accordance with an output signal of inverter 74b; cascaded two-stage inverters 74f and 74d which receive dock signal CLK; a capacitive element 74e which draws charges from a node ND7 in accordance with an output signal of inverter 74d; an inverter 74h which receives dock signal CLK; a capacitive element 74i which draws charges from a node ND6 in accordance with an output signal of inverter 74h; a P channel MOS transistor 74j which damps an upper-limit voltage level of node ND6 to a prescribed voltage level; a P channel MOS transistor 74n which is selectively rendered conductive in accordance with the voltage level of node ND6 and sets node ND5 to a ground voltage level when conductive; a P channel MOS transistor 74m which is selectively rendered conductive in accordance with the voltage level of node ND6 and sets node ND7 to a ground voltage level when conductive; and a P channel MOS transistor 74k which is selectively rendered conductive in accordance with the voltage level of node ND7 and electrically connects nodes ND5 and ND8 when conductive. The bias voltage VPW is generated at node ND8.

Capacitive elements 74c, 74e and 74i are each formed of a P channel MOS transistor, which has its source, drain and back gate interconnected.

MOS transistor 74j has its gate and drain interconnected with each other, and functions as a diode to clamp the upper-limit voltage of node ND6 to an absolute value Vthp of its threshold voltage. The operation of bias generating circuit 74 shown in FIG. 14 will now be described with reference to FIGS. 15 and 16.

Figure 15:
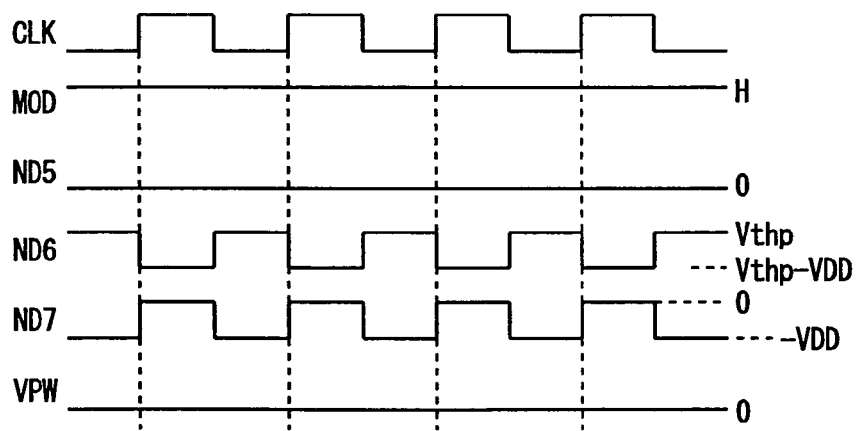
FIG. 15 shows signal waveforms illustrating an operation of the bias generating circuit shown in FIG. 14 in a test operation mode.

First, referring to FIG. 15, the operation when mode designating signal MOD is set to an H level is described. In this test operation mode, mode designating signal MOD is at an H level, and the output signal of inverter 74b is fixed to an H level. The output signal of inverter 74h changes in opposite phase with dock signal CLK, and capacitive element 74i changes the voltage level of node ND6 by its charge pumping operation. MOS transistor 74j is connected to node ND6, and node ND6 has an upper-limit voltage level of Vthp that is equal to an absolute value of the threshold voltage of MOS transistor 74j. Thus, the voltage level of node ND6 attains a voltage level of Vthp–VDD in response to rising of clock signal CLK to an H level, and attans a voltage level of Vthp in response to falling of clock signal CLK.

When node ND6 is driven to a negative voltage level of Vthp–VDD by capacitive element 74i when clock signal CLK is at an H level, MOS transistor 74n is rendered conductive, and node ND5 is precharged to a ground voltage level.

MOS transistor 74m operates in phase with MOS transistor 74n and is rendered conductive when clock signal CLK is at an H level and precharges the node ND7 to a ground voltage level. When nodes ND5 and ND7 are both at a ground voltage level and the voltage level of node ND8 is lower than an absolute value of the threshold voltage of MOS transistor 74k, MOS transistor 74k maintains a non-conductive state.

When clock signal CLK rises to an H level, capacitive element 74e supplies charges to node ND7. However, MOS transistor 74m is in a conductive state at this time, and node ND7 is held at a ground voltage level.

When clock signal CLK falls to an L level, the output signal of inverter 74h rises to an H level. The voltage level of node ND6 increases, and is clamped to a voltage Vthp level by MOS transistor 74j. In response, MOS transistors 74m and 74n are both rendered non-conductive, and the precharging operations of nodes ND7 and ND5 are both terminated.

The output signal of inverter 74d decreases to an L level, and capacitive element 74e draws charges from node ND7 to decrease its voltage level. At this time, MOS transistor 74m is in a non-conductive state. The voltage level of node ND7 is decreased from a ground voltage level to a negative voltage level of –VDD through the charge pumping operation of capacitive element 74e. MOS transistor 74k is rendered conductive, and electrically connects nodes ND5 and ND8. Thus, the voltage level of node ND8 is set to a ground voltage level that is the voltage level of node ND5.

The operations are repeated subsequently, and voltage VPW of node ND8 is maintained at the ground voltage level.

Thus, in the test operation mode, bias voltage VPW for the P well is maintained at a ground voltage level. In this case, there is no voltage difference between the source/drain region and the back gate of N channel MOS transistor 28 in the second output buffer. Without the substrate effect, high-speed signal/data transfer is ensured.

Figure 16:
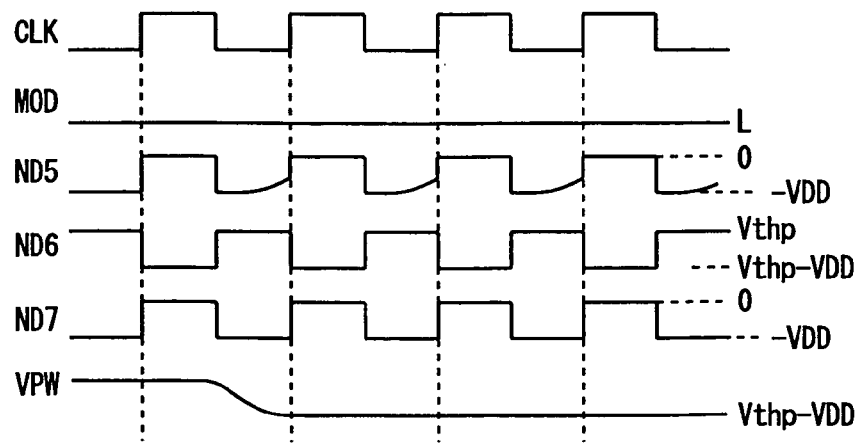
FIG. 16 shows signal waveforms illustrating an operation of the bias generating circuit shown in FIG. 14 in a normal operation mode.

Referring next to FIG. 16, the operation of bias generating circuit 74 after packaging is described. After packaging, mode designating signal MOD is set to an L level, and NOR gate 74a operates as an inverter. Thus, the voltage level of node ND5 changes in phase with clock signal CLK.

The voltage level of node ND6 changes between voltage Vthp and negative voltage Vthp–VDD in opposite phase with clock signal CLK, as in the previous test operation mode. Thus, node ND5 is set to a ground voltage level by MOS transistor 74n when clock signal CLK is at an H level. When clock signal CLK attains an L level, MOS transistor 74n is rendered non-conductive, and node ND5 is set to a negative voltage level of –VDD by the charge drawing operation of capacitive element 74c.

Node ND7 changes between a ground voltage and voltage –VDD in synchronization with clock signal CLK, as in the test operation mode. Thus, when clock signal CLK is at an H level, nodes ND5 and ND7 are both at a ground voltage level, which is higher than the voltage level of node ND8. Therefore, node ND5 functions as the source of MOS transistor 74k, and MOS transistor 74k maintains a non-conductive state.

When clock signal CLK is at an L level, the voltages of nodes ND5 and ND7 decrease to a negative voltage –VDD level. In this case, if node ND5 is at a voltage level lower than the voltage level of node ND8, node ND8 functions as the source of MOS transistor 74k. (Positive) charges flow from node ND8 to node ND5, and the voltage level of bias voltage VPW decreases. Due to the presence of the threshold voltage loss of MOS transistor 74k, bias voltage VPW can reach a voltage level of Vthp–VDD finally.

The well bias voltage VPW is practically set to an appropriate voltage level by a level detecting circuit and a circuit selectively activating a charge pumping operation in accordance with an output signal of the level detecting circuit.

Utilization of bias generating circuits 72 and 74 as shown in FIGS. 11 and 14, respectively, provides the following advantages. In a test operation mode, by setting the logical level of mode designating signal MOD, the back gate bias voltages of the output MOS transistors the same in voltage level as their respective source voltages can be provided as well bias voltages VNW and VPW. Absolute values of the threshold voltages of the MOS transistors of the output buffer can be made sufficiently small to allow a high-speed operation thereof.

Further, in a normal operation mode, the well bias voltages VNW and VPW can be set to prescribed high voltage level and negative voltage level, respectively.

Second Specific Configuration of Bias Voltage Generating Circuit

Figure 17:
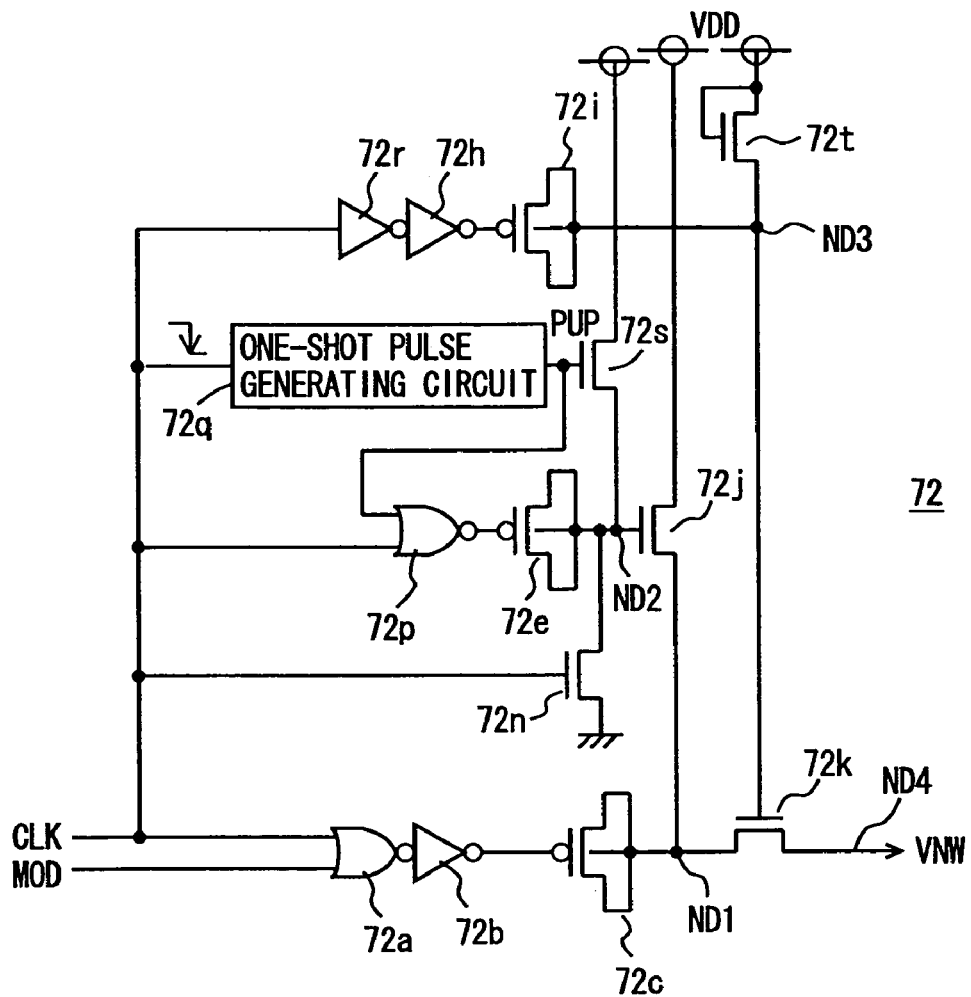
FIG. 17 shows a modification of the bias generating circuit shown in FIG. 11.

FIG. 17 shows a modification of bias generating circuit 72 shown in FIG. 10. The bias generating circuit 72 shown in FIG. 17 includes: a one-shot pulse generating circuit 72q which generates a one-shot pulse signal PUP in synchronization with falling of clock signal CLK; an N channel MOS transistor 72s which couples a power supply node to node ND2 in accordance with the output pulse signal PUP of one-shot pulse generating circuit 72q; and an N channel MOS transistor 72n which discharges node ND2 to a ground voltage level when clock signal CLK is at an H level.

Capacitive element 72e is supplied with an output signal of a NOR gate 72p which in turn receives the output signal of one-shot pulse generating circuit 72q and clock signal CLK. Capacitive element 72e supplies charges to node ND2, to make MOS transistor 72j selectively conductive.

Capacitive element 72i receives clock signal CLK via cascaded two-stage inverters 72r and 72h. Capacitive element 72i supplies charges to the gate node ND3 of MOS transistor 72k. Node ND3 has its lower-limit voltage level clamped to VDD–Vth by a diode-connected MOS transistor 72t.

With respect to node ND1, a NOR gate 72a receiving mode designating signal MOD and clock signal CLK, an inverter 72b receiving an output signal of NOR gate 72a, and a capacitive element 72c supplying charges to node ND1 in accordance with an output signal of inverter 72b, are provided, as in the configuration shown in FIG. 11.

Node ND1 is coupled to a node ND4 via MOS transistor 72k.

In the configuration shown in FIG. 17, node ND3 has its lower-limit voltage level clamped to VDD−Vth by MOS transistor 72t. The voltage level of node ND3 changes between 2VDD−Vth and VDD−Vth in synchronization with clock signal CLK through the charge pumping operation of capacitive element 72i. Accordingly, with the threshold voltage loss of Vth, MOS transistor 72k can transmit a voltage of at maximum 2VDD−2Vth. This voltage level of node ND3 in the configuration in FIG. 17 is different from that in the configuration in FIG. 11.

Figure 18:
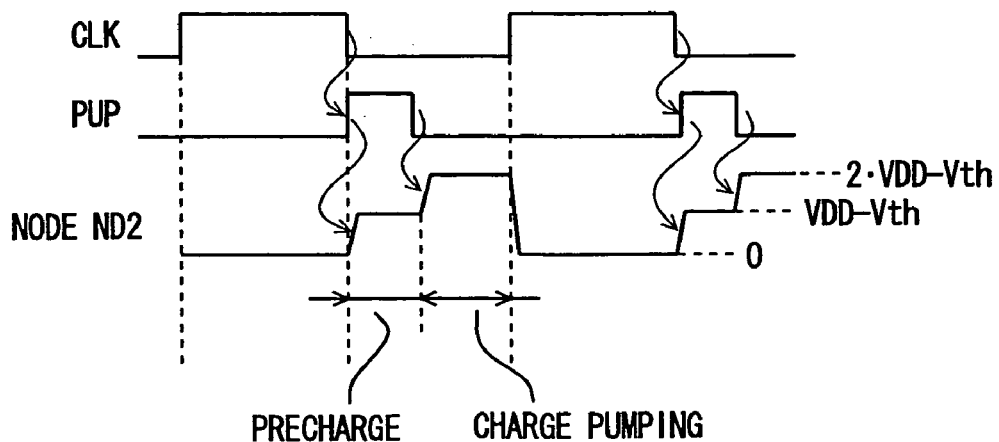
FIG. 18 shows signal waveforms illustrating an operation of the bias generating circuit shown in FIG. 17.

Now, the voltage changes in node ND2 of bias generating circuit 72 shown in FIG. 17 will be described with reference to signal waveforms shown in FIG. 18.

When clock signal CLK is at an H level, the output signal of NOR gate 72p is at an L level. When clock signal CLK is at an H level, MOS transistor 72n is in an on state, and node ND2 is held at a ground voltage level. In this state, MOS transistor 72j is in a non-conductive state, and node ND1 is in a floating state.

When clock signal CLK falls to an L level, one-shot pulse generating circuit 72q generates a one-shot pulse signal PUP. Responsively, MOS transistor 72s is rendered conductive and charges node ND2 to a voltage level of VDD−Vth. While the one-shot pulse PUP is being generated, the output signal of NOR circuit 72p is at an L level, and the charge pumping operation of capacitive element 72e is suspended. When this one-shot pulse PUP attains an L level, MOS transistor 72s is rendered non-conductive, and the precharge operation to node ND2 is completed.

When the one-shot pulse signal PUP falls to an L level, NOR gate 72p outputs a signal of an H level since its input signals are both at an L level. In this state, MOS transistors 72s and 72n are both in a non-conductive state, and node ND2 is in a floating state. Thus, through the charge pumping operation of capacitive element 72e, the voltage level of node ND2 further increases to reach a voltage level of 2VDD−Vth.

MOS transistor 72j is rendered conductive in accordance with this voltage level of node ND2, and is allowed to transmit power supply voltage VDD to node ND1. Accordingly, it is possible to generate power supply voltage VDD as bias voltage VNW in the test operation mode.

In the normal operation mode, node ND1 is precharged to a power supply voltage VDD level by MOS transistor 72j. Thus, node ND1 changes in voltage between a ground voltage level and a voltage 2VDD level in accordance with clock signal CLK. In this case, with the threshold voltage loss of MOS transistor 72k, high voltage Vpp of at maximum 2(VDD−Vth) can be generated.

With the configuration of bias generating circuit 72 shown in FIG. 17, the voltage level of node ND1 might be raised to an unnecessarily high level in the normal operation mode. In this case, in the normal operation mode, an output signal of an AND gate receiving mode designating signal MOD and clock signal CLK will be applied to the gate of MOS transistor 72n and to the input of one-shot pulse generating circuit 72q. Accordingly, even in the normal operation mode, the voltage level of node ND2 is allowed to change between power supply voltage VDD and a ground voltage, and the voltage level of node ND1 is allowed to change between VDD−Vth and 2VDD−Vth.

Accordingly, bias generating circuit 72 shown in FIG. 17 can be utilized to generate a back gate bias voltage of power supply voltage VDD level in a test operation mode. The voltage levels of the back gate and the source node of the MOS transistor of the second buffer can be made equal to each other.

Further, in a normal operation mode, the back gate bias of the P channel MOS transistor in the second output buffer can be made sufficiently deep, to make its parasitic capacitance on an output pad sufficiently small.

Figure 19:
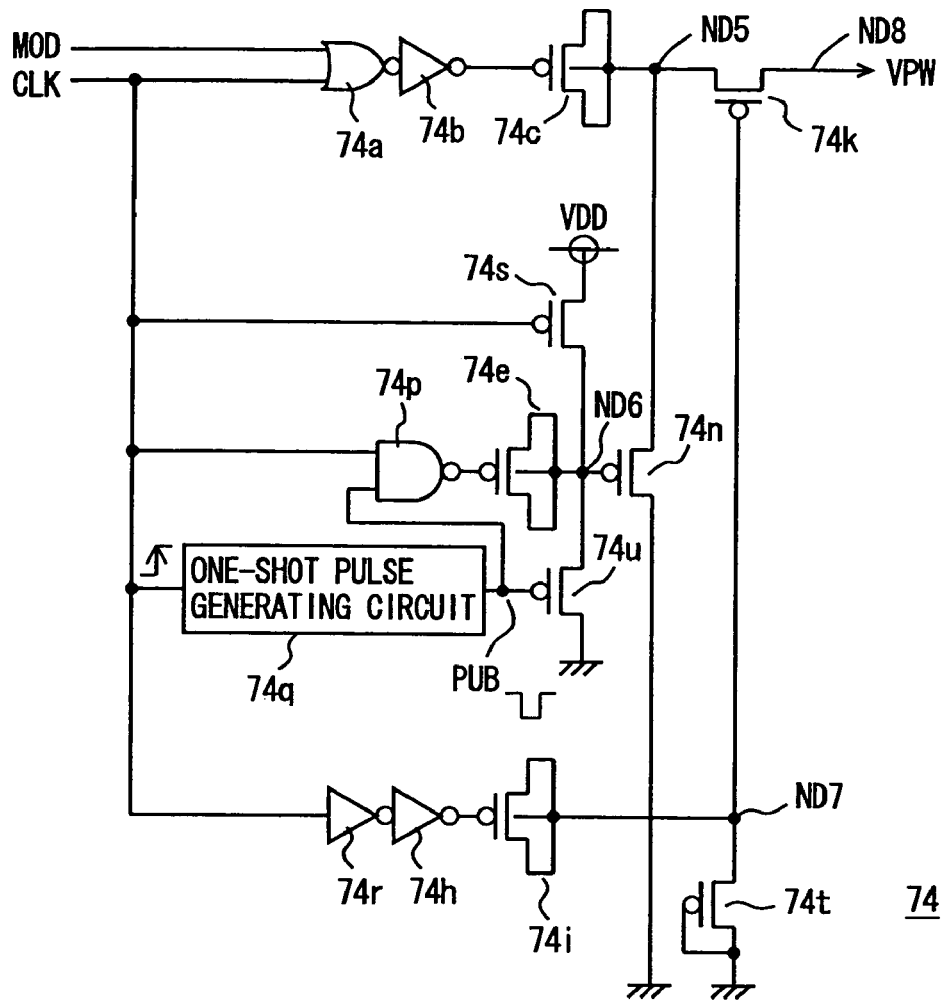
FIG. 19 shows a modification of the bias generating circuit shown in FIG. 14.

FIG. 19 shows a modification of bias generating circuit 74 shown in FIG. 10. In bias generating circuit 74 in FIG. 19, there are arranged with respect to node ND6, a P channel MOS transistor 74s which is rendered conductive when clock signal CLK is at an L level, a one-shot pulse generating circuit 74q which generates a one-shot pulse signal PUB in response to rising of clock signal CLK, and a P channel MOS transistor 74u which is rendered conductive in accordance with the output pulse signal PUB of one-shot pulse generating circuit 74q. MOS transistor 74s transmits power supply voltage VDD to node ND6 when conductive. MOS transistor 74u, when conductive, discharges node ND6 to a voltage level of the absolute value Vthp of its threshold voltage. MOS transistor 74n is selectively rendered conductive in accordance with the voltage level of node ND6 and, when conductive, charges node ND5 to a ground voltage level.

Bias generating circuit 74 further includes a NAND gate 74p which receives the output pulse signal PUB of one-shot pulse generating circuit 74q and clock signal CLK. The output signal of NAND gate 74p is applied to capacitive element 74e. Capacitive element 74e supplies charges to node ND6.

Pulse signal PUB is at an L level when activated, and at an H level when inactivated.

Bias generating circuit 74 further includes a diode-connected P channel MOS transistor 74t which clamps an upper-limit voltage of node ND7 to an absolute value Vthp of its own threshold voltage, cascaded two-stage inverters 74r and 74h which receive clock signal CLK, and a capacitive element 74i which draws charges from node ND7 in accordance with an output signal of inverter 74h.

In the configuration shown in FIG. 19, node ND7 changes in voltage between voltage VDD+Vthp and voltage Vthp.

Figure 20:
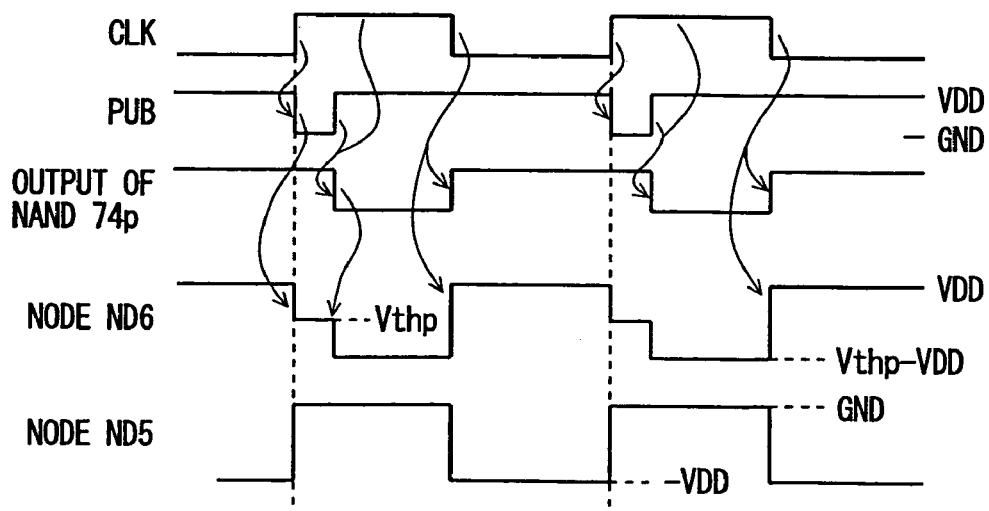
FIG. 20 shows signal waveforms illustrating an operation of the bias generating circuit shown in FIG. 19.

Now, the operation of bias generating circuit 74 shown in FIG. 19 will be described with reference to signal waveforms shown in FIG. 20, focusing on node ND6.

When clock signal CLK is at an L level, MOS transistor 74s is conductive. Node ND6 is precharged to power supply voltage VDD level, and MOS transistor 74n is non-conductive. When mode designating signal MOD is at an L level, charges are drawn from node ND5 through the charge pumping operation of capacitive element 74c in response to falling of clock signal CLK to an L level.

When clock signal CLK rises to an H level, MOS transistor 74s enters a non-conductive state. In response to the rising of clock signal CLK, one-shot pulse generating circuit 74q generates a pulse signal PUB of an L level. In response, MOS transistor 74u enters an on state, and decreases the voltage level of node ND6 to the absolute value Vthp level of its threshold voltage. While the output pulse signal PUB of one-shot pulse generating circuit 74q is in an active state, the output signal of NAND gate 74p is at an H level, the same as in the period when clock signal CLK is at an L level.

When pulse signal PUB is inactivated to an H level, MOS transistor 74u turns non-conductive, and node ND6 becomes floating. Receiving H-level signals at its both inputs, NAND gate 74p outputs a signal of an L level. In response to the falling of the output signal of NAND gate 74p, charges are drawn from node ND6 through the charge pumping operation of capacitive element 74e. The voltage level of node ND6 decreases to a Vthp−VDD level. MOS transistor 74n is rendered conductive in response to the voltage level of node ND6 and discharges node ND5 to a ground voltage level.

At a next rising of clock signal CLK, one-shot pulse generating circuit 74q generates a one-shot pulse signal PUB. MOS transistor 74u is rendered conductive, and discharges node ND6 to a voltage Vthp level. The operations described above are repeated subsequently.

Thus, in a normal operation mode, the voltage level of node ND5 having been precharged to a ground voltage level by MOS transistor 74n decreases to a voltage −VDD level in accordance with falling of clock signal CLK. The voltage level of node ND7 changes between voltage VDD+Vthp and voltage Vthp, which is different from the case of bias generating circuit 74 having the configuration as shown in FIG. 14 above. With the threshold voltage loss of MOS transistor 74k, a voltage of 2Vthp−VDD level can be generated as the bias voltage VPW in a normal operation mode.

In a test operation mode, mode designating signal MOD is set to an H level, and the charge pumping operation of capacitive element 74c is terminated. The voltage levels of nodes ND6 and ND7 change in the same manner as in the normal operation mode. Thus, in the test operation mode, node ND5 is precharged to a ground voltage level by MOS transistor 74n, and MOS transistor 74k receives voltage Vthp−VDD at its gate, so that a voltage of a ground voltage level can be generated as well bias voltage VPW.

With bias generating circuit 74 having a configuration as shown in FIG. 19 as well, node ND5 is discharged to a ground voltage level in the test operation mode. Thus, in the test operation mode, the back gate voltage and source voltage of the N channel MOS transistor of the second output buffer can be made equal to each other.

When the pulse signal PUB from one-shot pulse generating circuit 74q is in an active state, node ND6 has a voltage level of the absolute value Vthp of its threshold voltage, and MOS transistor 74n maintains an off state. When the output pulse signal PUB of one-shot pulse generating circuit 74q is inactivated while clock signal CLK is at an H level, MOS transistor 74n is rendered conductive in response to its gate voltage attaining a negative voltage level, and node ND5 is driven to a ground voltage level.

In the configuration shown in FIG. 19 as well, the negative voltage level of node ND5 is −VDD in the normal operation mode, and node ND5 is driven deeper than the possible minimum negative voltage Vbb level of 2Vthp−VDD. In this case, MOS transistors 74n and 74m may be configured such that they are set to conductive/non-conductive states in accordance with clock signal CLK and pulse signal PUB, respectively, when mode designating signal MOD is at an H level. For such configuration, an inverted signal of mode designating signal MOD and an inverted signal of clock signal CLK are simply supplied to the gate of MOS transistor 74s and an input of one-shot pulse generating circuit 74q. Accordingly, in the normal operation mode, negative voltage Vbb of a necessary voltage level can be generated with the minimum power consumption.

By employing the bias generating circuit as described above, a well bias voltage of an optimal voltage level can be generated in accordance with an operation mode. It is unnecessary to provide separate power supply systems to change the well bias voltages according to the operation mode, and a select circuit for selecting the bias voltages becomes also unnecessary. The layout area can thus be reduced.

Third Configuration of Bias Voltage Generating Portion

Figure 21:
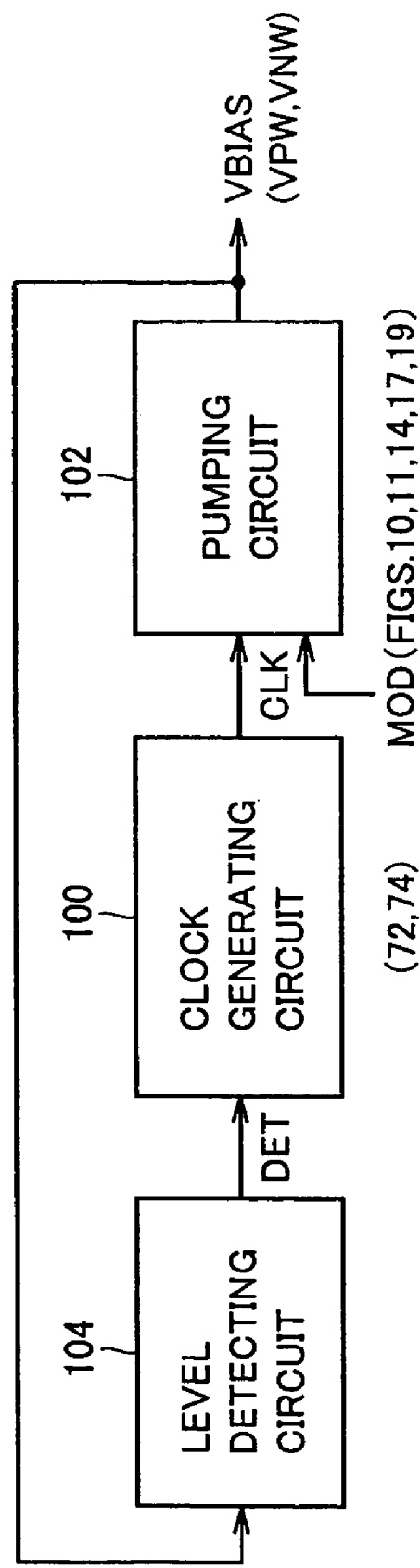
FIG. 21 shows yet another configuration of the bias voltage generating circuit.

FIG. 21 schematically shows yet another configuration of bias generating circuits 72 and 74 shown in FIG. 10. Referring to FIG. 21, the bias generating circuit (72, 74) includes: a clock generating circuit 100 which generates a clock signal CLK when activated; a pumping circuit 102 which performs a pumping operation in accordance with clock signal CLK from clock generating circuit 100, to generate a bias voltage VBIAS; and a level detecting circuit 104 which detects a level of bias voltage VBIAS generated by pumping circuit 102 and generates a detection signal DET indicating the detection result for application to clock generating circuit 100.

Clock generating circuit 100 selectively performs the operation of generating clock signal CLK in accordance with detection signal DET from level detecting circuit 100. Pumping circuit 102 has a configuration identical to those of the circuits shown in FIGS. 10, 11, 14, 17 and 19, for example. Pumping circuit 102 performs the pumping operation in accordance with clock signal CLK from clock generating circuit 100 when mode designating signal MOD is inactive, i.e., in a normal operation mode (after packaging), and sets bias voltage VBIAS to a state deeper in bias (or greater in absolute value) than in a test operation mode.

Bias voltage VBIAS corresponds to bias voltages VPW and VNW. Bias voltage VNW is 1.5 V in a test operation mode, and is set to 2.5 V in a normal operation mode, for example. Bias voltage VPW is at a ground voltage level in the test operation mode and is −1.0 V in the normal operation mode, for example. Power supply voltage VDD applied to the gate of MOS transistor 104c is 1.5 V both in the normal and test operation modes, for example.

Level detecting circuit 104 causes the clock generating operation of clock generating circuit 100 to be stopped in accordance with detection signal DET when bias voltage VBIAS is made deeper in bias than a prescribed voltage level. This prevents unnecessary current consumption, and ensures accurate testing with the back gate bias of output buffer 10 maintained at a prescribed voltage level.

Figure 22:
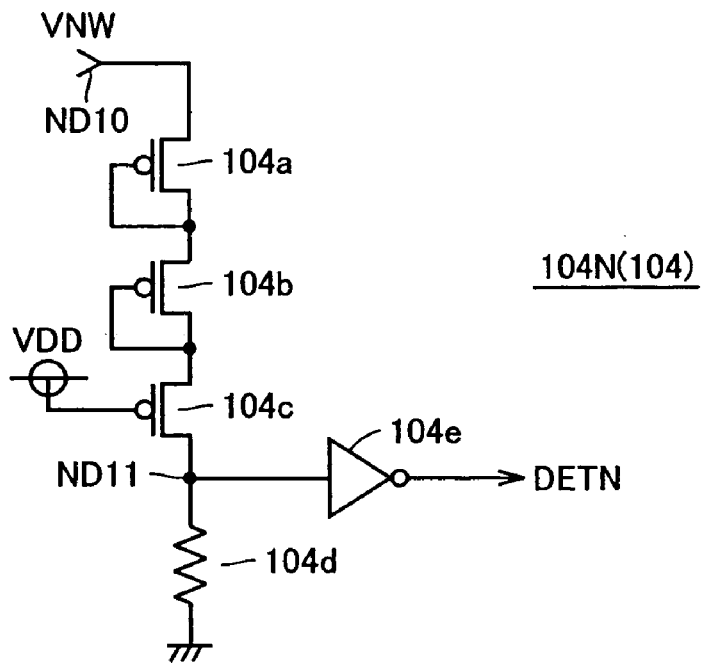
FIG. 22 shows a configuration of a level detector of an N well bias voltage level in the level detecting circuit shown in FIG. 21.

FIG. 22 shows by way of example a configuration of level detecting circuit 104 shown in FIG. 21. The level detecting circuit 104N in FIG. 22 detects the level of bias voltage VNW and generates a detection signal DETN according to the detection result.

Referring to FIG. 22, level detecting circuit 104N includes: P channel MOS transistors 104a–104c which are connected in series between a bias voltage input node ND10 and a node ND11; a resistance element 104d of high resistance which is connected between node ND11 and a ground node; and an inverter 104e which inverts a voltage signal of node ND11 to generate the detection signal DETN.

Each of MOS transistors 104a and 104b has its gate and drain interconnected and operates in a diode mode, and, when conductive, causes voltage drop of the absolute value Vthp of the threshold voltage. MOS transistor 104c has a gate receiving power supply voltage VDD. Inverter 104e receives power supply voltage VDD as its operating power supply voltage, because clock generating circuit 100 and pumping circuit 102 receive output-only power supply voltage VDD supplied to the output circuit as their operating power supply voltages. If clock generating circuit 100 and pumping circuit 102 receive power supply voltage VCC as their operating power supply voltages, however, inverter 104e may receive power supply voltage VCC as its operating power supply voltage.

According to the configuration of level detecting circuit 104 shown in FIG. 22, in the case where bias voltage VNW being applied to bias voltage input node ND10 is at a voltage level of not less than VDD+3Vthp, all MOS transistors 104a–104c are rendered conductive, and the voltage level of node ND11 attains a high level because of voltage drop across the high resistance of resistance element 104d. Detection signal DETN from inverter 104e attains an L level, and the clock generating operation of clock generating circuit 100 is stopped.

On the other hand, when bias voltage VNW is not higher than VDD+3Vthp, the source-gate voltage of MOS transistor 104c becomes not higher than the absolute value Vthp of the threshold voltage. MOS transistor 104c is rendered non-conductive, and a path of the charging current from bias voltage input node ND10 to node ND11 is shut off. Node ND11 is driven to a ground voltage level by resistance element 104d. In response, detection signal DETN from inverter 104e attains an H level, and the clock generating operation of clock generating circuit 10 is started.

Thus, when level detecting circuit 104N shown in FIG. 22 is employed, the voltage level of bias voltage VNW being applied to an N well region is set to the voltage level of VDD+3Vthp.

Figure 23:
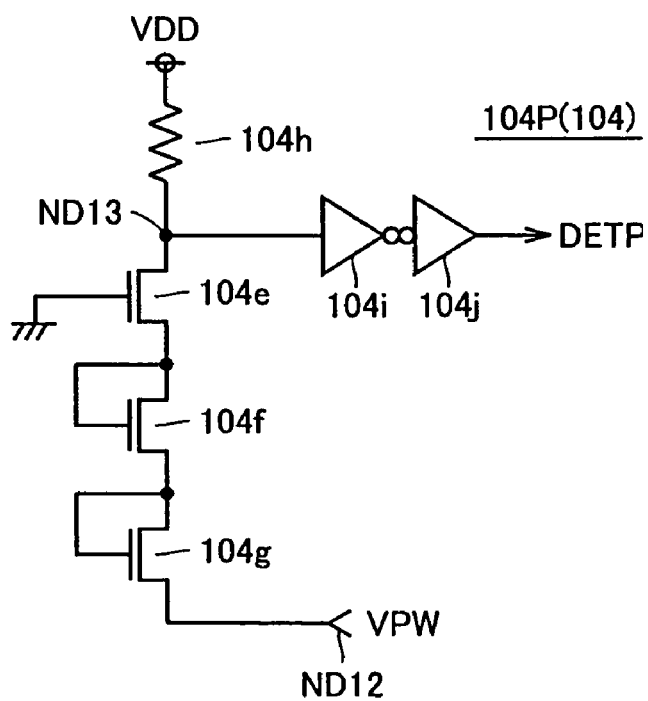
FIG. 23 shows a configuration of a level detector of a P well bias voltage level in the level detecting circuit shown in FIG. 21.

FIG. 23 shows a configuration of level detecting circuit 104 with respect to bias voltage VPW being applied to a P well region. Referring to FIG. 23, the level detecting circuit 104P (104) includes: N channel MOS transistors 104e–104g which are connected in series between a bias voltage input node ND12 and an internal node ND13; a resistance element 104h of high resistance which is connected between a power supply node and an internal node ND13; an inverter 104i which inverts the voltage level of internal node ND13; and an inverter 104j which inverts an output signal of inverter 104i to generate a detection signal DETP. Bias input node ND12 is supplied with bias voltage VPW.

MOS transistor 104e has a gate receiving a ground voltage. Each of MOS transistors 104f and 104g has its gate and drain interconnected and operates in a diode mode to cause voltage drop of a threshold voltage Vthn when conductive. MOS transistor 104e is rendered conductive when its source voltage attains –Vthn. Here, it is assumed that all MOS transistors 104e–104g have the same threshold voltage.

In the configuration of level detecting circuit 104P shown in FIG. 23, the gate-source voltage of MOS transistor 104e becomes not lower than voltage Vthn when bias voltage VPW is not higher than –3Vthn. MOS transistors 104e–104g are rendered conductive, and node ND13 is driven to a negative voltage level. In response, detection signal DETP from inverter 104j attains an L level, and the clock generating operation of the corresponding clock generating circuit is stopped. The pumping operation of pumping circuit 102 generating bias voltage VPW is also stopped.

On the other hand, when bias voltage VPW attains a voltage level of higher than –3Vthn, the gate-source voltage of MOS transistor 104e becomes not higher than threshold voltage Vthn, and MOS transistor 104e is turned off. In response, node ND 13 is pulled up to an H level by resistance element 104h of high resistance, and detection signal DETP from inverter 104j turns H level. The dock signal is generated from clock generating circuit 100, and pumping circuit 102 performs the pumping operation to decrease the voltage level of bias voltage VPW.

Thus, when level detecting circuit 104P shown in FIG. 23 is employed, the voltage level of bias voltage VPW is maintained at the voltage level of –3Vthn.

Figure 24:
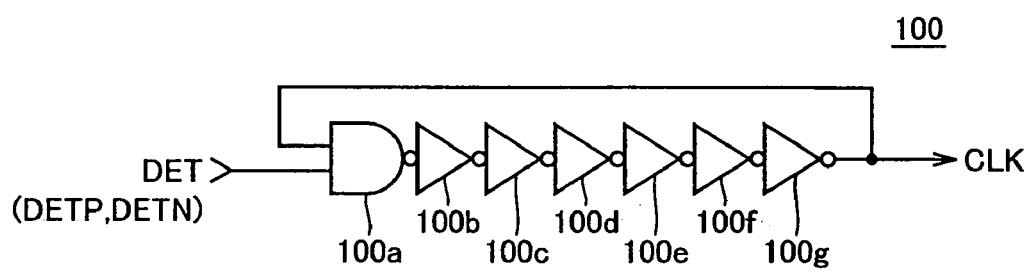
FIG. 24 shows a configuration of the clock generating circuit shown in FIG. 21.

FIG. 24 shows by way of example a configuration of clock generating circuit 100 shown in FIG. 21. Referring to FIG. 24, clock generating circuit 100 includes: a two-input NAND gate 100a which receives detection signal DET and clock signal CLK; and even stages of tandem-connected inverters 100b–100g which receive an output signal of NAND gate 100a. Clock signal CLK is generated from inverter 100g at the last stage.

This detection signal DET corresponds to detection signal DETN shown in FIG. 22 or detection signal DETP shown in FIG. 23.

In the configuration of clock generating circuit 100 shown in FIG. 24, when detection signal DET is at an L level, the output signal of NAND gate 100a is fixed to an H level and, in response, clock signal CLK is fixed to an H level. When detection signal DET is at an H level, NAND gate 100a operates as an inverter, and NAND gate 100a and inverters 100b–100g form a ring oscillator with the inverters of the odd number of stages being connected in a ring shape. Clock generating circuit 100 performs an oscillating operation, and clock signal CLK changes at a prescribed period. The oscillation period of clock signal CLK is determined by the gate delays of NAND gate 100a and inverters 100b–100g.

Thus, in level detecting circuits 104N and 104P shown in FIGS. 22 and 23, respectively, detection signal DET attains an L level when biases of bias voltages VNW and VPW become deep (when the absolute values of the bias voltages become greater than a prescribed voltage level), and the clock generating operation is stopped.

Modification of Clock Generating Circuit

Figure 25:
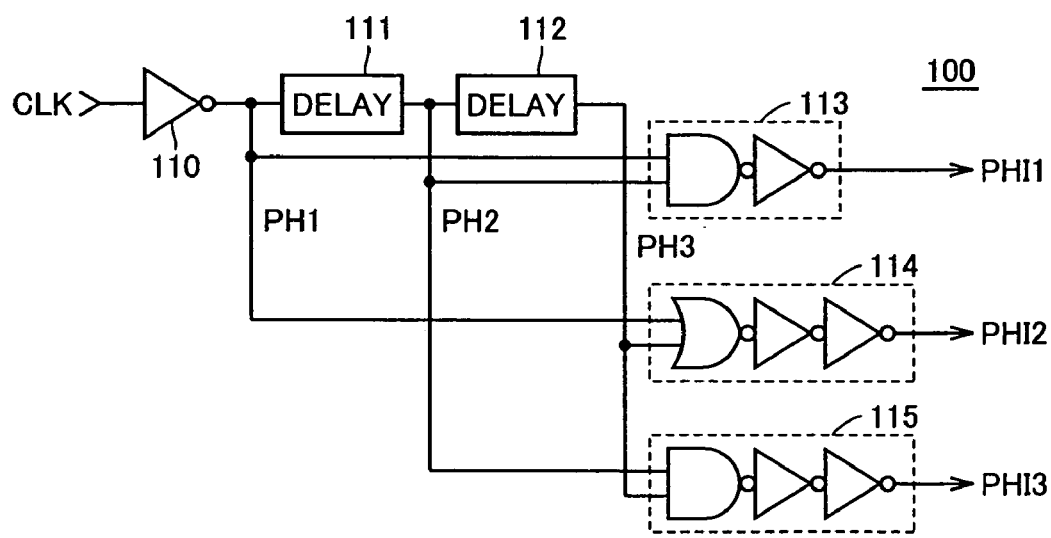
FIG. 25 shows a modification of the clock generating circuit shown in FIG. 21.

FIG. 25 shows a configuration of the modification of clock generating circuit 100 shown in FIG. 21. Referring to FIG. 25, clock generating circuit 100 includes, in addition to the portion for generating clock signal CLK shown in FIG. 24, a pumping control signal generating portion which generates pumping control signals of three phases, PHI1, PHI2 and PHI3, in accordance with clock signal CLK.

Referring to FIG. 25, the pumping control signal generating portion includes: an inverter 110 which inverts clock signal CLK; a delay circuit 111 which delays an output signal PH1 of inverter 110 by a prescribed time; a delay circuit 112 which delays an output signal PH2 of delay circuit 111 by a prescribed time; a NAND circuit 113 which receives output signal PH1 of inverter 110 and an output signal PH3 of delay circuit 112 to generate a pumping control signal PHI1, a NOR circuit 114 which receives output signal PH1 of inverter 110 and output signal PH3 of delay circuit 112 to generate a pumping control signal PHI2; and a NAND circuit 115 which receives output signal PH2 of delay circuit 111 and output signal PH3 of delay circuit 112 to generate a pumping control signal PH3.

NAND circuit 113 includes a NAND gate and cascaded two-stage inverters receiving an output signal of the NAND gate. NOR circuit 114 includes a NOR gate and cascaded two-stage inverters receiving an output signal of the NOR gate. NAND circuit 115 includes a NAND gate and cascaded two-stage inverters receiving an output signal of the NAND gate.

Figure 26:
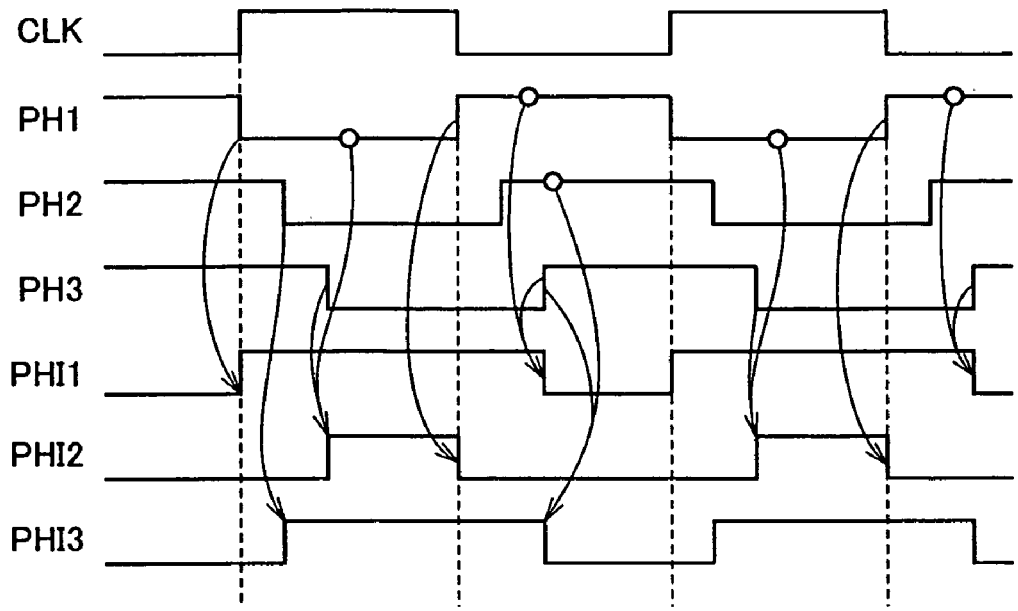
FIG. 26 is a timing chart illustrating an operation of the clock generating circuit shown in FIG. 25.

Now, the operation of the pumping control signal generating portion shown in FIG. 25 will be described with reference to the timing chart in FIG. 26.

Output signal PH1 of inverter 110 is complementary to clock signal CLK. Output signal PH2 of delay circuit 111 has a prescribed time of delay with respect to output signal PH1 of inverter 110. Output signal PH3 of delay circuit 112 is delayed by a prescribed time with respect to output signal PH2 of delay circuit 111.

NAND circuit 113 sets pumping control signal PHI1 to an L level when the signals PH1 and PH3 are both at an H level. Thus, pumping control signal PHI1 rises to an H level in response to falling of output signal PH1 of inverter 110, and falls to an L level in response to rising of output signal PH3 of delay circuit 112.

NOR circuit 114 sets pumping control signal PHI2 to an H level when the signals PH1 and PH3 are both at an L level. Thus, pumping control signal PHI2 rises to an H level in response to falling of output signal PH3 of delay circuit 112, and falls to an L level in response to rising of output signal PH1 of inverter 110.

NAND circuit 115 sets pumping control signal PHI3 to an L level when the signals PH2 and PH3 are both at an H level. Thus, pumping control signal PHI3 rises to an H level in response to falling of output signal PH2 of delay circuit 111 and falls to an L level in response to rising of output signal PH3 of delay circuit 112.

These pumping control signals PHI1–PHI3 of three phases are employed to control the charge pumping operation of pumping circuit 102.

Figure 27:
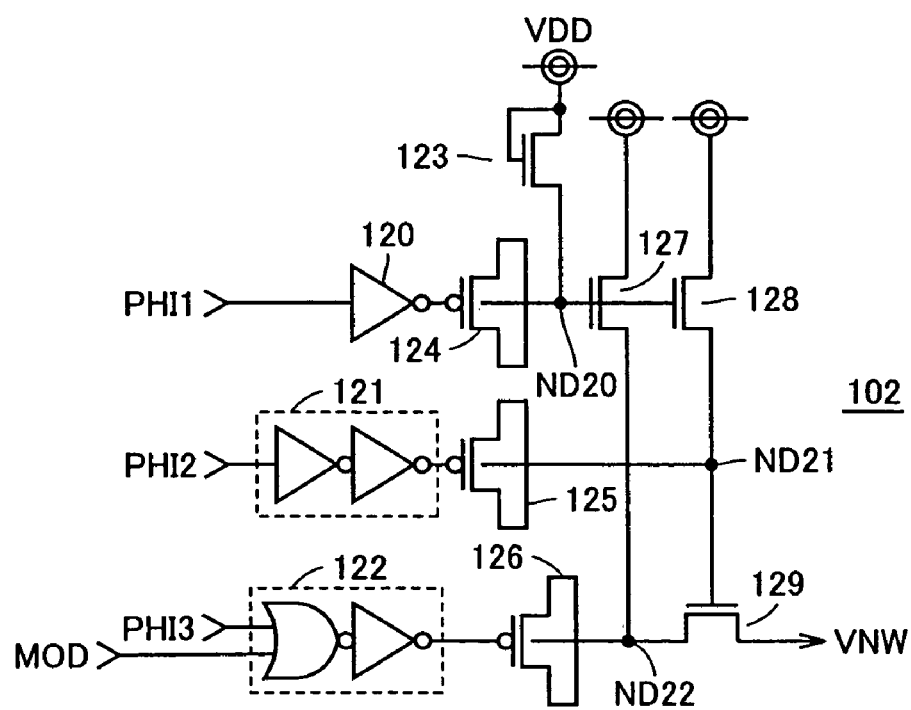
FIG. 27 shows by way of example a configuration of the pumping circuit shown in FIG. 21.

FIG. 27 shows by way of example a configuration of the pumping circuit performing the charge pumping operation in accordance with pumping control signals PHI1 to PHI3 shown in FIG. 25. Specifically, the configuration of the pumping circuit generating bias voltage VNW which is set to a high voltage Vpp level in a normal operation mode is shown in FIG. 27.

Referring to FIG. 27, the pumping circuit 102 includes: an inverter 120 which receives pumping control signal PHI1; a buffer circuit 121 which is formed of cascaded two-stage inverters which receive pumping control signal PHI2; an OR circuit 122 which receives pumping control signal PHI3 and a mode designating signal MOD; a MOS capacitor 124 which sets a voltage level of a node ND20 through its pumping operation (capacitive coupling) in accordance with an output signal of inverter 120; a MOS capacitor 125 which sets a voltage level of a node ND21 through a pumping operation in accordance with an output signal of buffer circuit 121; a MOS capacitor 126 which sets a voltage level of a node ND22 through a pumping operation in accordance with an output signal of NOR circuit 122; a diode-connected N channel MOS transistor 123 which precharges node ND20 to a voltage level of VDD–Vthn; an N channel MOS transistor 127 which is selectively rendered conductive in accordance with a voltage level of node ND20 and precharges node ND22 to a power supply voltage VDD level when conductive; an N channel MOS transistor 128 which is selectively rendered conductive in accordance with a voltage level of node ND20 and precharges node ND21 to a voltage VDD level when conductive; and an N channel MOS transistor 129 which is selectively rendered conductive in accordance with a voltage level of node ND21 and transmits charges of node ND22 to an output node to generate bias voltage VNW when conductive.

Each of MOS capacitors 124–126 is formed of a P channel MOS transistor.

The configuration of pumping circuit 102 shown in FIG. 27 is equivalent to the configuration of the pumping circuit shown in FIG. 11, with the pumping control signals PHI1–PHI3 of three phases replacing clock signal CLK of single phase.

Figure 28:
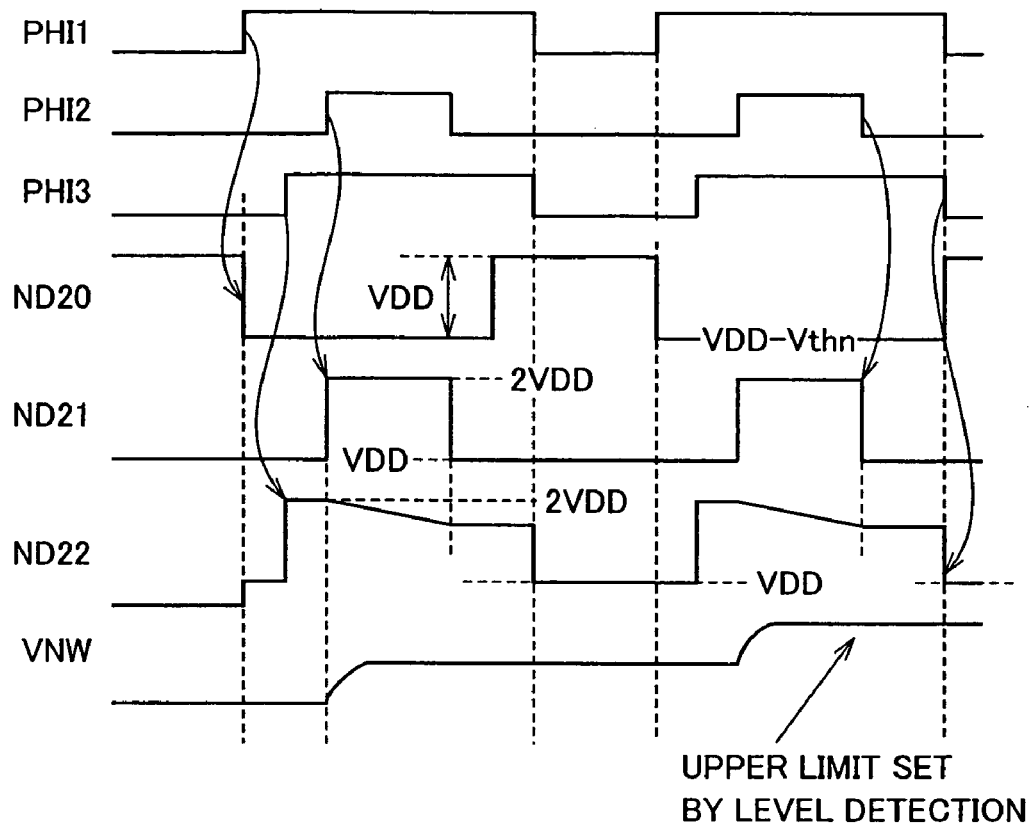
FIG. 28 is a timing chart illustrating an operation of the pumping circuit shown in FIG. 27.

Now, the operation of the pumping circuit shown in FIG. 27 will be described with reference to the timing chart in FIG. 28.

In a normal operation mode, mode designating signal MOD is maintained at an L level. Node ND20 has its lower limit clamped at a voltage VDD–Vthn level by MOS transistor 123.

When pumping control signal PHI1 rises to an H level, the output signal of inverter 120 falls to an L level, and the voltage level of node ND20 decreases through capacitive coupling (pumping operation) of MOS capacitor 124. The voltage level of node ND20 is clamped at the voltage VDD–Vthn level by MOS transistor 123 and, in response, MOS transistors 127 and 128 are rendered non-conductive. Nodes ND22 and ND21 are isolated from a power supply node, and the precharging operation of nodes ND22 and ND21 to a power supply voltage VDD level is completed.

Next, pumping control signal PHI3 rises to an H level. With mode designating signal MOD set to an L level, the output signal of OR circuit 122 rises to an H level. In response, the voltage level of node ND22 further increases by the voltage VDD from the precharged voltage VDD level through the pumping operation of MOS capacitor 126, and set to a voltage level of 2VDD. Since the voltage level, VDD–Vthn, of node ND20 is lower than the voltage level, 2VDD, of node ND22, MOS transistor 127 keeps the non-conductive state.

Pumping control signal PHI2 then rises to an H level, and the output signal of buffer circuit 121 attains an H level. The voltage level of node ND21 increases to a voltage level of 2VDD through capacitive coupling (pumping operation) of MOS capacitor 125, and in response, MOS transistor 129 is rendered conductive. In this case, the voltage 2VDD level of node ND21 is higher than the voltage level of node ND20, so that MOS transistor 128 keeps the non-conductive state, like MOS transistor 127.

MOS transistor 129 is rendered conductive when bias voltage VNW is lower by at least Vthn than the voltage 2VDD of node ND22, to supply positive charges from node ND22 to an output node to increase the voltage level of bias voltage VNW. In practice, level detecting circuit 104 shown in FIG. 22 sets an upper-limit voltage level of bias voltage VNW (e.g., to VDD+3Vthn).

When pumping control signal PHI2 falls to an L level, the voltage level of node ND21 decreases to a power supply voltage VDD level, and MOS transistor 129 attains a non-conductive state (if bias voltage VNW is higher than power supply voltage VDD). The operation of supplying the positive charges is thus completed.

Next, pumping control signal PHI1 falls from an H level to an L level, and the output signal of inverter 120 turns H level. The voltage level of node ND20 increases from the clamped voltage VDD–Vthn level of MOS transistor 123 to a voltage 2VDD level. When the voltage level of node ND21 decreases to a power supply voltage VDD level in response to the falling of pumping control signal PHI2, MOS transistor 128 is turned on, and node ND21 is precharged again to a power supply voltage VDD level.

Pumping control signal PHI3 falls to an L level substantially at the same timing of the falling of pumping control signal PHI1, and the voltage level of node ND22 decreases from the charged voltage level. MOS transistor 127, however, is rendered conductive by precharging of node ND20, and node ND22 is precharged to a power supply voltage VDD level.

Thereafter, the above-described precharging operation and the positive charge supplying operation are performed repeatedly. The pumping operations of MOS capacitors 124–126 are carried out in accordance with pumping control signals PHI1, PHI2 and PHI3 of three phases, and bias voltage VNW is maintained at a voltage level set by the level detecting circuit.

Such use of pumping control signals PHI1-PHI3 of three phases makes it possible to alternately carry out the internal node precharging operation and the charge pumping operation. Leakage of charges to a power supply node and other is prevented reliably, and all charges supplied to node ND22 can be utilized for generation of bias voltage VNW, so that pumping efficiency is improved.

When mode designating signal MOD is set to an H level, the output signal of OR circuit 122 attains an H level, and node ND22 is set to a power supply voltage VDD level via MOS transistor 127 in accordance with pumping control signal PHI1. Since node ND21 changes in voltage between power supply voltage VDD and voltage 2VDD in accordance with pumping control signal PHI2, MOS transistor 129 is reliably rendered conductive and transmits the voltage of node ND22 to the output node. Accordingly, bias voltage VNW is maintained at the power supply voltage VDD level in a test operation mode.

Back-flow of charges from node ND22 or from the output node of bias voltage VNW is prevented by employing the pumping circuit shown in FIG. 27 and utilizing the pumping control signals of three phases, and thus, bias voltage VNW is generated efficiently through the pumping operation.

Figure 29:
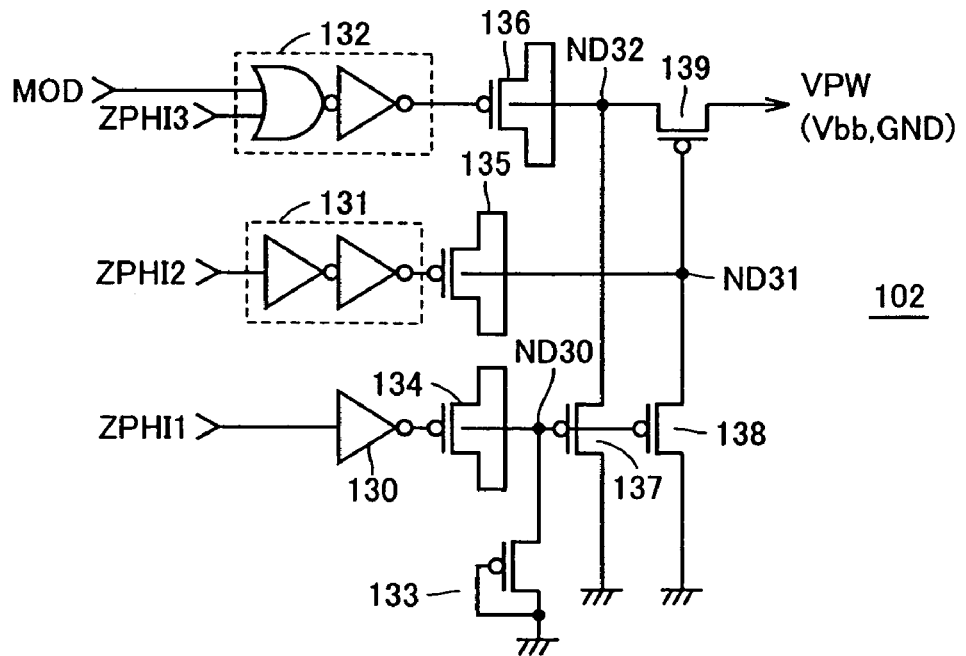
FIG. 29 shows a configuration of a P well bias voltage generating portion of the pumping circuit shown in FIG. 21.

FIG. 29 shows by way of example a configuration of the pumping circuit 102 generating bias voltage VPW. Inverse signals ZPHI1, ZPHI2 and ZPHI3 of pumping control signals PHI1–PHI3 shown in FIG. 25 are supplied to the pumping circuit 102 as pumping control signals. Pumping control signals ZPHI1–ZPHI3 can be generated from pumping control signals PHI1–PHI3, simply employing inverters.

Referring to FIG. 29, the pumping circuit 102 includes: an inverter 130 which receives the complementary pumping control signal ZPHI1; a buffer circuit 131 which receives the complementary pumping control signal ZPHI2; an OR circuit 132 which receives mode designating signal MOD and the complementary pumping control signal ZPHI3; a MOS capacitor 134 which sets a potential level of a node ND30 through a pumping operation in accordance with an output signal of inverter 130; a MOS capacitor 135 which supplies charges to a node ND31 through a pumping operation in accordance with an output signal of buffer circuit 131; a MOS capacitor 136 which supplies charges to a node ND32 through a pumping operation in accordance with an output signal of OR circuit 132; a P channel MOS transistor 133 which clamps an upper-limit voltage level of node ND30 to an absolute value Vthp level of the threshold voltage; a P channel MOS transistor 137 which is selectively rendered conductive in accordance with a voltage level of node ND30 and, when conductive, precharges node ND32 to a ground voltage level; a P channel MOS transistor 138 which is selectively rendered conductive in accordance with a voltage level of node ND30 and, when conductive, precharges node ND31 to a ground voltage level; and a P channel MOS transistor 139 which is selectively rendered conductive in accordance with a voltage level of node ND31 and, when conductive, transmits positive charges from the output node to node ND32.

The configuration of pumping circuit 102 shown in FIG. 29 is identical to that of the pumping circuit generating bias voltage VNW shown in FIG. 27, except that the polarities of MOS transistors and power supplies are all inverted. Thus, the pumping circuit in FIG. 29 carries out the pumping operation similar to that of the pumping circuit in FIG. 27.

Figure 30:
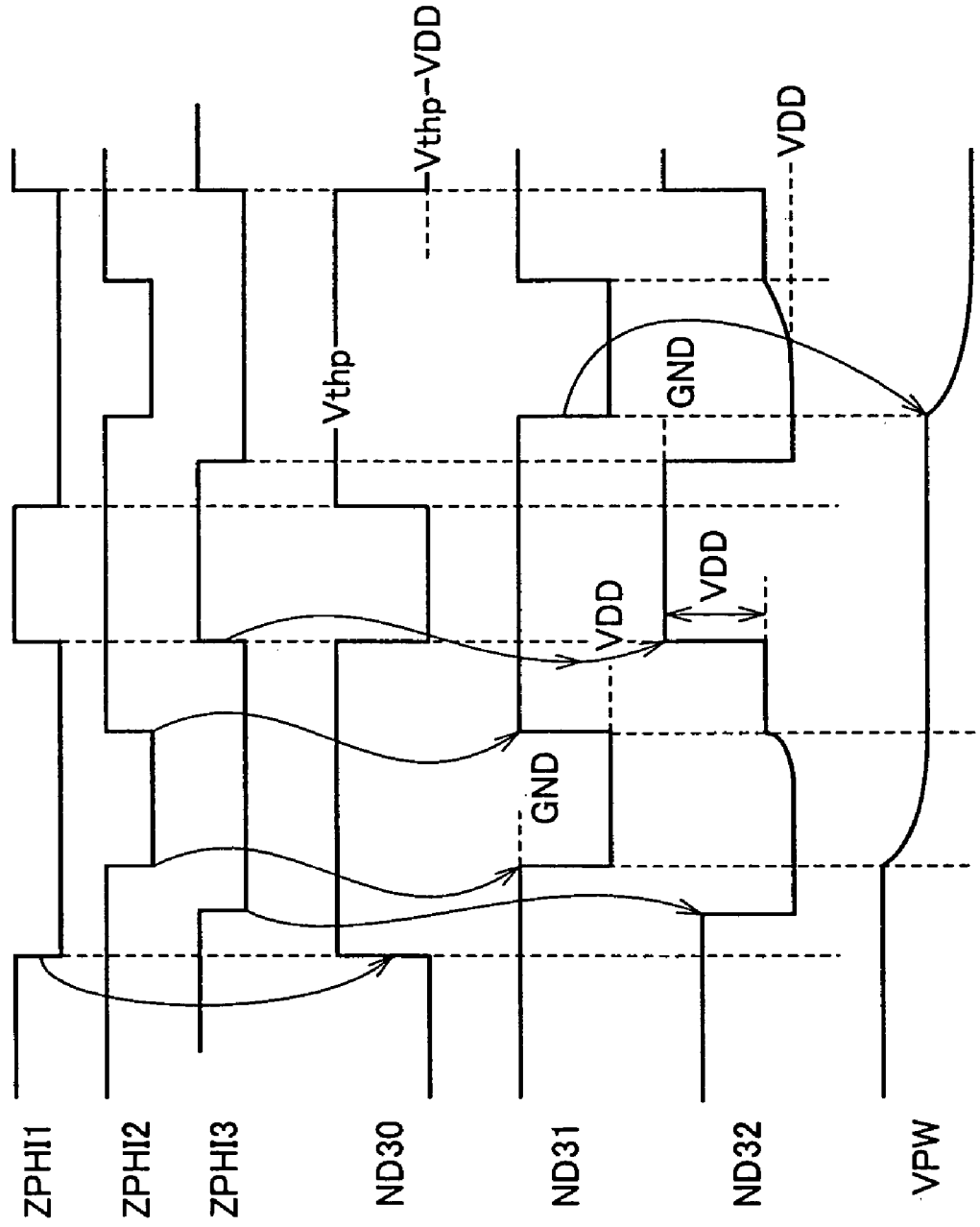
FIG. 30 is a timing chart illustrating an operation of the pumping circuit shown in FIG. 29.

Now, the operation of the pumping circuit 102 shown in FIG. 29 will be described with reference to the timing chart shown in FIG. 30.

It is now assumed that mode designating signal MOD is set to an L level designating a normal operation mode.

When pumping control signal ZPHI1 falls to an L level, the output signal of inverter 130 rises, and the voltage level of node ND30 increases through the pumping operation of the MOS capacitor. MOS transistor 133 is rendered conductive in response to the increase in voltage of node ND30, and the voltage level of node ND30 is clamped at a voltage Vthp level by MOS transistor 133.

When complementary pumping control signal ZPHI1 rises to an H level, the output signal of inverter 130 becomes an L level, and MOS capacitor 134 decreases the voltage level of node ND30. Thus, the voltage level of node ND30 decreases to a voltage level of Vthp−VDD in response to the rising of complementary pumping control signal ZPHI1. Correspondingly, MOS transistors 137 and 138 are rendered conductive, and respective nodes ND32 and Nd31 are precharged to a ground voltage level.

When the precharging operation by complementary pumping control signal ZPHI1 is completed, complementary pumping control signal ZPHI1 falls to an L level, and the output signal of inverter 130 rises to an H level. In response, the voltage of node ND30 increases, and MOS transistors 137 and 138 are rendered non-conductive.

Next, complementary pumping control signal ZPHI3 falls to an L level, and the output signal of OR circuit 132 turns L level (with mode signal MOD set to an L level). In response, the voltage level of node ND32 decreases from a ground voltage GND level to a −VDD level through the pumping operation of MOS capacitor 136. In this state, when the voltage level of node ND32 decreases to −VDD, the voltage level of node ND30 is Vthp, and MOS transistor 137 maintains the non-conductive state. Node ND32 is isolated from the ground node, and node ND32 is maintained at a negative voltage −VDD level.

Next, complementary pumping control signal ZPHI2 falls to an L level, and the output signal of buffer circuit 131 attains an L level. Node ND31 decreases to a voltage level of −VDD through the pumping operation of MOS capacitor 135. MOS transistor 139 is rendered conductive in accordance with the decrease of the voltage level of node ND31, and causes the voltage level of bias voltage VPW to decrease in accordance with the voltage −VDD of node ND32.

In this case, the lowest reachable voltage of bias voltage VPW becomes a voltage Vthp−VDD level when the absolute value of the threshold voltage of MOS transistor 139 is Vthp.

When complementary pumping control signal ZPHI2 rises to an H level, the voltage at node ND31 increases to a ground voltage level, and MOS transistor 139 is rendered non-conductive. Transfer of charges from bias voltage VPW output node to node ND32 is stopped.

Next, complementary pumping control signal ZPHI1 rises to an H level, and the output signal of inverter 130 attains an L level. Node ND30 is driven again to a negative voltage level. MOS transistors 137 and 138 are rendered conductive, and nodes ND32 and ND31 are precharged to a ground voltage level.

Complementary pumping control signal ZPHI3 rises to an H level substantially at the same timing as the rising of complementary pumping control signal ZPHI1. The voltage level of node ND32 increases as positive charges are supplied thereto, and node ND32 is maintained at a ground voltage level by MOS transistor 137.

The above operations are repeated subsequently. Negative charges are supplied from node ND32 to the output node, and the voltage level of bias voltage VPW decreases. The voltage level of bias voltage VPW is maintained at a prescribed voltage level by the level detecting circuit shown in FIG. 23.

Thus, using the pumping circuit shown in FIG. 29 as well, the precharging operation and pumping operation of node ND32 can be carried out alternately. Negative charges can be transmitted efficiently from node ND32 to the output node to decrease the voltage level of bias voltage VPW.

When mode designating signal MOD is set to an H level, the output signal of OR circuit 132 attains an H level, and the pumping operation of MOS capacitor 136 is terminated. In this case, MOS transistors 137 and 138 set node ND32 to a ground voltage level in accordance with complementary pumping control signals ZPHI1 and ZPHI2, and node ND31 changes between voltage −VDD and a ground voltage. Bias voltage VPW is maintained at a ground voltage GND level by MOS transistor 139.

Accordingly, it is possible to internally generate well bias voltages VPW and VNW using the pumping circuits, and set the voltage levels of these bias voltages VPW and VNW to desired voltage levels using the level detecting circuit. The output capacitance of the output buffer circuit for testing after assembly into SIP can be made sufficiently small (i.e., the PN junction capacitance of the output transistor can be reduced sufficiently).

Further, by making the well bias of the output transistor for this testing output buffer sufficiently deep after assembly into SIP, the leakage current (sub-threshold current) of the associated testing output buffer can be decreased (since the absolute value of the threshold voltage increases as the well bias becomes deeper).

Second Configuration of Level Detecting Circuit

Figure 31:
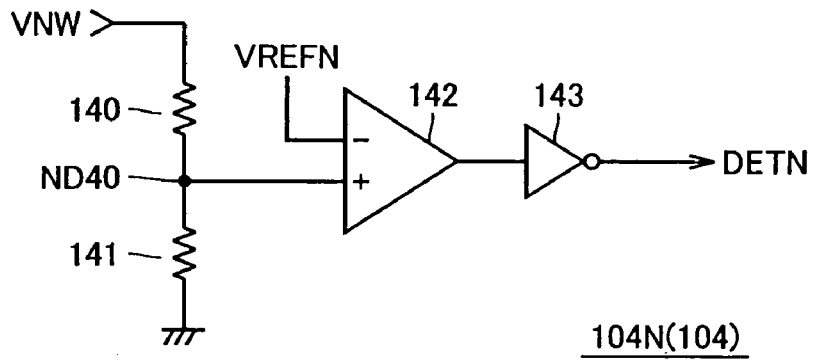
FIGS. 31–33 show modifications of the level detecting circuit shown in FIG. 21.

FIG. 31 shows another configuration of level detecting circuit 104 shown in FIG. 21. In FIG. 31, the configuration of the level detecting circuit 104N detecting the level of bias voltage VNW is shown. Referring to FIG. 31, the level detecting circuit 104N includes: resistance elements 140 and 141 of high resistance which are connected in series between a bias voltage input node and a ground node; a comparison circuit 142 which compares a reference voltage VREFN and a voltage level of node ND40; and an inverter buffer 143 which inverts an output signal of comparison circuit 142 to generate a detection signal DETN.

Resistance elements 140 and 141 generate at node ND40 a resistance-divided voltage of bias voltage VNW by their resistance values. With resistance elements 140 and 141 having sufficiently large resistance values, current consumption in this voltage-dividing circuit is made sufficiently small. Resistance-connected MOS transistors of sufficiently small sizes may be employed for resistance elements 140 and 141. In such a case, bias voltage VNW is divided by their channel resistances.

Comparison circuit 142 outputs a signal of high level when the voltage level of node ND40 is higher than reference voltage VREFN, and outputs a signal of low level when the voltage level of node ND40 is lower than reference voltage VREFN.

Inverter buffer 143 buffers the (analog) output signal of comparison circuit 142 and sets the (digital) detection signal DETN to an H level or an L level.

When the level detecting circuit 104N shown in FIG. 31 is utilized, resistance elements 140 and 141 can generate a voltage lower than power supply voltage VDD on node ND40 as a comparison voltage. The voltage level of bias voltage VNW when this level detecting circuit in FIG. 31 is employed is expressed by the following equation, with the resistance values of resistance elements 140 and 141 being represented as R140 and R141, respectively.

$$VNW = VREFN(R140 + R141)/R141$$

Utilization of comparison circuit 142 makes it possible to accurately detect the voltage level of bias voltage VNW and generate detection signal DETN. In addition, the voltage-dividing circuit allows comparison circuit 142 to operate in its most sensitive region. Thus, the voltage level of bias voltage VNW can be set accurately to a desired voltage level.

Figure 32:
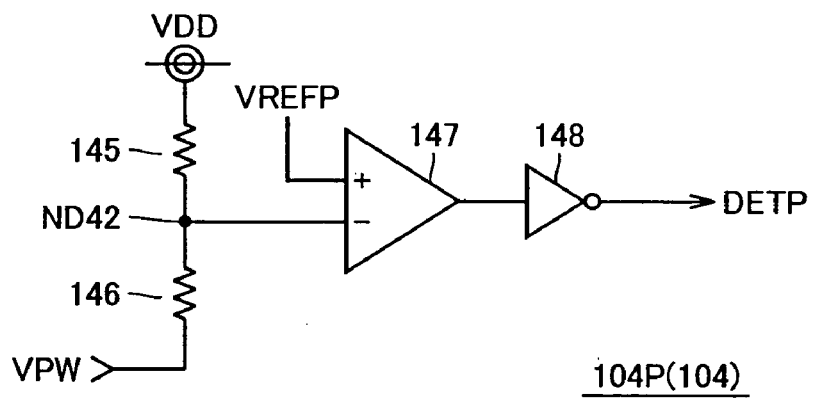

FIG. 32 shows a configuration of the level detecting circuit 104P detecting the level of bias voltage VPW as the level detecting circuit 104 shown in FIG. 21.

Referring to FIG. 32, the level detecting circuit 104P includes: resistance elements 145 and 146 which are connected in series between a power supply node and a bias voltage input node; a comparison circuit 147 which compares a voltage on node ND42 and a reference voltage VREFP; and an inverter buffer 148 which buffers an output signal of comparison circuit 147 and generates a detection signal DETP.

The voltage appearing on node ND42 is a resistance-divided voltage of voltage VDD−VPW by resistance elements 145 and 146.

Comparison circuit 147 outputs a signal of high level when the voltage level of node ND42 is lower than reference voltage VREFP, and outputs a signal of low level when the voltage of node ND42 is higher than reference voltage VREFP.

Inverter buffer 148 buffers an (analog) output signal of this comparison circuit 147 and generates a binary detection signal DETP.

Thus, level detecting circuit 104P shown in FIG. 32 sets bias voltage VPW to a voltage level expressed by the following equation.

$$VPW = VDD - VREFP(R145 + R146)/R146,$$

where R145 and R146 represent resistance values of resistance elements 145 and 146, respectively.

Therefore, a voltage higher than a ground voltage level can be generated at node ND42 by resistive division by resistance elements 145 and 146, and the comparison operation can be carried out accurately at the most sensitive region of comparison circuit 147. Thus, the voltage level of bias voltage VPW can be set accurately to a desired voltage level.

Resistance elements 145 and 146 may be configured with resistance-connected MOS transistors. Current consumption of this voltage-dividing circuit can be decreased by adjusting the sizes of the MOS transistors to sufficiently decrease their current driving capabilities.

As described above, in this bias generating circuit, the pumping operation of the pumping circuit is selectively activated in accordance with the output signal of the level detecting circuit. The bias voltage is prevented from being set to an unnecessarily deep bias state, so that the current consumption is decreased. In particular, since the reference voltage and a divided voltage of the bias voltage are compared with each other, the comparison operation is performed in the most sensitive region of the comparison circuit, which ensures accurate level detection of the bias voltage.

Further, the bias voltage can be set accurately to a desired voltage level, and the output capacitance of the testing output buffer can be made sufficiently small.

Still further, the leakage current of the testing output buffer when assembled into SIP is decreased.

Third Configuration of Level Detecting Circuit

Figure 33:
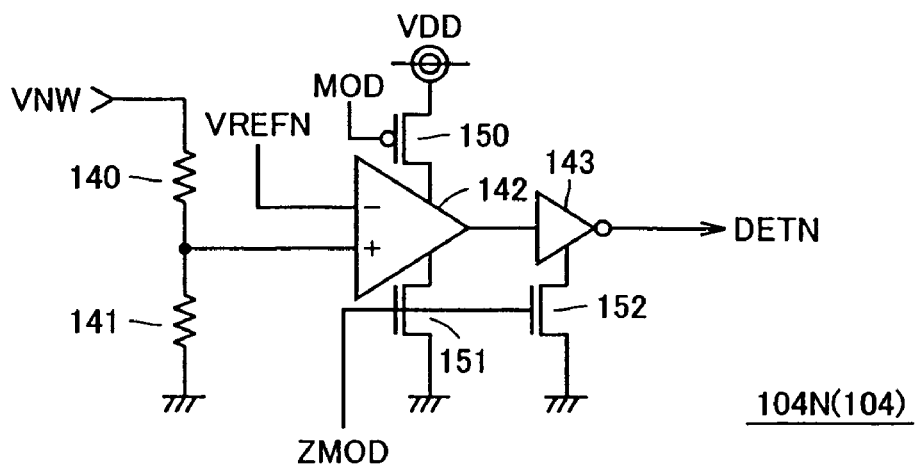

FIG. 33 shows a third modification of level detecting circuit 104 shown in FIG. 21. The configuration of a detecting circuit 140N detecting a level of bias voltage VNW is shown in FIG. 33. Level detecting circuit 140N shown in FIG. 33 differs from level detecting circuit 104N shown in FIG. 31, in that current source transistors 150 and 151 are additionally provided for comparison circuit 142, and a current source transistor 152 is additionally provided for inverter buffer 143.

Current source transistor 150, when conductive, supplies an operating current from a power supply node to comparison circuit 142. Current source transistor 151, when conductive, discharges a current from comparison circuit 142 to a ground node. Current source transistor 152, when conductive, discharges the operating current of inverter buffer 143 to a ground node.

Current source transistor 150 is formed of a P channel MOS transistor having a gate receiving mode designating signal MOD. Current source transistors 151 and 152 are each formed of an N channel MOS transistor having a gate receiving a complementary mode designating signal ZMOD.

For other configuration, level detecting circuit 140N shown in FIG. 33 is identical to the level detecting circuit shown in FIG. 31, and thus, the corresponding portions are denoted by the same reference numerals and detailed description thereof is not repeated.

In a test operation mode, mode designating signal MOD is set to an H level and complementary mode designating signal ZMOD is set to an L level. In this state, bias voltage VNW is at a power supply voltage VDD level and the pumping operation is not performed. In this test operation mode, current source transistors 150, 151 and 152 are all rendered non-conductive, and the paths of the operating currents of comparison circuit 142 and inverter buffer 143 are cut off. Accordingly, the current consumed by the level detecting circuit in the test operation mode can be reduced. Such a decrease of the current consumption makes it possible to accurately test the consumed current at the stand-by, operating current and others of the semiconductor circuit device where it is a semiconductor memory device.

In the configuration of level detecting circuit 104N shown in FIG. 33, inverter buffer 143 and current source transistor 152 can be replaced with a NOR circuit receiving mode designating signal MOD and the output signal of comparison circuit 142. In this case, detection signal DETN can be prevented from turning high impedance state, to be fixed to an L level reliably. Accordingly, malfunction due to the detection signal DETN of a floating state is avoided.

Further, a P channel MOS transistor selectively rendered conductive in response to mode designating signal ZMOD may be provided to the output node of comparison circuit 142 so that the comparison circuit 142 can outputs a signal of an H level when inactivated. In this case, current source transistor 152 cutting off the discharging path needs not be provided to inverter buffer 143. Detection signal DETN can be fixed to an L level in response to the H level output signal of the comparison circuit 142. Alternatively, a current source transistor may be arranged to inverter buffer 153 on the power supply node side. This ensures that detection signal DETN is fixed to an L level.

Figure 34:
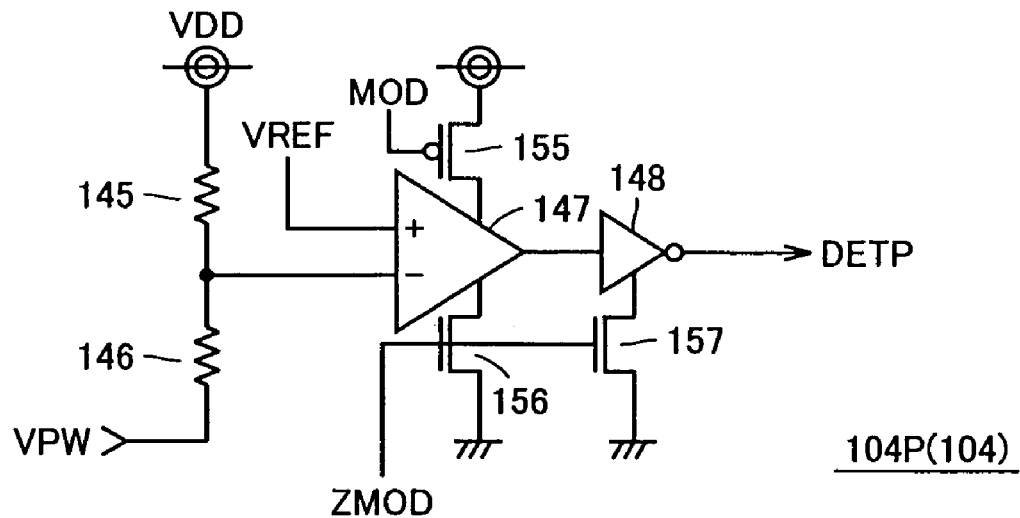
FIGS. 34–38 show other configurations of the level detecting circuit shown in FIG. 21.

FIG. 34 shows a configuration of level detecting circuit 104P detecting a level of bias voltage VPW. Level detecting circuit 104P shown in FIG. 34 has the same configuration as the level detecting circuit in FIG. 32 except that current source transistors 155 and 156 are provided to comparison circuit 147 and a current source transistor 157 is provided to inverter buffer 148.

Current source transistor 155 is formed of a P channel MOS transistor having a gate receiving mode designating signal MOS. Current source transistors 156 and 157 are each formed of an N channel MOS transistor having a gate receiving complementary mode designating signal ZMOD.

Thus, with the level detecting circuit 104P detecting a level of bias voltage VPW shown in FIG. 34 as well, current source transistors 155 to 157 are all turned off in the test mode, and current consumption by comparison circuit 147 and inverter buffer 148 can be reduced.

In level detecting circuit 104N shown in FIG. 33, an N channel MOS transistor selectively rendered conductive in accordance with mode designating signal ZMOD may be connected between a ground node and resistance element 141. In this case, the path through which a current flows from the input node of bias voltage VNW (of power supply voltage VDD level) to a ground node can be cut off in the test mode, so that current consumption is further reduced.

Similarly, in level detecting circuit 104P shown in FIG. 34, a P channel MOS transistor selectively rendered conductive in accordance with mode designating signal MOD may be connected between a power supply node and resistance element 145. In this case as well, the current path between the power supply node and the input node of bias voltage VPW set to a ground voltage level can be shut off in the test mode, and thus, the current consumed by the level detecting circuit is reduced.

Fourth Configuration of Level Detecting Circuit

Figure 35:
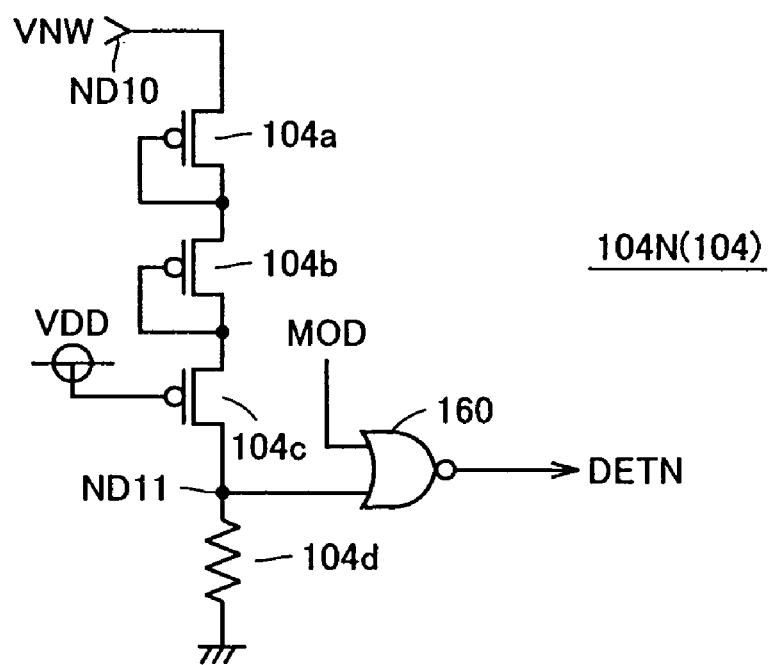

FIG. 35 shows a fourth configuration of the level detecting circuit shown in FIG. 2. The configuration of the level detecting circuit 104N shown in FIG. 35 differs from the configuration of the level detecting circuit in FIG. 22 in that inverter 104e shown in FIG. 22 is replaced with a NOR circuit 160 which receives mode designating signal MOD and the voltage of node ND11 and generates detection signal DETN. The other configuration of the level detecting circuit shown in FIG. 35 is identical to that of the level detecting circuit 104N shown in FIG. 22, and thus, the corresponding portions are denoted by the same reference characters, and detailed description thereof is not repeated.

In the configuration of level detecting circuit 104N shown in FIG. 35, detection signal DETN is fixed to an L level when mode designating signal MOD is at an H level, and the clock circuit in the next stage is inactivated. Thus, in the test operation mode, generation of the clock signal for controlling the pumping operation in the next stage is terminated, and the pumping operation is prohibited. Accordingly, current consumption of the bias generating circuit in the test mode is reduced.

Upon assembly into SIP, mode designating signal MOD is set to an L level. Thus, NOR circuit 160 operates as an inverter, and detection signal DETN is set to an H level or an L level in accordance with the voltage level of bias voltage VNW.

In the case where the generation of the clock signal for controlling the pumping operation is suspended in the test operation, the pumping circuit may not be able to stably generate a power supply voltage in the test operation mode. In this case, a P channel MOS transistor transmitting a power supply voltage VDD in accordance with mode designating signal ZMOD may be provided to the output node of the pumping circuit, so that bias voltage VNW can be set to a power supply voltage level during the test operation.

Figure 36:
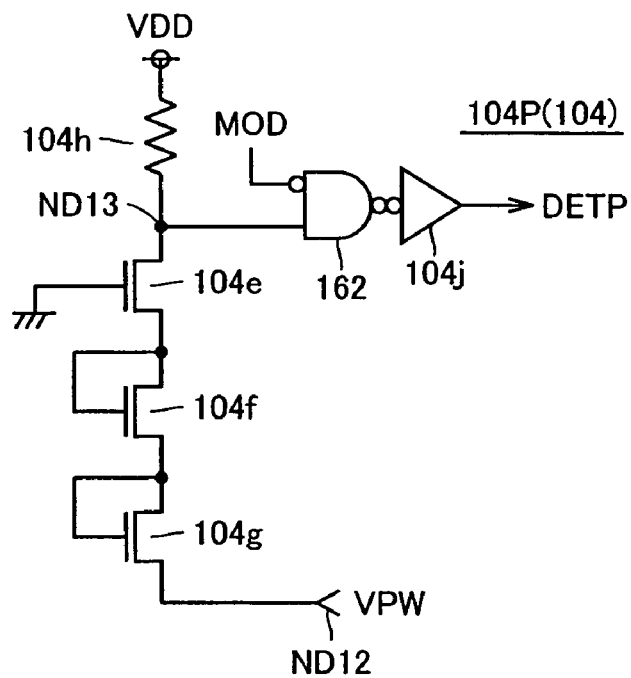

FIG. 36 shows a configuration of a level detecting circuit 104P detecting a level of bias voltage VPW. Level detecting circuit 140P shown in FIG. 36 differs from the level detecting circuit shown in FIG. 23 in that inverter 104i shown in FIG. 23 is replaced with a gate circuit 162 which receives mode designating signal MOD and a signal on node ND13. An output signal of this gate circuit 162 is applied to an inverter 104j at the next stage which generates detection signal DETP.

Gate circuit 162 outputs a signal of an H level when mode designating signal MOD is at an H level. When mode designating signal MOD is at an L level, the gate circuit 162 functions as an inverter and inverts the voltage signal of node ND13.

The other configuration of level detecting circuit 104P shown in FIG. 36 is identical to that of the level detecting circuit shown in FIG. 23, and thus, the corresponding portions are denoted by the same reference characters and detailed description thereof is not repeated.

In the configuration of level detecting circuit 104P shown in FIG. 36, when mode designating signal MOD is at an H level and a test is being performed, the output signal of gate circuit 162 is set to an H level. In response, the detection signal DETP from inverter 104j attains an L level, and the clock generating operation of the clock generating circuit at the next stage is terminated.

After assembly into SIP, mode designating signal MOD is at an L level, and gate circuit 162 operates as an inverter. Thus, detection signal DETP is set to an H level or an L level in accordance with the voltage level of bias voltage VPW.

In the configuration of level detecting circuit 104P shown in FIG. 36 as well, mode designating signal MOD is fixed to an H level during the test operation, and the voltage levels of the output signals of gate circuit 162 and inverter 104j are fixed. Thus, current consumption in the circuit portion of interest is reduced. Further, the clock signal generating operation at the next stage is terminated, and the boosting operation with respect to bias voltage VPW is terminated. Accordingly, current consumption in the test operation mode is decreased.

With the configuration of level detecting circuit 104P in FIG. 36 as well, the pumping circuit may not be able to stably supply a ground voltage in the test operation mode, since the level detecting operation as well as the generation of the pumping clock signal for controlling the pumping operation are terminated. In this case, an N channel MOS transistor responsive to mode designating signal MOD may be connected to the output node of the pumping circuit so as to fix the output node of the pumping circuit to a ground voltage level in the test operation mode. Thus, bias voltage VPW can be fixed to a ground voltage level in the test operation mode.

As described above, according to the configurations of the level detecting circuits shown in FIGS. 35 and 36, the level detecting operation of each respective level detecting circuit is stopped in the test operation mode. Thus, power consumption during the test operation is reduced.

Further, the output signal of the level detecting circuit is inactivated to stop the pumping operation. Accordingly, current consumption of the pumping circuit and the pumping clock generating circuit can also be reduced.

Fifth Configuration of Level Detecting Circuit

Figure 37:
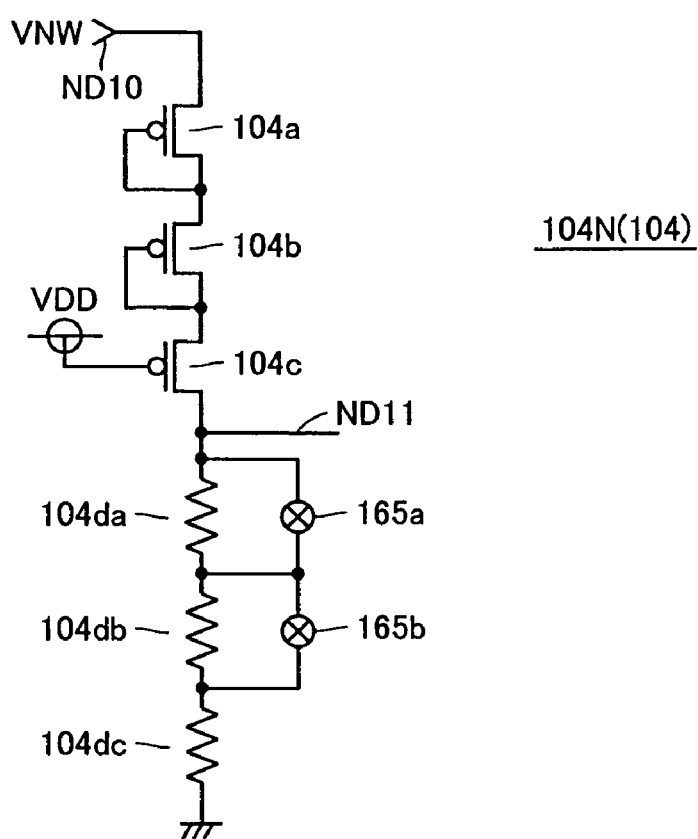

FIG. 37 shows a fifth configuration of the level detecting circuit 104 shown in FIG. 21. Specifically, the level detecting circuit 104N shown in FIG. 37 detects a level of bias voltage VNW, and corresponds to the level detecting circuit shown in FIG. 22 or FIG. 35.

The configuration of the level detecting circuit 104N shown in FIG. 37 differs from the configuration shown in FIG. 22 or FIG. 35 in that the resistance element 104d connected between node ND11 and the ground node is replaced with resistance elements 104da, 104db and 104dc connected in series, and fusible link elements (fuse elements) 165a and 165b are connected in parallel with resistance elements 104da and 104 db, respectively.

The output signal of node ND11 may be applied to inverter 104e shown in FIG. 22. Alternatively, NOR gate 160 shown in FIG. 35 may be connected to node ND11.

In the configuration of level detecting circuit 104N shown in FIG. 37, link elements 165a and 165b can be selectively set to blown/non-blown states to control a resistance value between node ND11 and a ground node, and thus to control a voltage level of node ND11. That is, a current flows from bias voltage input node ND10 to node ND11 when MOS transistors 104a–104c are all rendered conductive. The voltage level of node ND11 is determined to be H level or L level by a circuit at the next stage to control the charge pumping operation, and the detected criterion level of bias voltage VNW can be adjusted by controlling the combined resistance value of resistance elements 104da–104dc.

More specifically, when bias voltage VNW becomes sufficiently high, the current passing through MOS transistors 104a–104c becomes large (because the voltage difference between source and gate of MOS transistor 104c becomes large). The drain current of MOS transistor 104c is converted to a voltage by the combined resistance of resistance elements 104da–104dc. Thus, by adjusting the combined resistance value of resistance elements 104da–104dc, the amount of the drain current of MOS transistor 104c required to generate the voltage level (input logic threshold value) that is determined H level by the circuit at the next stage can be controlled. In response, the voltage level of well bias voltage VNW supplying the drain current can be adjusted. Thus, the voltage level of well bias voltage VNW can be controlled by selective blowing of link elements 165a and 165b.

When the detection level (criterion) of bias voltage VPW is to be tuned, resistance element 104h shown in FIGS. 23 and 36 is configured to have its resistance value tunable by a link element.

As described above, according to the configuration of the level detecting circuit shown in FIG. 37, the resistance value of the resistance element converting a current to a voltage signal is made tunable by a link element. Thus, the detection voltage level (target voltage) of the bias voltage can be set to a desired voltage level.

Sixth Configuration of Level Detecting Circuit

Figure 38:
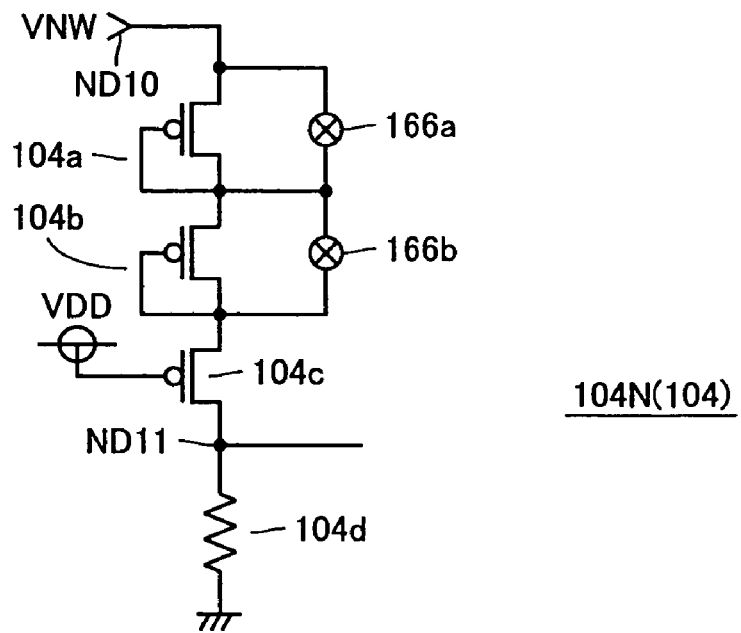

FIG. 38 shows a sixth configuration of the level detecting circuit shown in FIG. 21. Specifically, the configuration of the level detecting circuit 104N detecting a voltage level of bias voltage VNW is shown in FIG. 38. Either of inverter 104e shown in FIG. 22 or NOR circuit 160 shown in FIG. 35 may be connected at the next stage of node ND11.

In the level detecting circuit 104N shown in FIG. 38, fusible link elements 166a and 166b are connected in parallel with MOS transistors 104a and 104b causing voltage drop by the threshold voltages when conductive. The other configuration of this level detecting circuit 104N is identical to those of the level detecting circuits in FIGS. 22 and 35, and thus, the corresponding portions are denoted by the same reference characters, and detailed description thereof is not repeated.

The resistance value of resistance element 104d is made sufficiently large, and MOS transistors 104a and 140b each operate in a diode mode. Selective blowing of link elements 166a and 166b makes it possible to set the voltage drop between node ND10 and the source of MOS transistor 104c to any of 0Vthp, 1Vthp and 2Vthp.

Thus, the detection target voltage level of this bias voltage VNW can be set to any of VDD+Vthp, VDD+2Vthp and VDD+3Vthp. In other words, the voltage level of well bias voltage VNW can be set in steps of the absolute values of the threshold voltages of MOS transistors 104a and 104b, so that the well bias can be set to an optimal value.

Further, in this level detecting circuit 104N, the resistance value of resistance element 104d can be set sufficiently large, and the current consumption of the level detecting circuit as a whole is decreased. Thus, the level detecting operation of well bias voltage VNW is prevented from adversely affecting the voltage level of bias voltage VNW.

For the level detecting circuit 104P detecting a level of bias voltage VPW, link elements are connected in parallel with MOS transistor 104f and 104e shown in FIG. 36, for example, which are selectively blown.

As described above, according to the sixth configuration of the level detecting circuit, the MOS transistor for level shifting of the bias voltage is selectively shorted by a link element, and thus, the well bias voltage level can be set to an optimal value.

Fourth Configuration of Bias Voltage Generating Portion

Figure 39:
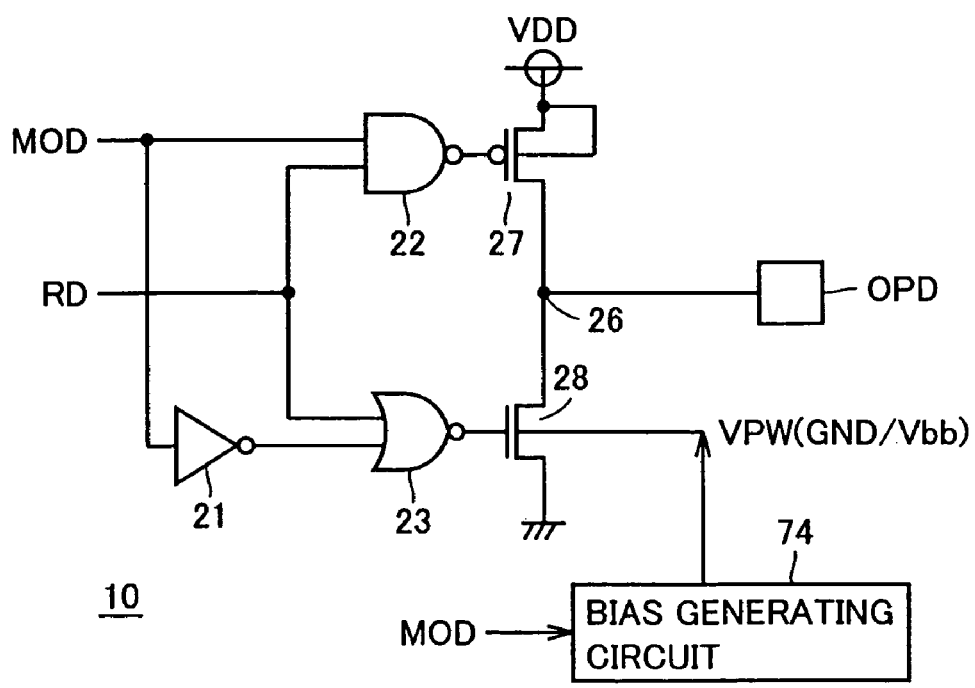
FIG. 39 shows another configuration of the bias voltage generating portion according to a second embodiment of the present invention.

FIG. 39 shows a fourth configuration of the well bias voltage generating portion according to the second embodiment of the present invention. The well bias voltage generating portion shown in FIG. 39 includes a bias generating circuit 74 which generates well bias of the output transistor 28 of the second output buffer 10. Similar to the configuration shown in FIG. 10, this bias generating circuit 74 generates a ground voltage GND in a test operation mode and generates a negative voltage Vbb after assembly into SIP, to the back gate of output transistor 28.

The back gate of the pull-up P channel MOS transistor 27 of second output buffer 10 is connected to a power supply node receiving an output-only power supply voltage VDD dedicated to the output circuit. Thus, the bias generating circuit 72 for generating N well bias voltage VNW as shown in FIG. 10 is not provided. The other configuration of the second output buffer circuit 10 shown in FIG. 39 is identical to the configuration shown in FIG. 10, and therefore, the corresponding portions are denoted by the same reference characters, and detailed description thereof is not repeated.

In the bias voltage generating portion shown in FIG. 39, only the bias generating circuit 74 generating well bias voltage VPW is provided, since generation of bias voltage VNW is not required. This reduces the circuit layout area of the bias voltage generating portion.

After assembly into SIP, the drain junction capacitance of pull-up MOS transistor 27 is coupled to the output pad OPD. However, this junction capacitance is made sufficiently small, because a negative voltage Vbb is supplied to the back gate of output pull-down MOS transistor 28 when assembled into SIP. Therefore, compared to the configuration where the drain junction capacitances of both output transistors 27 and 28 are connected to the output pad, the output capacitance of second output buffer 10 with respect to the output pad OPD can be reduced, and the effect on the normal operation mode is sufficiently suppressed.

In the configuration above, the circuit for switching the back gate bias for pull-down N channel MOS transistor 28 is provided. Alternatively, a circuit for generating back gate bias voltage VNW for output pull-up P channel MOS transistor 27 may be provided, and the gate of output pull-down N channel MOS transistor 28 may be connected to a ground voltage level. In general, the majority carriers in a P channel MOS transistor are holes, which exhibit smaller mobility than electrons being the majority carrier of an N channel MOS transistor. Current driving capability of the P channel MOS transistor is smaller than that of the N channel MOS transistor, provided that the transistor size is the same.

In order to achieve the current driving capability of the same degree as that of the N channel MOS transistor, the P channel MOS transistor is configured to have a channel width W greater than that of the N channel MOS transistor, thus occupying a larger area. Accordingly, by switching the voltage level of bias voltage VNW in accordance with an operation mode, the junction capacitance of the output pull-up P channel MOS transistor can be made small in a normal operation mode. The parasitic capacitance of the output pad during the normal operation will be reduced more efficiently by arranging a bias voltage generating circuit for P channel MOS transistor 27, compared to the case where bias voltage generating circuit 74 is provided for N channel MOS transistor 28.

Third Embodiment

Figure 40:
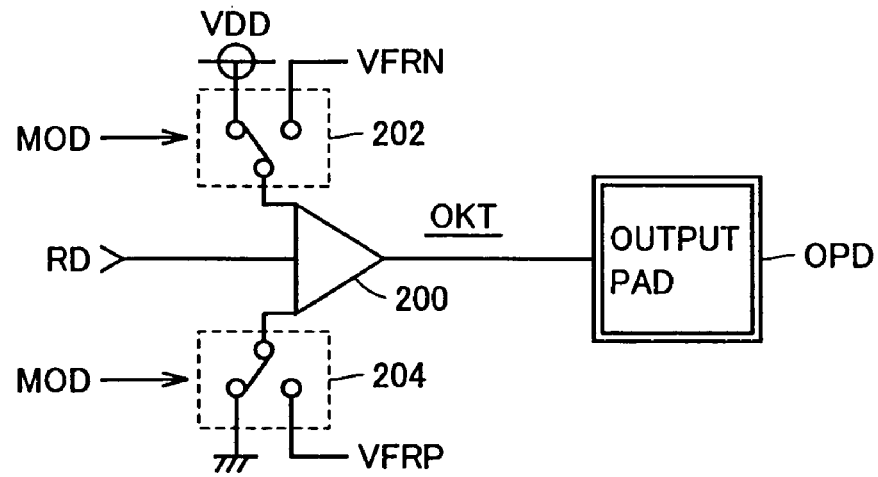
FIG. 40 schematically shows a configuration of the output circuit according to a third embodiment of the present invention.

FIG. 40 schematically shows a configuration of the output buffer according to the third embodiment of the present invention. The output buffer shown in FIG. 40 is arranged in output buffer circuit OKT shown in FIG. 2. Referring to FIG. 40, one output buffer 200 is provided in one output buffer circuit OKT with respect to an output pad OPD. This output buffer 200 is commonly used after assembly into SIP and in a test operation mode, to drive output pad OPD in accordance with an internal signal RD.

To output buffer 200, there are provided: a switch circuit 202 which sets the back gate voltage of a pull-up output transistor provided to output buffer 200 to one of power supply voltage VDD and a forward voltage VFRN; and a switch circuit 204 which sets the back gate voltage of a pull-down output transistor included in output buffer 200 to one of a ground voltage and a forward voltage VFRP in accordance with mode designating signal MOD.

The voltage level of the forward voltage VFRN is preferably lower than power supply voltage VDD, and set to a level at which the PN junction of the source/substrate (back gate) of the pull-up output transistor of output buffer 200 is prevented from turning conductive.

The voltage level of the forward voltage VFRP is preferably higher than the ground voltage but lower than a built-in voltage of the PN junction of the source/substrate (back gate) of the pull-down output transistor of output buffer 200.

However, forward voltages VFRN and VFRP each may be at any voltage level as long as the current driving capability can be made greater in a test operation mode than in a normal operation mode. In other words, any voltage with which the back gate bias of the output transistor is made shallower in the test operation mode than in the normal operation mode can be utilized as each of forward voltages VFRN and VFRP.

Switch circuits 202 and 204 preferably select forward voltages VFRN and VFRP, respectively, when mode designating signal MOD designates the test operation mode. The back gate bias of each output transistor of output buffer 200 becomes shallower, so that the output pad OPD is quickly driven in accordance with internal read data RD.

After assembly into SIP, switch circuits 202 and 204 select power supply voltage VDD and ground voltage GND, respectively. Thus, the current driving capability of each output transistor of output buffer 200 becomes smaller than in the test operation mode, and output pad OPD is quickly driven in accordance with internal read data RD, without suffering the back gate effect (substrate effect).

Figure 41:
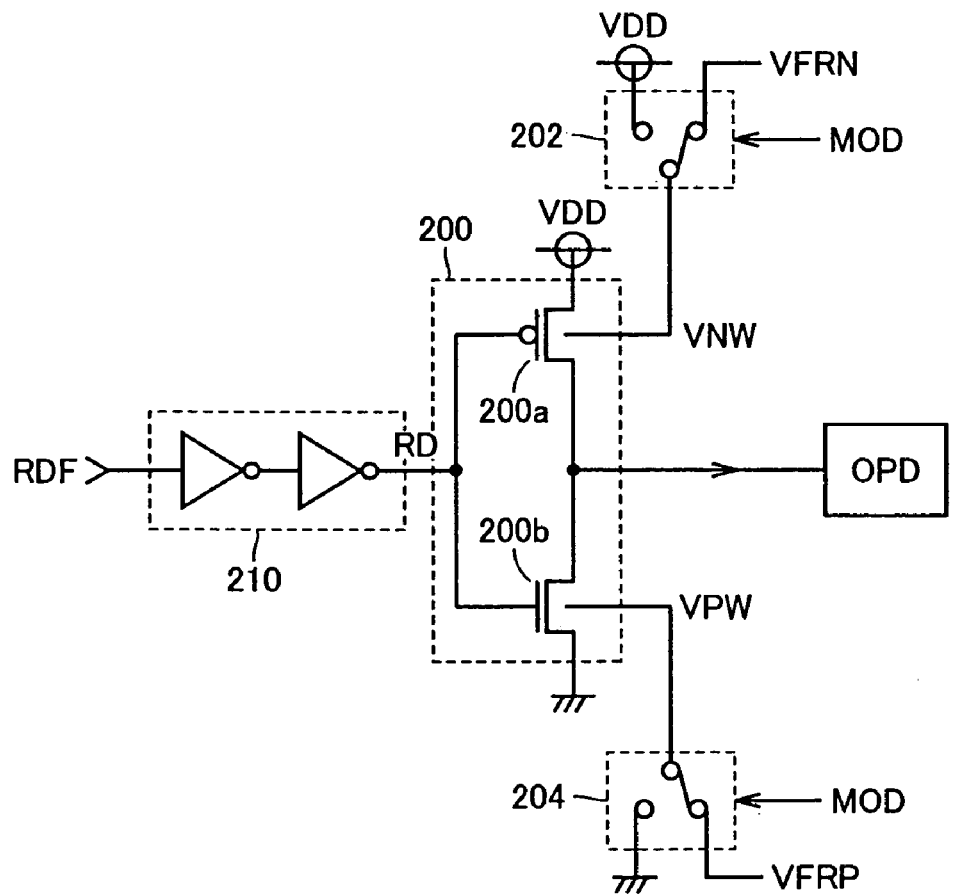
FIG. 41 specifically shows a configuration of the output buffer shown in FIG. 40.

FIG. 41 shows a more specific configuration of output buffer 200 in FIG. 40. Referring to FIG. 41, output buffer 200 receives internal signal RD from a read drive circuit 210 which receives read data RDF as a pre-processed internal signal. Read drive circuit 210 shown in FIG. 41 is formed of cascaded two-stage inverters. In the case where the semiconductor device is a semiconductor memory device, this read drive circuit 210 buffers internal read data RDF in accordance with an internal read data transfer designating signal and generates internal signal RD.

If the semiconductor device is other than the semiconductor memory device, read drive circuit 210 may be a buffer circuit arranged at the preceding stage of the output circuit, or may be a logic circuit performing a prescribed logical operation.

Output buffer 200 includes a pull-up output transistor 200a which drives output pad OPD to a power supply voltage VDD level in accordance with internal signal RD, and a pull-down output transistor 200b which drives output pad OPD to a ground voltage level in accordance with internal signal RD.

The back gate (N well) of output transistor 200a is supplied with well voltage (bias voltage) VNW via switch circuit 202. The back gate (P well) of output transistor 200b is supplied with bias voltage VPW via switch circuit 204.

Switch circuit 202 preferably selects forward voltage VFRN when mode designating signal MOD designates the test mode, and selects power supply voltage VDD in the normal operation mode. Switch circuit 204 preferably selects forward voltage VFRP when mode designating signal MOD indicates the test operation mode, and selects a ground voltage when mode designating signal MOD designates the normal operation mode.

In the third embodiment of the present invention, as shown in FIG. 41, only output transistors 200a and 200b are connected to output pad OPD. The threshold voltages of output transistors 200a and 200b, and hence the driving capabilities are controlled by selectively switching the voltage levels of bias voltages VNW and VPW by switch circuits 202 and 204 in accordance with an operation mode.

The back gates of output transistors 200a and 200b are isolated from back gates (well regions) of other circuits, and individually receive bias voltages VNW and VPW from switch circuits 202 and 204 in accordance with an operation mode (see the well region of the second output buffer region shown in FIG. 7).

In the configurations shown in FIGS. 40 and 41, as bias voltages VNW and VPW, power supply voltage VDD and ground voltage GND are selected in the normal operation mode, and forward voltages VFRN and VFRP are selected in the test operation mode. However, switch circuit 202 may be configured to select high voltage Vpp in the normal operation mode and power supply voltage VDD in the test operation mode. Further, switch circuit 204 may be configured to select negative voltage Vbb in the normal operation mode and a ground voltage in the test operation mode.

In this output buffer 200, the well regions of output buffers 200a and 200b are isolated from the well regions of other circuits, and the back gate voltage levels are changed in accordance with an operation mode. In the normal operation mode, the current driving capability is made smaller than in the test operation mode. That is, the well bias is made deeper in the normal operation mode than in the test operation mode. Thus, with one output buffer 200, it is possible to drive output pad OPD in accordance with internal signal RD with optimal driving capability in a normal operation mode, and to drive a test probe via output pad OPD with large driving capability in the test operation mode.

The overall configuration of the output circuit is identical to the configurations shown in FIGS. 2 and 9. One output buffer 200 is provided in one output buffer circuit OKT, which allows reduction in the layout area of the output circuit region.

As described above, according to the third embodiment of the present invention, one output buffer is commonly employed for testing and for a normal operation, and its current driving capability is made greater in a test operation mode than in a normal operation mode by making the well bias shallower. Thus, the layout area of the output circuit region is reduced.

Fourth Embodiment

Figure 42A:
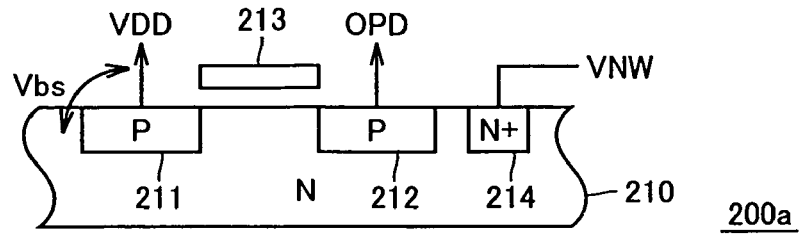
FIG. 42A schematically shows a cross sectional structure of the pull-up output drive transistor shown in FIG. 41.

FIG. 42A schematically shows a cross sectional structure of the output drive transistor 200a shown in FIG. 41. Referring to FIG. 42A, the output drive transistor 200a includes: P type impurity regions 211 and 212 formed in the surface of N well 210 spaced apart from each other; and a gate electrode 113 formed on the surface of the N well region between impurity regions 211 and 212 with a gate insulating film (not shown) interposed in between.

N well 210 is isolated from well regions of other circuit elements. N well 210 is supplied with bias voltage VNW via an N type impurity region 214. Impurity region 211 is supplied with power supply voltage VDD, and impurity region 212 is coupled to output pad OPD shown in FIG. 40.

In this output transistor 200a, a back gate-source voltage Vbs is defined as a voltage level of N well 210 with reference to a source voltage (VDD).

Figure 42B:
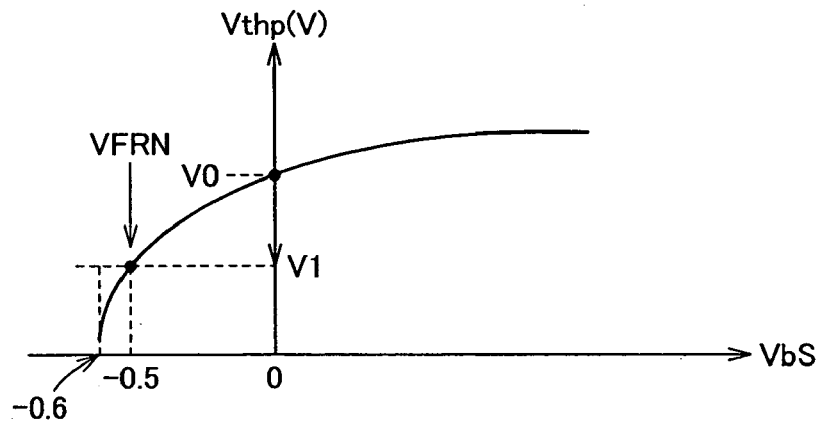
FIG. 42B shows a relation between the back gate-source voltage and the threshold voltage of the pull-up output transistor.

FIG. 42B shows a relation between a back gate-source voltage Vbs and an absolute value Vthp of the threshold voltage of a P channel MOS transistor. As shown in FIG. 42B, when the back gate-source voltage Vbs is 0 V and the source voltage (VDD) and the back gate voltage (VNW) are equal to each other, the absolute value Vthp of the threshold voltage assumes a voltage V0.

When the back gate-source voltage Vbs is driven to a negative voltage level, i.e., when bias voltage VNW applied to N well 210 is set to a voltage level lower than power supply voltage VDD, the absolute value Vthp of the threshold voltage decreases rapidly. For example, the absolute value of the threshold voltage at the time when back gate-source voltage Vbs is −0.5 V assumes a voltage V1. The back gate-source voltage Vbs is set to a voltage level not higher than the built-in voltage of the PN junction between source impurity region 211 and N well 210. In FIG. 42B, the built-in voltage of the PN junction is shown being −0.6 V. When the back gate-source voltage Vbs exceeds the built-in voltage, the PN junction becomes conductive, and a current will flow from impurity region 211 to N well 210. In response, a current will flow from a power supply node via N type impurity region 214 to a back gate bias applying node, thereby causing a large current flow.

Forward voltage VFRN is set to a voltage level with which back gate-source voltage Vbs of, e.g., 0.5 V is obtained. That is, forward voltage VFRN is set to a voltage level of VDD–0.5 V. Thus, in the test mode, the absolute value of the threshold voltage of output transistor 200a is made sufficiently small, and large current driving capability is ensured.

Forward voltage VFRN only need be lower than the power supply voltage but not lower than the voltage lower by the built-in voltage than the power supply voltage.

Figure 43A:
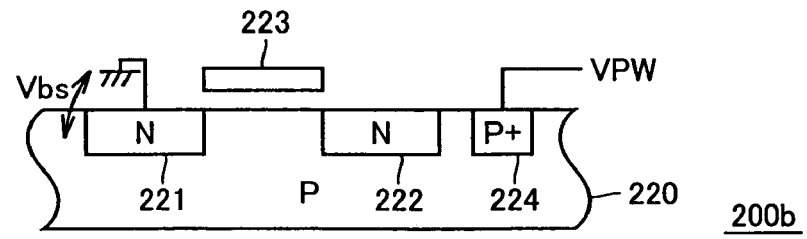
FIG. 43A schematically shows a cross sectional structure of the pull-down MOS transistor shown in FIG. 41.

FIG. 43A schematically shows a cross sectional structure of the output transistor 200b shown in FIG. 41. Referring to FIG. 43A, the output transistor 200b includes: N type impurity regions 221 and 222 formed in the surface of P well 220 spaced apart from each other; and a gate electrode 223 formed in the surface of the well region between impurity regions 221 and 222 with a gate insulating film (not shown) interposed in between.

P well 220 is supplied with bias voltage VPW via a P type impurity region 224. The back gate-source voltage Vbs of this output transistor 200b is defined as a voltage of P well 220 on the basis of a voltage (ground voltage) supplied to impurity region 221.

Figure 43B:
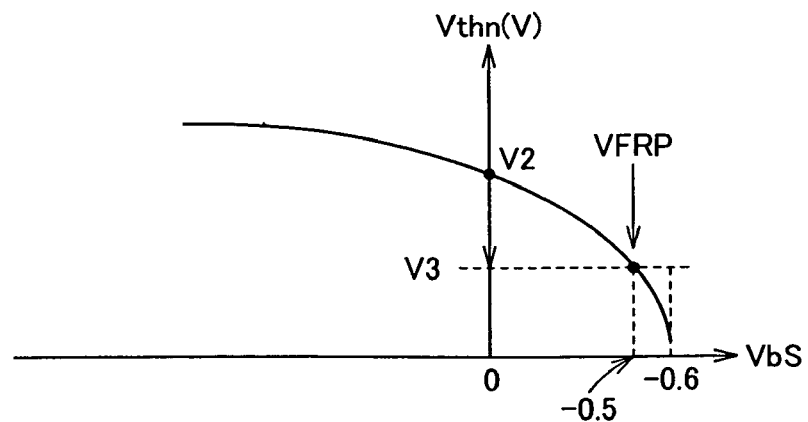
FIG. 43B shows a relation between the back gate-source voltage and the threshold voltage of the pull-down output transistor.

FIG. 43B shows a relation between a threshold voltage Vthn and a back gate-source voltage Vbs of an N channel MOS transistor. As shown in FIG. 43B, in the N channel MOS transistor, when the back gate-source voltage Vbs attains a negative voltage level, i.e., when the voltage level of P well 220 becomes a negative voltage level, the threshold voltage Vthn increases. On the other hand, when the back gate-source voltage Vbs attains a positive voltage level and the bias voltage of P well 220 becomes higher than a ground voltage level, the threshold voltage Vthn decreases rapidly.

In FIG. 43B, the threshold voltage Vthn at the time when back gate-source voltage Vbs is 0 V and the voltage level of P well 220 is at a ground voltage level is a voltage V2. Threshold voltage Vthn becomes a voltage V3 when back gate-source voltage Vbs is 0.5 V. When back gate-source voltage Vbs exceeds the built-in voltage of the PN junction between P well 220 and source N type impurity region 221, the PN junction becomes conductive, and a current will flow from P well 220 to a ground node. Thus, the forward voltage VFRP is set to a voltage level that is positive and is lower than the built-in voltage, 0.6 V, of the PN junction. In FIG. 43B, forward voltage VFRP set to 0.5 V is shown by way of example.

Figure 44:
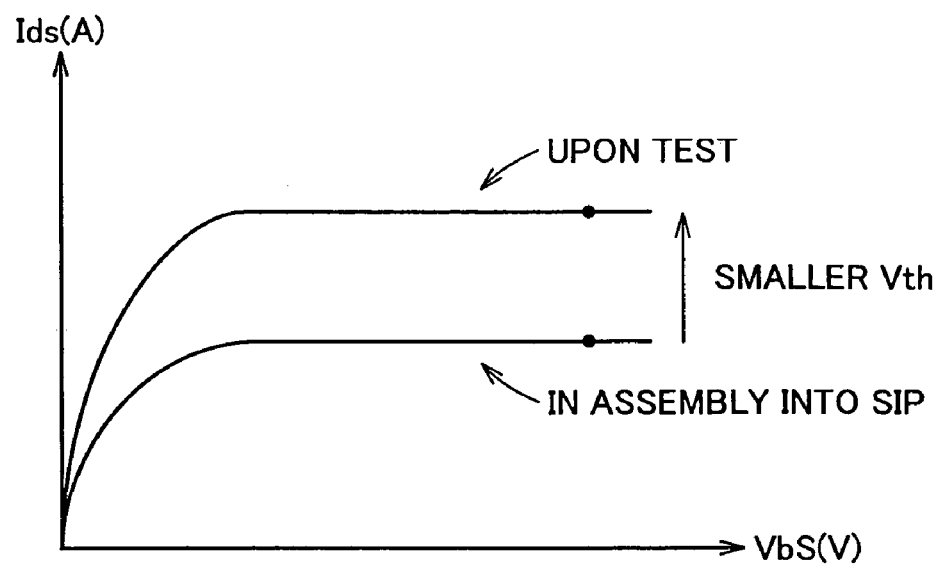
FIG. 44 shows ground voltage dependency of the drain current of the MOS transistor.

As shown in FIGS. 42B and 43B, the absolute value of the threshold voltage can be made sufficiently small by setting the back gate-source voltage to a voltage level that biases the PN junction between the source region and the back gate in a forward direction and is not greater in absolute value than the built-in voltage of the PN junction. In this case, as shown in FIG. 44, the drain current Ids of the MOS transistor changes to a great extent even if the same drain-source voltage Vds is applied. The change of the drain current shown in FIG. 44 is obtained from the following relational expression of the drain current Ids in the case when the MOS transistor operates in a saturated region.

$$Ids=\beta(Vgs-Vth)(Vgs-Vth),$$

where β is a constant determined by the MOS transistor structure, which is normally expressed as follows.

$$\beta=\mu Cox\ W/2L$$

Here, $\mu$ represents effective mobility of the majority carrier, and Cox represents gate capacitance per unit area. W represents a channel width, and L represents a channel length. Vgs represents a gate-source voltage, and Vth represents a threshold voltage.

Thus, by setting each of bias voltages VNW and VPW to a voltage level making the bias in the test operation shallow and biasing the PN junction in a forward direction, it is possible to make drain current Ids sufficiently large in the test operation mode, compared to the normal operation mode (when assembled into SIP), and to drive the output pad OPD with large current driving capability.

Accordingly, although one output buffer is employed both in the test and normal operation modes, the driving capability of the output buffer is switched by switching the well bias voltage level. Since only one output buffer is connected to the output pad, parasitic capacitance of the output pad OPD is decreased. The output pad can be driven at high speed in the normal operation mode and in the test mode of operation.

The voltage of output transistor 200a may be switched between high voltage Vpp and power supply voltage VDD. Bias voltage VPW of output transistor 200b may be switched between a ground voltage and a negative voltage. In either case, with the back gate-source voltage Vbs set in accordance with the relations shown in FIGS. 42B and 43B, the well bias in the test operation mode can be made sufficiently shallow and the absolute value of the threshold voltage can be made small.

Figure 45:
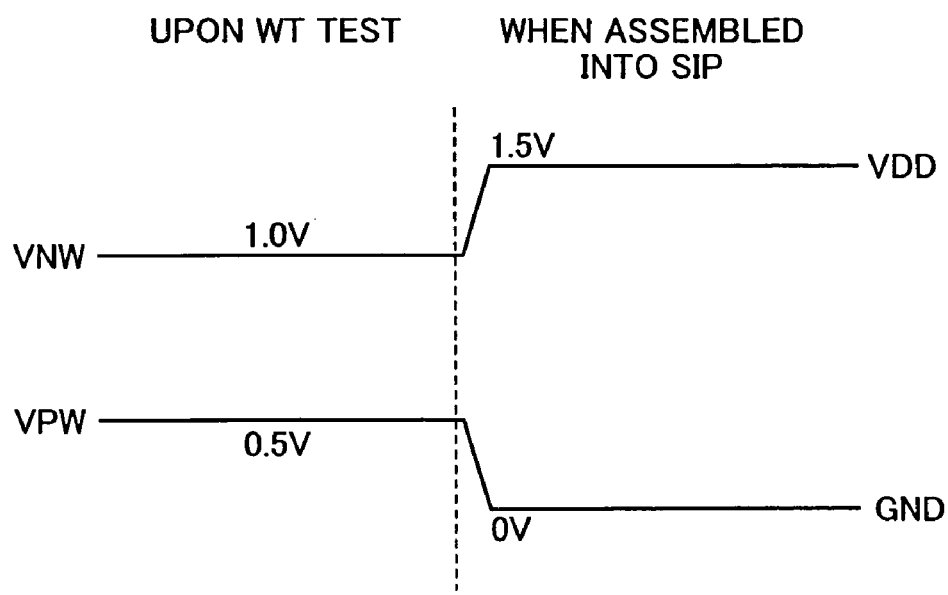
FIG. 45 shows a voltage level of the well bias voltage according to a fourth embodiment of the present invention.

FIG. 45 shows specific voltages of the well biases in the respective operation modes. Referring to FIG. 45, in a test mode (wafer test (WT)), bias voltage VNW is set to 1.0 V and bias voltage VPW is set to 0.5 V. Here, power supply voltage VDD is assumed to be 1.5 V. Thus, in this operation mode (in WT test), the absolute value of back gate-source voltage Vbs becomes 0.5 V, and from the graphs shown in FIGS. 42B and 43B, absolute values Vthp and Vthn of the threshold voltages are made sufficiently small to allow the output buffer to operate at high speed.

On the other hand, when assembled into SIP, bias voltages VNW and VPW are set to power supply voltage VDD level and ground voltage GND level, respectively. In this case, back gate-source voltage Vbs is 0 V, and output transistors 200a and 200b of the output buffer operate with characteristics optimally designed for the normal operation, without suffering the substrate effect.

By setting each well bias voltage in the test operation mode to a voltage level not exceeding the built-in voltage of the PN junction of the well/source of a corresponding transistor 200a or 200b, the through current is prevented from flowing, and the absolute value of the threshold voltage is made sufficiently small. Accordingly, the current driving capabilities of output transistors 200a and 200b in the test operation mode can be made sufficiently large.

Fifth Embodiment

Figure 46:
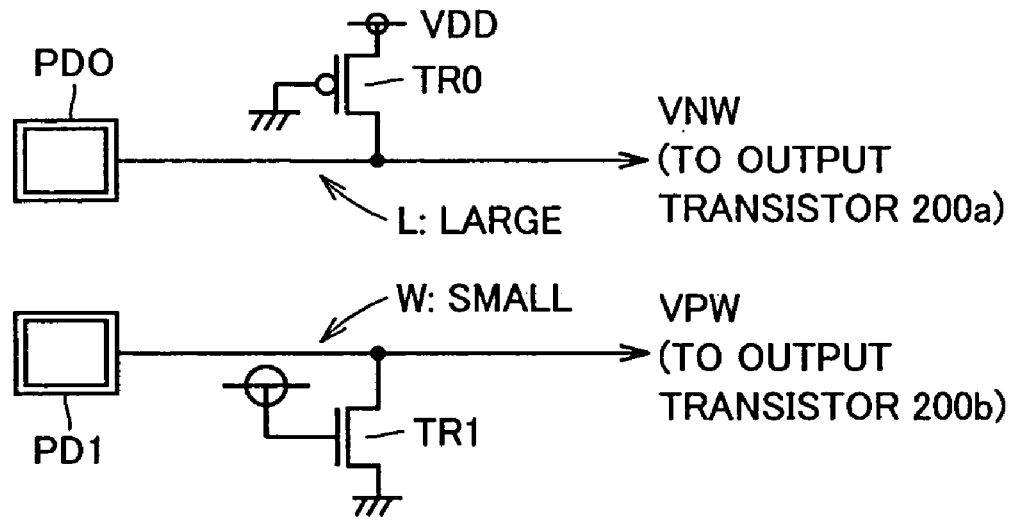
FIG. 46 shows a configuration of the bias voltage generating portion according to a fifth embodiment of the present invention.

FIG. 46 schematically shows a configuration of the bias voltage generating portion according to the fifth embodiment of the present invention. In FIG. 46, bias voltage VNW is set according to a voltage level of a pad PD0, and bias voltage VPW is set by a voltage level of a pad PD1. To pad PD0, a P channel MOS transistor TR0 is connected between a power supply node and pad PD0 and has its gate connected to a ground node. To pad PD1, an N channel MOS transistor TR1 is connected between pad PD1 and a ground node and has its gate connected to a power supply node. MOS transistors TR0 and TR1 are each formed of a MOS transistor having a sufficiently long channel length L and a sufficiently small channel width W, and its current driving capability made sufficiently small.

Pads PD0 and PD1, provided in addition to output pad OPD, are not used in a normal operation mode. In a test operation mode, when a test at a wafer level is carried out, pads PD0 and PD1 are supplied with voltages from a tester via probes. Thus, in the test operation mode, forward voltages VFRN and VFRP are transmitted to pads PD0 and PD1 to set the voltage levels of bias voltages VNW and VPW, respectively. Therefore, in output buffer 200, the well bias voltages of output transistors 200a and 200b shown in FIG. 41 are set to the voltage levels at which the absolute values of the threshold voltages become sufficiently small.

On the other hand, Upon assembly into SIP, pads PD0 and PD1 are set to an open state. Thus, in this state, MOS transistors TR0 and TR1 set bias voltages VNW and VPW to a power supply voltage VDD level and a ground voltage level, respectively.

MOS transistors TR0 and TR1 may be arranged corresponding to each output buffer. In this case, even if the current driving capabilities of MOS transistors TR0 and TR1 are small, they can reliably set the bias voltage levels of the output transistors of the corresponding output buffer to the power supply voltage level and the ground voltage level.

Further, MOS transistors TR0 and TR1 may be commonly provided for the output buffer group, to apply bias voltages VNW and VPW commonly to the output buffer group. In this case, if there is a possibility that bias voltages VNW and VPW become unstable in a normal operation mode due to small current driving capabilities of MOS transistors TR0 and TR1, voltage followers may be provided for respective bias voltages VNW and VPW, to generate these bias voltages. A comparison circuit may be used as the voltage follower. An output of the comparison circuit is applied to a comparison input thereof, and an output voltage and bias voltage VNW/VPW are compared at the comparison input stage. Thus, bias voltages VNW and VPW can be commonly supplied to a plurality of output buffers in both the test and normal operation modes, reliably with large driving capabilities.

Modification

Figure 47:
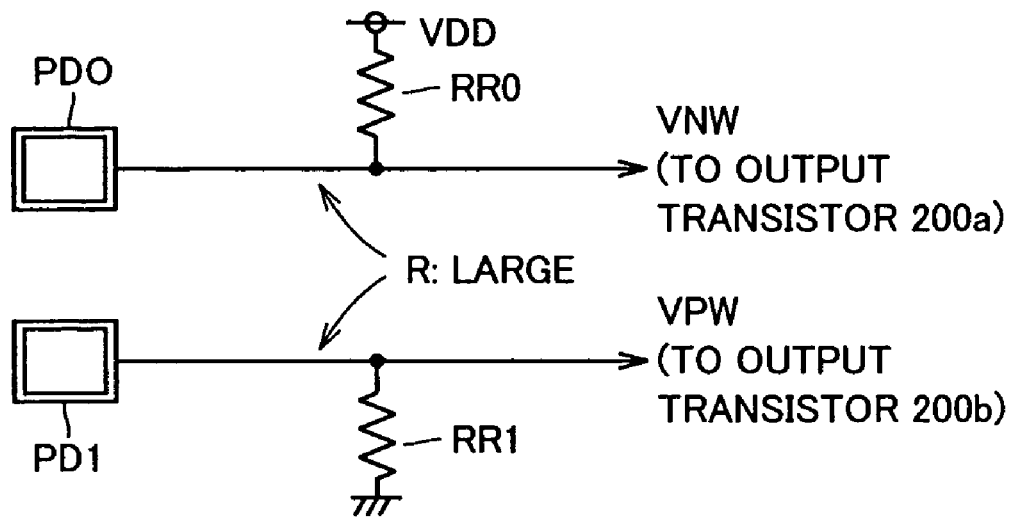
FIG. 47 shows a configuration of the bias voltage generating portion according to a modification of the fifth embodiment of the present invention.

FIG. 47 shows a modification of the fifth embodiment of the present invention. In the configuration shown in FIG. 47, MOS transistors TR0 and TR1 shown in FIG. 46 are replaced with resistance elements RR0 and RR1 of high resistance. Resistance elements RR0 and RR1 have sufficiently large resistance values and their current driving capabilities are made sufficiently small.

In a test operation mode, a tester supplies forward voltages VFRN and VFRP to pads PD0 and PD1, respectively. Upon assembly into SIP, pads PD0 and PD1 are set to an open state. In this state, bias voltages VNW and VPW are maintained at a power supply voltage VDD level and a ground voltage level, respectively, by resistance elements RR0 and RR1.

As shown in FIGS. 46 and 47, specific pads PD0 and PD1 are supplied with forward voltages VFRN and VFRP via a tester in a test operation mode. In a normal operation mode, these specific pads are set to an open state and driven to a voltage VDD level and a ground voltage level, respectively, by high-resistance elements of small current driving capabilities. Accordingly, a switch circuit for switching the bias voltage of the output transistor becomes unnecessary, so that the circuit layout area is decreased. In addition, the tester itself can accurately set forward voltages VFRN and VFRP to desired voltage levels.

Sixth Embodiment

Figure 48:
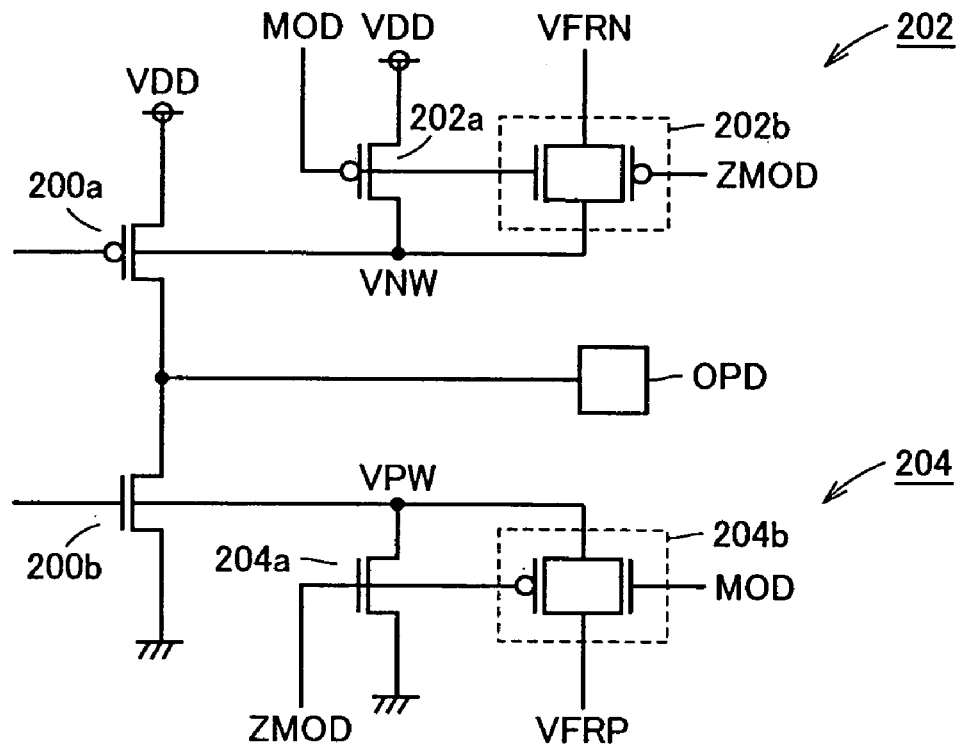
FIG. 48 shows a configuration of the well bias voltage generating portion according to a sixth embodiment of the present invention.

FIG. 48 shows a configuration of the switch circuit according to the sixth embodiment of the present invention. Referring to FIG. 48, the switch circuit 202 generating bias voltage VNW includes: a P channel MOS transistor 202a which transmits power supply voltage VDD in accordance with mode designating signal MOD; and a CMOS transmission gate 202b which is selectively rendered conductive in accordance with mode designating signals MOD and ZMOD and transmits forward voltage VFRN when conductive. MOS transistor 202a and CMOS transmission gate 202b are rendered conductive complementarily to each other, and when conductive, transmit power supply voltage VDD and forward voltage VFRN, respectively, to the back gate of output transistor 200a.

Switch circuit 204 includes: an N channel MOS transistor 204a which is selectively rendered conductive in response to complementary mode designating signal ZMOD and transmits a ground voltage as bias voltage VPW when conductive; and a CMOS transmission gate 204b which is selectively rendered conductive in accordance with mode designating signals ZMOD and MOD complementary to each other and transmits forward voltage VFRP as bias voltage VPW, when conductive.

In a test operation mode, mode designating signal MOD is at an H level, and complementary mode designating signal ZMOD is at an L level. Thus, MOS transistors 202a and 204a are non-conductive, and CMOS transmission gates 202b and 204b are conductive. Forward voltages VFRN and VFRP are each at an intermediate voltage level different from power supply voltage VDD and ground voltage GND. Utilizing CMOS transmission gates 202b and 204b, the forward voltages VFRN and VFRP of the intermediate voltage levels can be transmitted accurately as bias voltages VNW and VPW, without causing threshold voltage losses.

In a normal operation mode (after assembly into SIP), mode designating signal MOD is at an L level and complementary mode designating signal ZMOD is at an H level. Thus, CMOS transmission gates 202b and 204b are non-conductive and MOS transistors 202a and 204a are conductive. In this case, by transfer gates 202a and 204a formed of MOS transistors, power supply voltage VDD and ground voltage GND can be transmitted as bias voltages VNW and VPW, not affected by the threshold voltages.

Figure 49A:
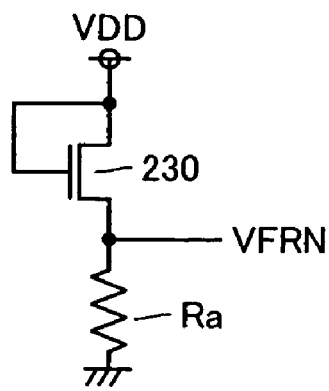
FIGS. 49A and 49B show configurations of the forward voltage generating portion shown in FIG. 48.
Figure 49B:
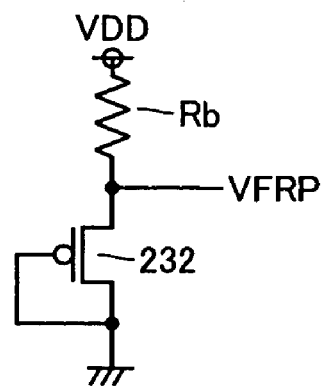

FIGS. 49A and 49B show by way of example configurations of the circuits for generating forward voltages VFRN and VFRP. Referring to FIG. 49A, the circuit for generating forward voltage VFRN includes: a diode-connected N channel MOS transistor 230 which is connected to a power supply node; and a resistance element Ra of high resistance which is connected between MOS transistor 230 and a ground node. MOS transistor 230 causes voltage drop of its threshold voltage Vthn. Thus, the forward voltage VFRN generated at the drain of MOS transistor 230 has a voltage level of VDD−Vthn.

Referring to FIG. 49B, the circuit generating forward voltage VFRP includes: a diode-connected P channel MOS transistor 232 which is coupled to a ground node; and a resistance element Rb of high resistance which is connected between MOS transistor 232 and a power supply node. Forward voltage VFRP is generated at the source node of MOS transistor 232. MOS transistor 232 has its gate and drain connected to a ground node, and operates in a diode mode. Forward voltage VFRP has a voltage level of absolute value Vthp of the threshold voltage of MOS transistor 232.

Alternatively, forward voltages VFRN and VFRP may be generated by dedicated reference voltage generating circuits, respectively.

Further, MOS transistors 230 and 232 may be replaced with Shottky diodes.

As described above, according to the sixth embodiment of the present invention, a CMOS transmission gate is used as a transfer circuit for transmitting a forward voltage as a bias voltage in a test operation mode. Accordingly, it is possible to transfer the forward voltage of an intermediate voltage level accurately to the back gate of each output transistor.

Seventh Embodiment

Figure 50:
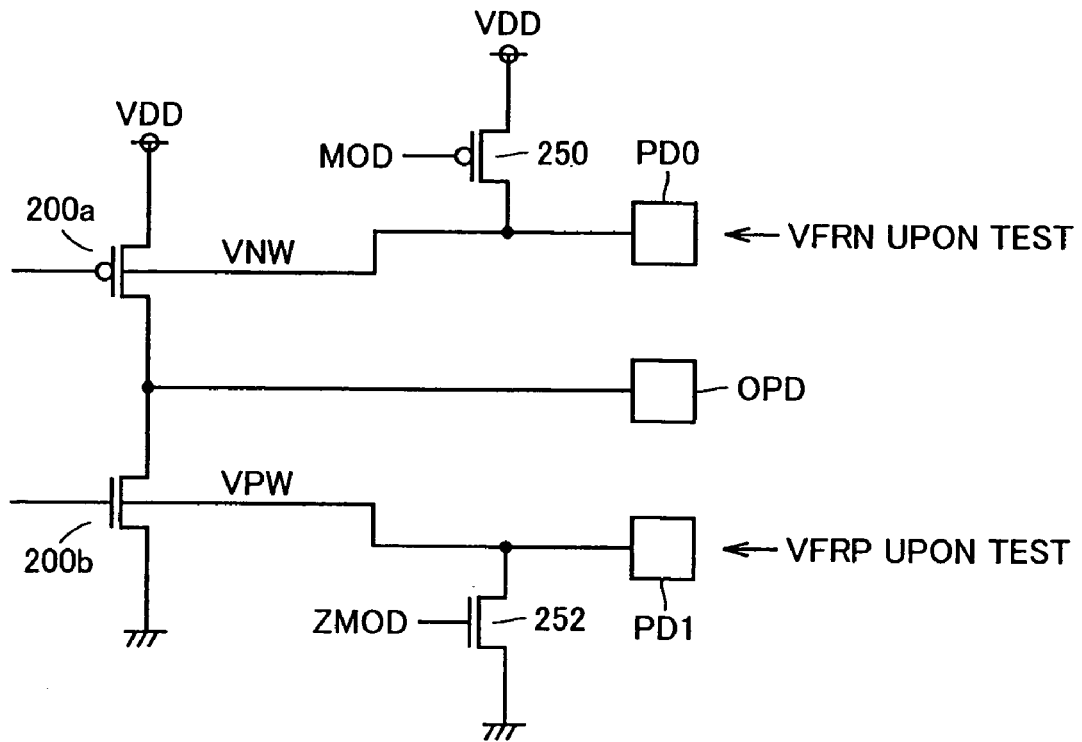
FIG. 50 schematically shows a configuration of the bias voltage generating portion according to a seventh embodiment of the present invention.

FIG. 50 shows a configuration of the bias voltage generating portion according to the seventh embodiment of the present invention. In the configuration shown in FIG. 50, a P channel MOS transistor 250 responsive to mode designating signal MOD is connected to a pad PD0 provided separately from output pad OPD. Pad PD0 is connected to the back gate of output transistor 200a.

Further, an N channel MOS transistor 252 responsive to complementary mode designating signal ZMOD is connected to a pad PD1 provided separately from output pad OPD. Pad PD1 is connected to the back gate of output transistor 200b.

MOS transistor 250, when conductive, supplies power supply voltage VDD to pad PD0 and to the back gate of output transistor 200a. MOS transistor 252, when conductive, provides a ground voltage to pad PD1 and the back gate of output transistor 200b.

In a test operation mode, mode designating signal MOD is set to an H level, and complementary mode designating signal ZMOD to an L level. In this state, MOS transistors 250 and 252 are both non-conductive. In the test operation mode where a wafer level test is performed, a tester supplies forward voltages VFRN and VFRP to pads PD0 and PD1, respectively, and in addition, as well bias voltages VNW and VPW, to the back gates of output transistors 200a and 200b, respectively.

On the other hand, when assembled into SIP, mode designating signal MOD is set to an L level and complementary mode designating signal ZMOD to an H level. Upon packaging, pads PD0 and PD1 are maintained at an open state. MOS transistors 250 and 252 are both rendered conductive, and bias voltages VNW and VPW are maintained at a power supply voltage VDD level and a ground voltage level, respectively.

In the configuration shown in FIG. 50, the voltage levels of bias voltages VNW and VPW after packaging are set simply with MOS transistors 250 and 252. Upon testing, bias voltages VNW and VPW are applied from an external tester. Thus, the configuration of the switch circuit is simplified, and the layout area of the output circuit is decreased.

MOS transistors 250 and 252, and hence, pads PD0 and PD1, are provided commonly to the output buffers included in the output circuit. However, in the case where the output circuit is distributed as in a semiconductor memory device and output power supply voltages are supplied to respective output buffer groups, a pair of pads PD0 and PD1 may be arranged for each output buffer group arranged collectively.

Modification

Figure 51:
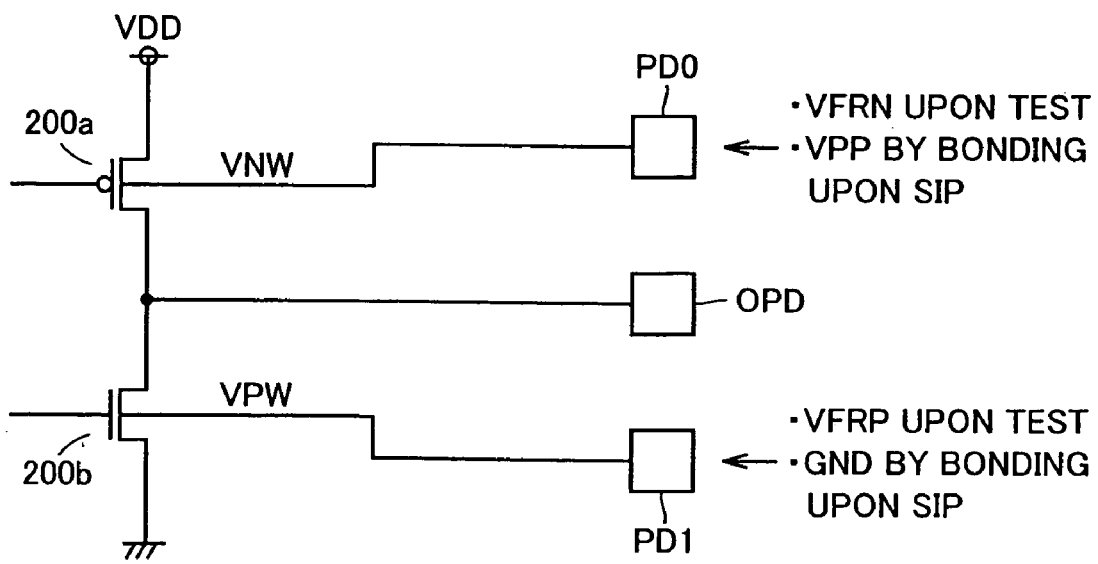
FIG. 51 schematically shows a configuration of a modification of the bias voltage generating portion according to the seventh embodiment of the present invention.

FIG. 51 schematically shows a configuration of the modification of the seven embodiment of the present invention. In FIG. 51, pads PD0 and PD1 provided separately from output pad OPD are connected to back gates of output transistors 200a and 200b, respectively. In testing, a tester supplies forward voltages VFRN and VFRP to pads PD0 and PD1, respectively. Upon assembly into SIP, pads PD0 and PD1 are bonded to a power supply terminal and a ground terminal, respectively. Pads PD0 and PD1 are commonly provided to the output buffers of the output circuit.

Pads PD0 and PD1 are arranged near a power supply pad and a ground pad dedicated to the output circuit, respectively. Thus, upon packaging, pads PD0 and PD1 can readily be fixed to a power supply voltage VDD level and a ground voltage GND level, respectively, by bonding.

In the configuration shown in FIG. 51, bias voltages VNW and VPW are set according to the voltage levels of pads PD0 and PD1, respectively. Thus, a switch circuit for switching the voltage levels of bias voltages VNW and VPW in accordance with an operation mode becomes unnecessary, and thus, the circuit layout area is reduced.

In this modification as well, when the output circuit is distributed as in the semiconductor memory device, pads PD0 and PD1 may be arranged for each output circuit region. Alternatively, a pair of pads PD0 and PD1 may be arranged for each set of output-dedicated power supply voltage and ground voltage, to supply bias voltages to the output transistors of the corresponding output buffers.

As described above, according to the seventh embodiment of the present invention, a bias voltage is supplied to an output transistor in accordance with a voltage of a specific pad. Thus, a circuit for switching the voltage level of the bias voltage in accordance with an operation mode and a circuit for generating a bias voltage become unnecessary. This reduces the circuit layout area as well as the current consumption.

Configuration of Mode Designating Signal Generating Portion

Figure 52:
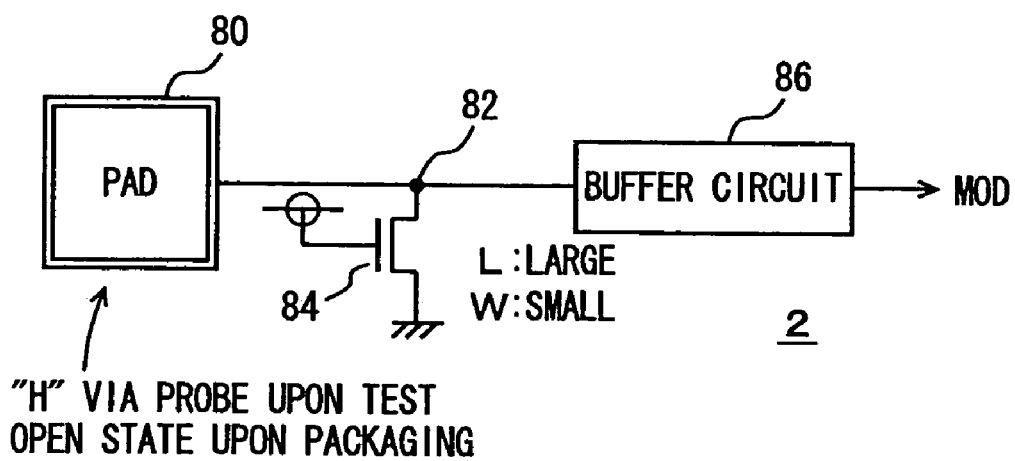
FIG. 52 shows by way of example a configuration of a mode designating signal generating portion according to the present invention.

FIG. 52 schematically shows a configuration of the mode designating signal generating portion 2 shown in FIG. 1. Referring to FIG. 52, mode designating signal generating portion 2 includes: an N channel MOS transistor 84 which is connected between a ground node and an internal node 82 connected to a specific pad 80 different from the output pad; and a buffer circuit 86 which buffers a signal of internal node 82 and generates mode designating signal MOD.

MOS transistor 84 has its gate connected to a power supply node, and constantly remains conductive. However, the MOS transistor has sufficiently small current driving capability due to small channel width W and large channel length L. Thus, MOS transistor 84 functions as a pull-down high-resistance element driving a minute current.

In a test operation mode, a signal of an H level is applied to the specific pad 80 through a probe from a test probe card, for example. Thus, in this state, mode designating signal MOD from buffer circuit 86 attains an H level to designate the test operation mode. In the configurations according to the first and second embodiments, the first output buffer group with small current driving capability is disabled, and the second output buffer group with large current driving capability is enabled. The current driving capability of the output buffer is made large in the configuration according to the third embodiment.

Upon packaging after completion of the test operation, specific pad 80 is held in an open state. In this state, internal node 82 is discharged by MOS transistor 84 and fixed to a ground voltage level. In response, mode designating signal MOD from buffer circuit 86 is fixed to an L level. Thus, in the configurations of the first and second embodiments, the first output buffer group with small current driving capability for use in a normal operation is enabled, whereas the second output buffer group with large current driving capability is disabled. In the configuration according to the third embodiment, the current driving capability of the output buffer is made smaller than in the test operation mode.

The specific pad 80 is employed and its voltage is set by a test probe upon testing, and the pad 80 is set to an open state upon packaging. Thus, the operation modes can be readily switched without provision of wiring that is unnecessary for a normal operation. Even in the case of face down packaging, the modes can be readily switched without adversely affecting pad arrangement for inter-chip connection. Generally, in the case of face down packaging, pads for the inter-chip connection are rearranged in a region called an area array.

Modification of Mode Designating Signal Generating Portion

Figure 53:
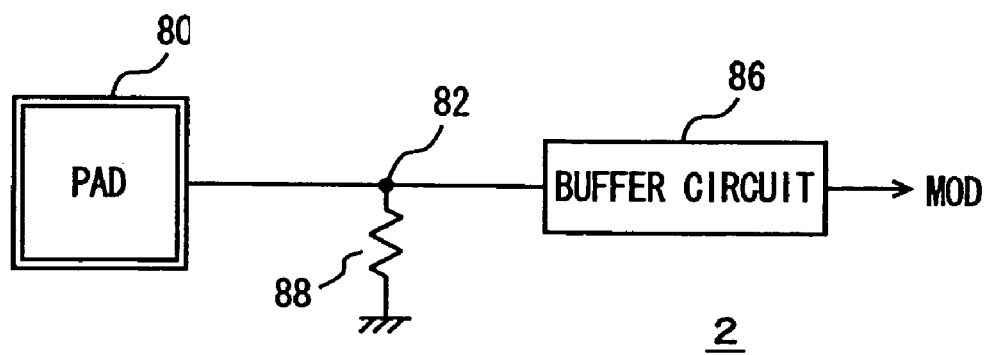
FIG. 53 shows a modification of the mode designating signal generating portion of the present invention.

FIG. 53 schematically shows a configuration of the modification of the mode designating signal generating portion. Referring to FIG. 53, the mode designating signal generating portion 2 includes a resistance element 88 of high resistance connected between internal node 82 and a ground node. Specific pad 80 is coupled to buffer circuit 86 via internal node 82. This specific pad 80 is a pad different from the output pad.

In the configuration of mode designating signal generating portion 2 shown in FIG. 53, the MOS transistor is simply replaced with resistance element 88 of high resistance. Thus, the resistance element of high resistance functions as pull-down resistance, and makes a minute current flow between internal node 82 and a ground node.

Specific pad 80 is set to an H level by a test probe in a test operation, and is held in an open state upon packaging, as in the configuration shown in FIG. 52. Thus, even if resistance element 88 of high resistance is employed in place of the MOS transistor, operation modes can be switched without provision of wiring for pad 80, and pad rearrangement for inter-chip connection is also unnecessary for the specific pad. Pad layout as well as inter-chip connection is thus facilitated.

In the configurations shown in FIGS. 52 and 53, if buffer circuit 86 is formed of an inverter, in place of the pull-down element, a pull-up element serving as a high-resistance element with small current driving capability, is connected between a power supply node and internal node 82. However, by holding internal node 82 at a ground voltage level in a normal operation mode, it is unnecessary to charge internal node 82 in the normal operation mode, so that current consumption in the portion generating mode designating signal MOD is reduced.

In the configurations shown in FIGS. 52 and 53, a MOS transistor responsive to a reset signal, such as a power-on detection signal, may be connected between pad 80 and a ground node. In this case, pad 80 can be set rapidly and reliably to a ground voltage level at initialization after power up in the normal operation mode.

Figure 54:
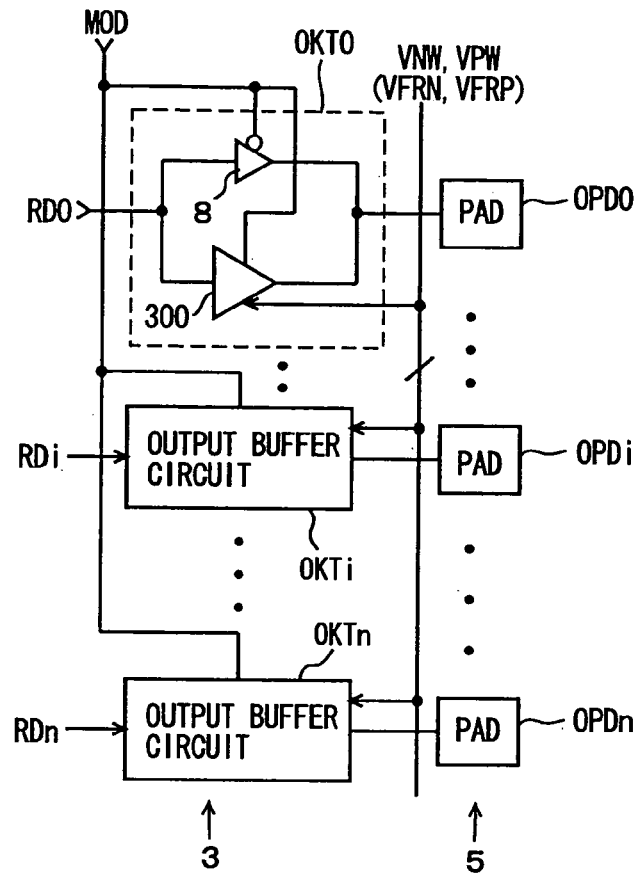
FIG. 54 shows an arrangement of an output circuit according to a further embodiment of the present invention.

Further Configuration of Output Buffer Circuit FIG. 54 shows a configuration of an output circuit 3 according to a further embodiment of the present invention. In the configuration shown in FIG. 54, output buffer circuits OKT0 to OKTn are arranged corresponding to pads OPD0 to OPDn in an output pad group 5, and are supplied with the well bias voltages VNW and VPW. These well bias voltages VNW and VPW each are switched between a source voltage and a forward voltage.

Output buffer circuits OKT0 to OKTn each have the same configuration, and a specific configuration of output buffer circuit OKT0 is representatively shown. Output buffer circuits OKT0 to OKTn each includes an output buffer 8 and an output buffer 300. Output buffer 8, made small in size, drives a corresponding pad OPDi (i=0 to n) with a relatively small driving power in response to a corresponding internal signal RD, when activated in accordance with a mode designating signal MOD, as in the embodiment shown in FIGS. 2 to 4.

Mode designating signal MOD enables the output buffer 8 when the device is assembled into a package, and enables the output buffer 300 in a test mode of operation. Output buffer 300 receives forward voltages VFRN and VFRP as a well bias voltages and drives the corresponding pad OPDi with a great driving power in the test mode of operation. Since the output buffer 300 receives the forward voltages as the well bias voltages, output buffer 300 can be made small in size as compared to the configuration of receiving the source voltages VDD and GND as the well bias voltages in the test mode of operation.

Output buffer 8 has the configuration the same as the output buffer as described in the previous embodiments as shown in FIG. 3, and includes a pull-up transistor and a pull-down transistor each optimized for application in SIP. The operation characteristics and arrangement of output buffer 8 is the same as described in the previous embodiment with reference to FIG. 3, for example. Thus, the description of the output buffer 8 will not be repeated here.

Figure 55:
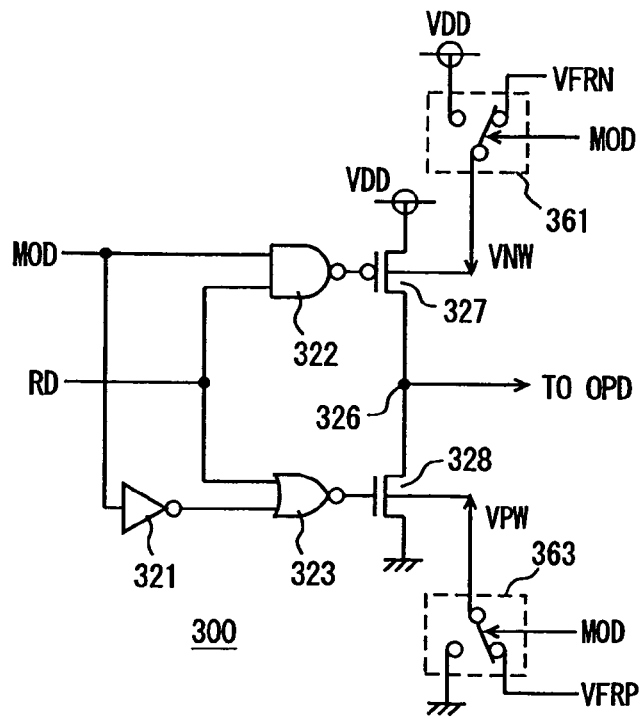
FIG. 55 shows a specific configuration of the output buffer for test mode shown in FIG. 54
Figure 56:
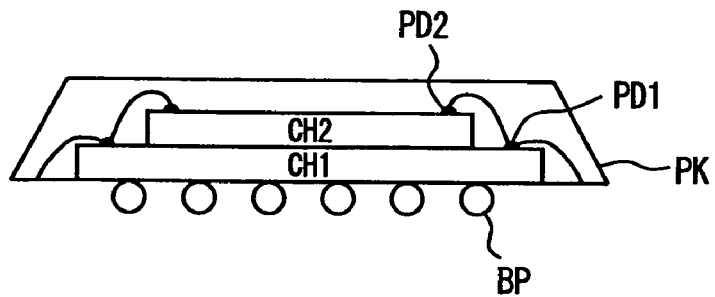
FIG. 56 schematically shows a cross sectional structure of a conventional system in package.
Figure 57:
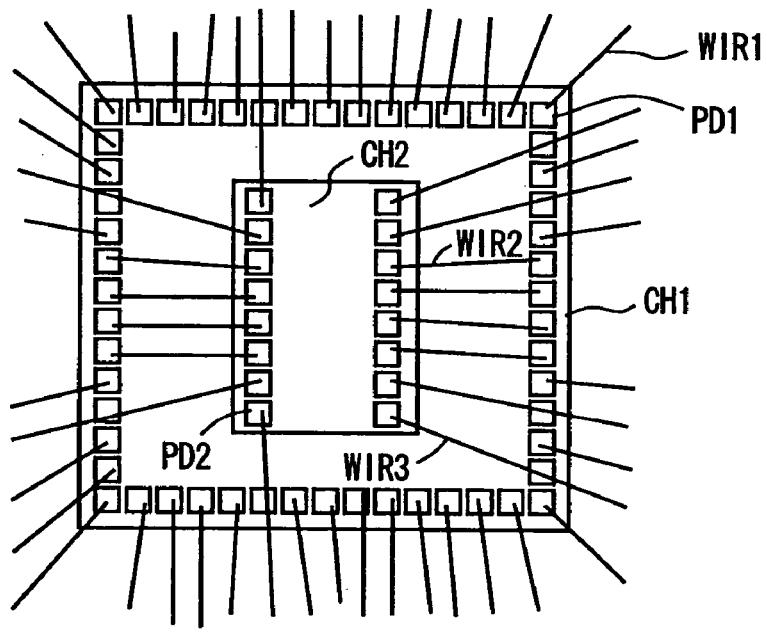
FIG. 57 schematically shows planar arrangement of the chips in the system in package shown in FIG. 56.
Figure 58:
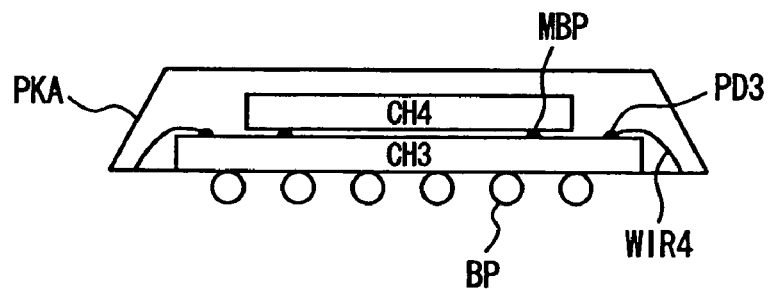
FIG. 58 schematically shows a cross sectional structure of another conventional system in package.
Figure 59:
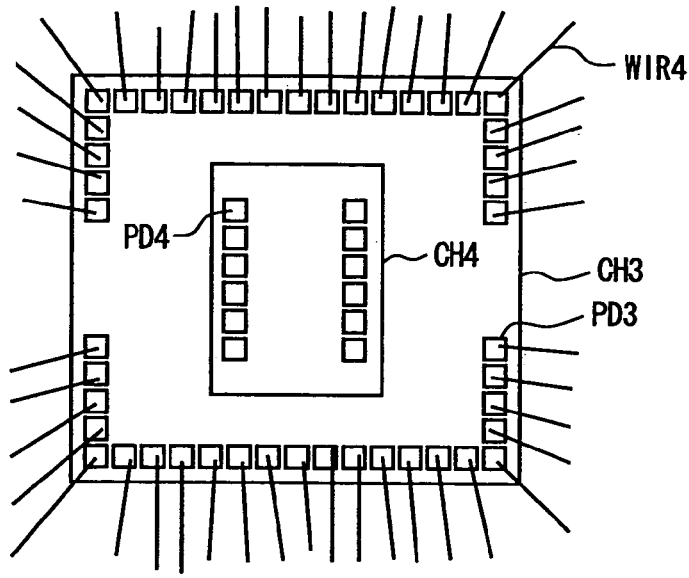
FIG. 59 schematically shows planar arrangement of the semiconductor chips in the system in package shown in FIG. 58.
Figure 60:
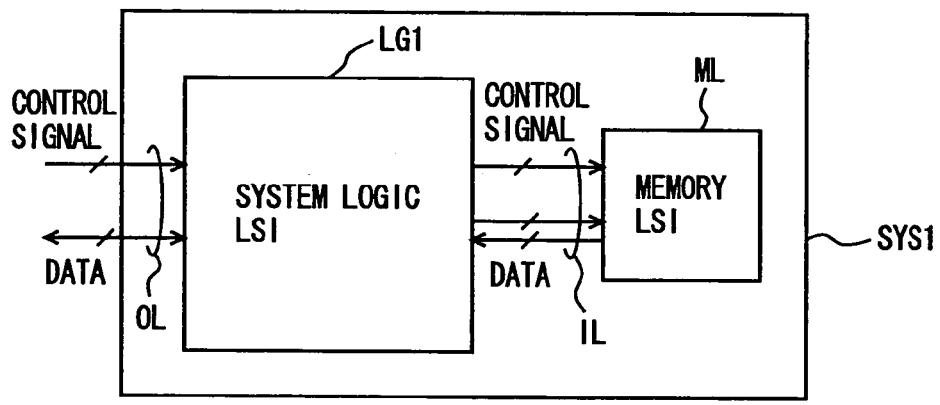
FIG. 60 schematically shows a functional configuration of the system in package shown in FIGS. 58 and 59.
Figure 61:
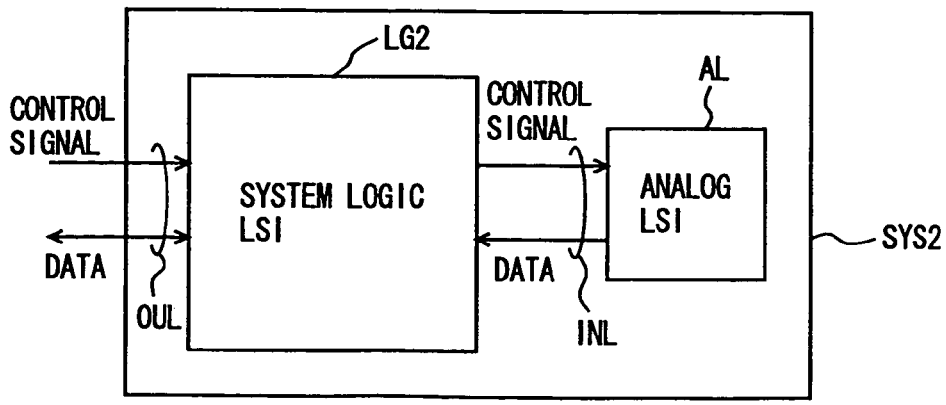
FIG. 61 schematically shows another functional configuration of the system in package shown in FIGS. 58 and 59.
Figure 62:
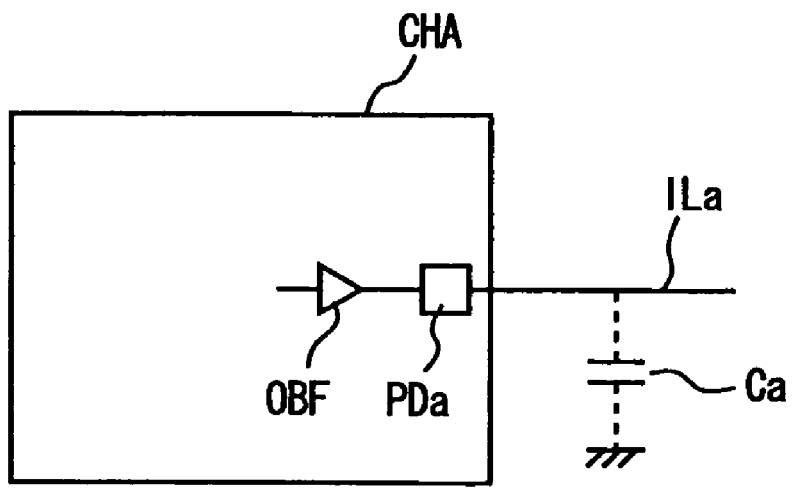
FIG. 62 schematically shows a configuration of a final-stage output buffer of a conventional system in package.
Figure 63:
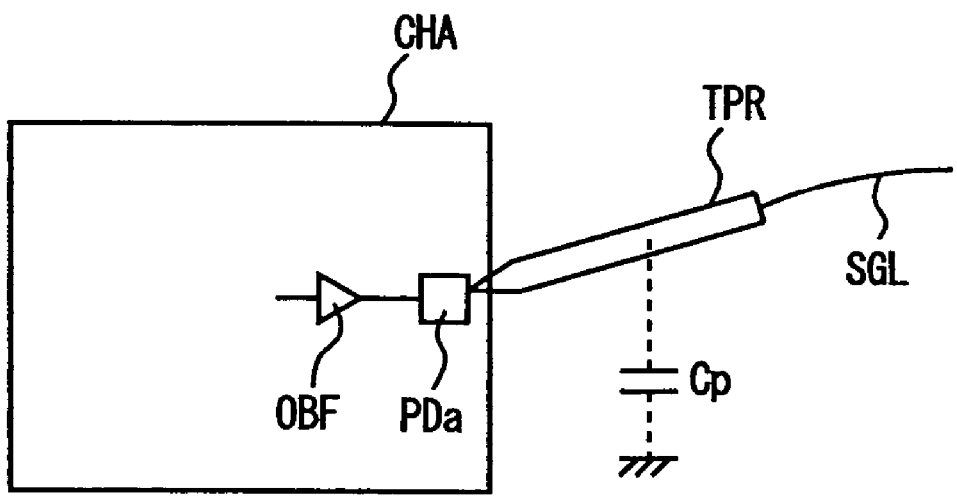
FIG. 63 schematically shows arrangement of the final-stage output buffer shown in FIG. 62 at the time of testing.

FIG. 55 shows a specific arrangement of an example of output buffer 300 shown in FIG. 54. Referring to FIG. 55, output buffer 300 includes an inverter 321 receiving the mode designating signal MOD, an NAND gate 322 receiving mode designating signal MOD and internal signal RD, an NOR gate 323 receiving an output signal of inverter 321 and internal signal RD. The internal signal RD is an internal read data signal, for example, if the semiconductor device including the output buffer 3 is a memory device.

Output buffer 300 further includes a P channel MOS transistor 327 for pulling up the output node 326 to a power supply voltage VDD level when made conductive, and an N channel MOS transistor 328 for pulling down output node 326 to the ground voltage level when made conductive. Output node 326 is coupled to a corresponding pad OPD.

Pull-up transistor 327 has a gate receiving an output signal of NAND gate, a source region coupled to receive the power supply voltage VDD, a drain region coupled to output node 326, and a back gate (well region) coupled to receive an N well bias voltage VNW.

Pull-down transistor 328 has a gate receiving an output signal of NOR gate, a source region coupled to receive the ground voltage, a drain region coupled to output node 326, and a back gate (well region) coupled to receive a P well bias voltage VPW.

N well bias voltage VNW is produced through a switch circuit 361 responsive to mode designating signal MOD, and P well bias voltage VPW is produced through a switch circuit 363 responsive to mode designating signal MOD.

Switch circuit 361 selects the power supply voltage VDD when mode designating signal MOD designates the assembly into package, and selects the forward voltage VFRN when the mode designating signal MOD designates a test mode of operation. Forward voltage VFRN is a positive voltage lower than the power supply voltage VDD, not biasing the PN junction between the back gate (N type substrate region) and the P type impurity regions of the source and drain region of pull-up transistor 327 into a conductive state.

Switch circuit 363 selects the ground voltage when mode designating signal MOD designates the normal operation mode or the assembly into package, and selects a forward voltage VFRP when the mode designating signal MOD designates the test mode of operation. Forward voltage VFRP is a positive voltage lower than the forward voltage drop of PN junction between the back gate (P type substrate region) and the impurity regions of source and drain regions of pull-down transistor 328.

In the test mode of operation, the pull-up transistor 327 and pull-down transistor 328 each have a back gate bias made shallower and a reduced threshold voltage in absolute value. Thus, the pull-up and pull-down transistors 327 and 328 operate with an increased driving power to drive the output node 326, even with a reduced size. The pull-up and pull-down transistors 327 and 328 can be made smaller in size and the parasitic capacitance of these transistors 327 and 328 can be made small.

After assembly into package, switch circuits 361 and 363 selects the power supply voltage VDD and the ground voltage, respectively. Pull-up transistor 327 and pull-down transistor 328 each have the source voltage and the back gate bias voltage made equal, and each have an increased threshold voltage in absolute value as compared to the case in the test mode of operation. The junction capacitance of these transistors 327 and 328 can be reduced by the deepened back gate bias, and the parasitic capacitance to the output node 326 is reduced. Thus, the output buffer 8 of the small size can be operated at high speed to drive the associated output pad OPD.

In the normal mode of operation or after the assembly into package, the pull-up and pull-down transistors 327 and 328 are kept non-conductive in accordance with mode designating signal MOD. Output buffer 300 does not exert any influence onto an operation of the output buffer 8.

The arrangement of FIGS. 54 and 55 is essentially equivalent to the merge of the arrangements as shown in FIG. 2 and FIG. 40, and therefore, the technical advantages of the embodiments shown in FIGS. 2 and 40 can be provided, excluding the arrangement of a single output buffer 200.

Due to the use of the forward bias voltages VFRN and VFRP, the pull-up and pull-down transistors 327 and 328 can be made small in size to reduce the layout area of output buffer 300, resulting in reduced chip size. In addition, due to the reduced size of these transistors 327 and 328, the parasitic capacitance can be reduced to allow the output buffer 8 to operate at high speed operation with an optimized driving power.

Moreover, the pull-up and pull-down transistors 327 and 328, each having the back gate forward-biased in the test mode, can drive any output load due to test probe at high speed even with the reduced size.

Further, the power supply voltage VDD and the ground voltage are applied to the back gates of the pull-up transistor 327 and pull-down transistor 328, respectively in the normal mode or after assembly into package. Therefore, there is no need to produce the high voltage Vpp and the negative voltage Vbb for biasing the back gates of pull-up and pull-down transistors, to reduce the power dissipation in the normal mode.

The forward voltages VFRN and VFRP are generated as in the arrangement shown in FIG. 40, and may be generated internally or may be applied externally from a tester.

In the arrangement of FIG. 55, the high voltage Vpp and the negative voltage Vbb may be employed as the back gate bias voltages in the normal mode or after packaging. With the use of the high voltage and the negative voltage, the parasitic capacitance at the output node can be further reduced due to reduced junction capacitance.

In the arrangement of FIG. 55, the switch circuits 361 and 363 may be provided commonly to the output buffer circuits OKT0 to OKTn, or may be provided to the respective output buffer circuits OKT0 to OKTn, or may be provided for each predetermined number of output buffer circuits in the output circuit 3.

In the arrangement as shown in the above, one of the switch circuits 361 and 363 may be provided and one of the pull-up and pull-down transistors may be configured to receive the forward voltage at a back gate thereof, taking into account of the practical driving power and occupying area of the pull-up and pull-down transistors, as in the arrangement shown in FIG. 39.

According to the arrangement as shown in FIGS. 54 and 55, the output buffer circuit is configured to include a normal mode output buffer of a small size operating in the normal mode and a test mode output buffer of a relatively small, but greater in size than the normal mode output buffer. Thus, the output buffer circuit can drive the output pad at an optimal driving power both in the normal mode and in the test mode without increasing the chip layout area and power consumption.

The semiconductor device may be either a logic circuit or a memory, as long as it is assembled in a system in package.

The configuration of the output buffer circuit is decided in accordance with the configuration of each semiconductor device. For example, in the case of a memory, the internal read signal is generated according to internal data, in accordance with an output permitting signal. Therefore, what is required is that an output buffer at the final stage connected to the pad is selectively enabled in accordance with the mode designating signal. A circuit at the preceding stage may operate both in a normal operation mode and in a test operation mode.

As described above, according to an aspect of the present invention, an output buffer for use in a normal operation mode and an output buffer for use in a test operation mode are arranged in a set for each pad. The output buffers can be optimally designed to be adapted to an operating characteristic of the semiconductor chip in the normal operation mode. The semiconductor device can be tested reliably, without degrading power consumption and the operating characteristic in the normal operation mode.

Further, according to another aspect of the present invention, a back gate bias of an output transistor of an output buffer is changed in accordance with an operation mode. In particular, in a test operation mode, the back gate bias is applied in a forward direction. Thus, the current driving capability of the output buffer can be optimized in accordance with the operation mode, and the area occupied by the output circuit is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
 a first output buffer coupled to an output pad, enabled in a normal operation mode and set to an output high impedance state in a test operation mode, for driving said output pad with first driving capability in accordance with an internal signal when enabled;
 a second output buffer coupled to said output pad, enabled in said test operation mode and set to an output high impedance state in said normal operation mode, for driving said output pad with a second driving capability greater than said first driving capability in accordance with said internal signal when enabled, said second output buffer including first and second insulated gate type field effect transistors coupled to said output pad, and complementarily rendered conductive to drive said output pad in accordance with said internal signal when the second buffer is enabled; and a back gate voltage generating circuit selectively activated in accordance with an operation mode designating signal, for generating a bias voltage to be applied to a back gate of at least one of said first and second insulated gate type field effect transistors when activated, said back gate voltage generating circuit including a clock generating circuit for generating a pumping clock signal when activated, a pumping circuit generating said bias voltage through a charge pumping operation of a capacitor in accordance with said pumping clock signal, and a detecting circuit for detecting a level of an output voltage of said pumping circuit and selectively activating a pumping clock generating operation of said clock generating circuit in accordance with a result of detection.

2. The semiconductor device according to claim 1, wherein said detecting circuit is inactivated when said operation mode designating signal designates said test operation mode and stops the detecting operation.

3. The semiconductor device according to claim 1, wherein said clock generating circuit further responds to said operation mode designating signal and is inactivated, when said operation mode designating signal designates said test operation mode regardless of the result of detection of said detecting circuit, to stop generation of said pumping clock signal.

4. The semiconductor device according to claim 1, wherein said detecting circuit includes a tuning circuit for adjusting a target detection level of said bias voltage.

5. The semiconductor device according to claim 1, wherein said first transistor, when conductive, drives said output pad to a high potential level, and said second transistor, when conductive, drives said output pad to a low potential level, and said back gate voltage generating circuit generates a voltage applied to the back gate of the second field effect transistor as said bias voltage, and said semiconductor device further comprises a select circuit for selectively applying an output power supply voltage to the back gate of said first insulated gate type field effect transistor in accordance with said operation mode designating signal, said output power supply voltage being applied as an operating power supply voltage of at least the first and second output buffers.

* * * * *